(12) United States Patent
Arayashiki et al.

(10) Patent No.: US 12,160,209 B2
(45) Date of Patent: Dec. 3, 2024

(54) POWER AMPLIFIER CIRCUIT

(71) Applicant: Murata Manufacturing Co., Ltd., Kyoto (JP)

(72) Inventors: Satoshi Arayashiki, Kyoto (JP); Satoshi Tanaka, Kyoto (JP); Fumio Harima, Kyoto (JP); Satoshi Goto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 682 days.

(21) Appl. No.: 17/241,581

(22) Filed: Apr. 27, 2021

(65) Prior Publication Data

US 2021/0336592 A1    Oct. 28, 2021

(30) Foreign Application Priority Data

Apr. 28, 2020  (JP) ................................ 2020-079240
Oct. 28, 2020  (JP) ................................ 2020-180111

(51) Int. Cl.
| H03F 3/02 | (2006.01) |
| H03F 1/56 | (2006.01) |
| H03F 3/195 | (2006.01) |
| H03F 3/24 | (2006.01) |
| H03F 3/72 | (2006.01) |
| H04B 1/04 | (2006.01) |

(52) U.S. Cl.
CPC ............ *H03F 3/245* (2013.01); *H03F 1/565* (2013.01); *H03F 3/195* (2013.01); *H03F 3/72* (2013.01); *H04B 1/0458* (2013.01); *H03F 2200/171* (2013.01); *H03F 2200/318* (2013.01); *H03F 2200/451* (2013.01)

(58) Field of Classification Search
CPC .......... H03F 3/245; H03F 1/565; H03F 3/195; H03F 3/72; H03F 2200/171; H03F 2200/318; H03F 2200/451; H04B 1/0458
USPC ......................................................... 330/51
See application file for complete search history.

(56) References Cited

U.S. PATENT DOCUMENTS

| 8,461,931 | B1 | 6/2013 | Bayruns et al. |
| 8,710,927 | B2 | 4/2014 | Kamitani et al. |
| 10,630,320 | B2 | 4/2020 | King |

(Continued)

FOREIGN PATENT DOCUMENTS

| CN | 210405231 U | 4/2020 |
| KR | 10-2012-0046279 A | 5/2012 |

(Continued)

*Primary Examiner* — Andrea Lindgren Baltzell
*Assistant Examiner* — Jose E Pinero
(74) *Attorney, Agent, or Firm* — Pearne & Gordon LLP

(57) ABSTRACT

A power amplifier circuit includes a first amplifier circuit configured to amplify a first signal of a first frequency band and output a first amplified signal having a first power, a second amplifier circuit configured to amplify a second signal of the first frequency band or a second frequency band different from the first frequency band and output a second amplified signal having a second power different from the first power, and a first variable adjustment circuit disposed between the second amplifier circuit and a first circuit subsequent to the second amplifier circuit, the first variable adjustment circuit being configured to be capable of adjusting a first impedance of the first circuit seen from the second amplifier circuit.

20 Claims, 23 Drawing Sheets

(56) References Cited

U.S. PATENT DOCUMENTS

| | | | |
|---|---|---|---|
| 2008/0024217 A1* | 1/2008 | Chiu | H03F 3/45708 |
| | | | 330/253 |
| 2011/0018632 A1* | 1/2011 | Pletcher | H03F 3/245 |
| | | | 330/192 |
| 2013/0285749 A1 | 10/2013 | Kamitani et al. | |
| 2017/0163229 A1* | 6/2017 | Oyama | H03G 1/0094 |
| 2019/0273519 A1 | 9/2019 | Shinozaki et al. | |
| 2020/0144965 A1 | 5/2020 | Namie et al. | |
| 2021/0099190 A1 | 4/2021 | Uejima | |
| 2023/0016198 A1* | 1/2023 | Yoshimi | H03F 3/19 |
| 2023/0053456 A1* | 2/2023 | Hase | H03H 7/075 |

FOREIGN PATENT DOCUMENTS

| | | |
|---|---|---|
| KR | 10-1224087 B1 | 1/2013 |
| KR | 10-2019-0104874 A | 9/2019 |
| WO | 2012098863 A1 | 7/2012 |
| WO | 2019/244815 A1 | 12/2019 |

* cited by examiner

| Band | BAND Numbers | Up Link fmin(MHz) | Up Link fmax(MHz) | Fractional Bandwidth (%) | |
|---|---|---|---|---|---|
| Mid Band | 1 | 1920 | 1980 | 3.08 | FDD |
| | 2 | 1850 | 1910 | 3.19 | |
| | 3 | 1710 | 1785 | 4.29 | |
| | 4 | 1710 | 1755 | 2.60 | |
| | 9 | 1749.9 | 1784.9 | 1.98 | |
| | 10 | 1710 | 1770 | 3.45 | |
| | 23 | 2000 | 2020 | 1.00 | |
| | 25 | 1850 | 1915 | 3.45 | |
| | 65 | 1920 | 2010 | 4.58 | |
| | 66 | 1710 | 1780 | 4.01 | |
| | 70 | 1695 | 1710 | 0.88 | |
| | 33 | 1900 | 1920 | 1.05 | TDD |
| | 34 | 2010 | 2025 | 0.74 | |
| | 35 | 1850 | 1910 | 3.19 | |
| | 36 | 1930 | 1990 | 3.06 | |
| | 37 | 1910 | 1930 | 1.04 | |
| | 39 | 1880 | 1920 | 2.11 | |
| | Total | 1695 | 2025 | 17.74 | |
| High Band | 40 | 2300 | 2400 | 4.26 | TDD |
| | 41 | 2496 | 2690 | 7.48 | |
| | Total | 2300 | 2690 | 15.63 | |

FIG. 2

| Band | BAND Numbers | Up Link fmin(MHz) | Up Link fmax(MHz) | Fractional Bandwidth (%) | |
|---|---|---|---|---|---|
| Mid Band | 1 | 1920 | 1980 | 3.08 | FDD |
| | 2 | 1850 | 1910 | 3.19 | FDD |
| | 3 | 1710 | 1785 | 4.29 | FDD |
| | 4 | 1710 | 1755 | 2.60 | FDD |
| | 9 | 1749.9 | 1784.9 | 1.98 | FDD |
| | 10 | 1710 | 1770 | 3.45 | FDD |
| | 23 | 2000 | 2020 | 1.00 | FDD |
| | 25 | 1850 | 1915 | 3.45 | FDD |
| | 65 | 1920 | 2010 | 4.58 | FDD |
| | 66 | 1710 | 1780 | 4.01 | FDD |
| | 70 | 1695 | 1710 | 0.88 | FDD |
| | 33 | 1900 | 1920 | 1.05 | TDD |
| | 34 | 2010 | 2025 | 0.74 | TDD |
| | 35 | 1850 | 1910 | 3.19 | TDD |
| | 36 | 1930 | 1990 | 3.06 | TDD |
| | 37 | 1910 | 1930 | 1.04 | TDD |
| | 39 | 1880 | 1920 | 2.11 | TDD |
| | Total | 1695 | 2025 | 17.74 | |
| High Band | 7 | 2500 | 2570 | 2.76 | FDD |
| | 40 | 2300 | 2400 | 4.26 | TDD |
| | 41 | 2496 | 2690 | 7.48 | TDD |
| | Total | 2300 | 2690 | 15.63 | |

FIG. 19

POWER AMPLIFIER CIRCUIT

CROSS REFERENCE TO RELATED APPLICATION

This application claims priority from Japanese Patent Application No. 2020-180111 filed on Oct. 28, 2020 and Japanese Patent Application No. 2020-079240 filed Apr. 28, 2020. The contents of these applications are incorporated herein by reference in its entirety.

BACKGROUND OF THE DISCLOSURE

1. Field of the Disclosure

The present disclosure relates to a power amplifier circuit.

2. Description of the Related Art

A mobile communication device such as a mobile phone includes a radio-frequency (RF) power amplifier to amplify the power of an RF signal to be transmitted to a base station. Some of such RF power amplifiers include a high-output path serving as a circuit for outputting a high-output signal, and a medium-output path serving as a circuit for outputting a medium-output signal (for example, International Publication No. 2012/098863). Other examples of the related art are disclosed in U.S. Pat. Nos. 8,461,931 and 10,630,320.

International Publication No. 2012/098863 discloses an RF power amplifier configured to amplify signals of two different frequency bands. The RF power amplifier includes a medium-output path and two high-output paths each corresponding one of the two frequency bands. Each of the two high-output paths includes an input-terminal-side switching element, an input matching circuit, a high-output amplifier, an output matching circuit, and an output-terminal-side switching element. The configuration including three output paths, namely, the medium-output path and the two high-output paths, leads to an increase in circuit size, which is not desirable.

BRIEF SUMMARY OF THE DISCLOSURE

Accordingly, it is an object of the present disclosure to provide a power amplifier circuit with a reduced circuit size and capable of efficiently supplying RF signals over a wide frequency band.

According to preferred embodiments of the present disclosure, a power amplifier circuit includes a first amplifier circuit configured to amplify a first signal of a first frequency band and output a first amplified signal having a first power, a second amplifier circuit configured to amplify a second signal of the first frequency band or a second frequency band different from the first frequency band and output a second amplified signal having a second power different from the first power, and a first variable adjustment circuit disposed between the second amplifier circuit and a first circuit subsequent to the second amplifier circuit, the first variable adjustment circuit being configured to be capable of adjusting a first impedance of the first circuit seen from the second amplifier circuit.

According to preferred embodiments of the present disclosure, it is possible to provide a power amplifier circuit with a reduced circuit size and capable of efficiently supplying RF signals over a wide frequency band. Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 2 is a diagram illustrating an example band configuration of RF signals to be transmitted from the transmitting apparatus according to the first embodiment of the present disclosure;

FIG. 19 is a diagram illustrating an example band configuration of RF signals to be transmitted from a transmitting apparatus according to a second embodiment of the present disclosure;

DETAILED DESCRIPTION OF THE DISCLOSURE

Figure 1:
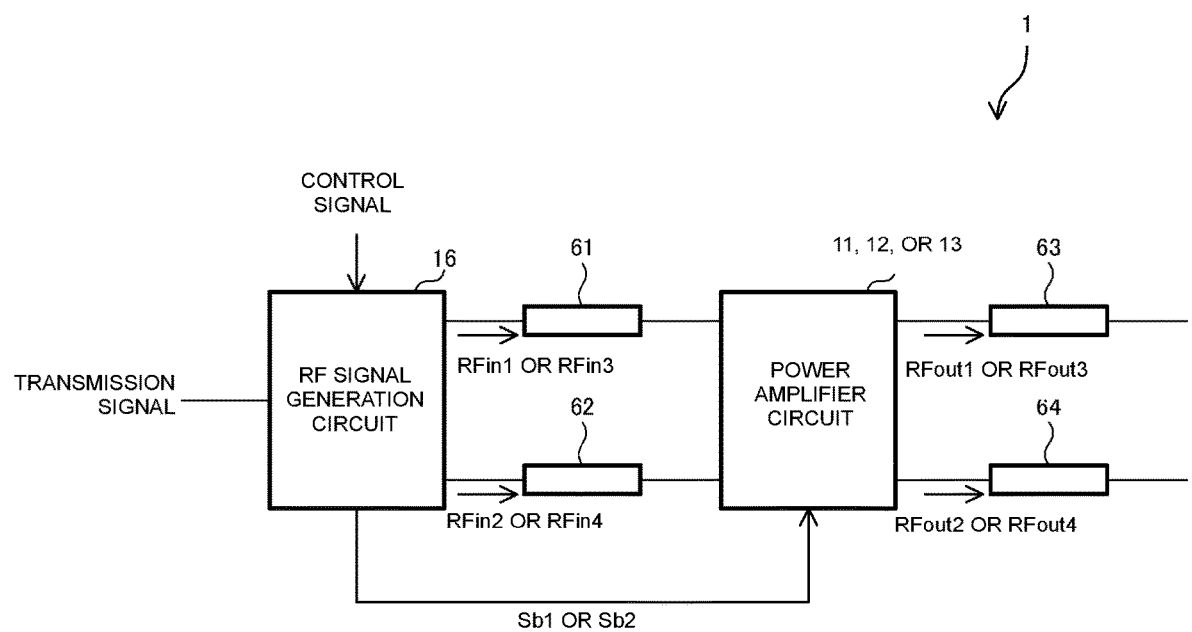
FIG. 1 is a diagram illustrating a configuration of a transmitting apparatus according to a first embodiment of the present disclosure.

The following describes embodiments of the present disclosure in detail with reference to the drawings. Substantially the same elements are denoted by the same reference numerals to minimize redundant description.

First Embodiment

A transmitting apparatus according to a first embodiment will be described. FIG. 1 illustrates a configuration of a transmitting apparatus 1 according to the first embodiment of the present disclosure. As illustrated in FIG. 1, the transmitting apparatus 1 includes a power amplifier circuit 11, an RF signal generation circuit 16, and transmission lines 61, 62, 63, and 64. The transmission lines 61, 62, 63, and 64 are, for example, coaxial cables, microstrip lines, or triplate lines and have characteristic impedances.

The transmitting apparatus 1 is included in, for example, a mobile communication device to transmit various signals such as audio, video, and data signals to a base station. The mobile communication device also includes a receiving apparatus for receiving signals from the base station. The details of the receiving apparatus are omitted.

Figure 3:
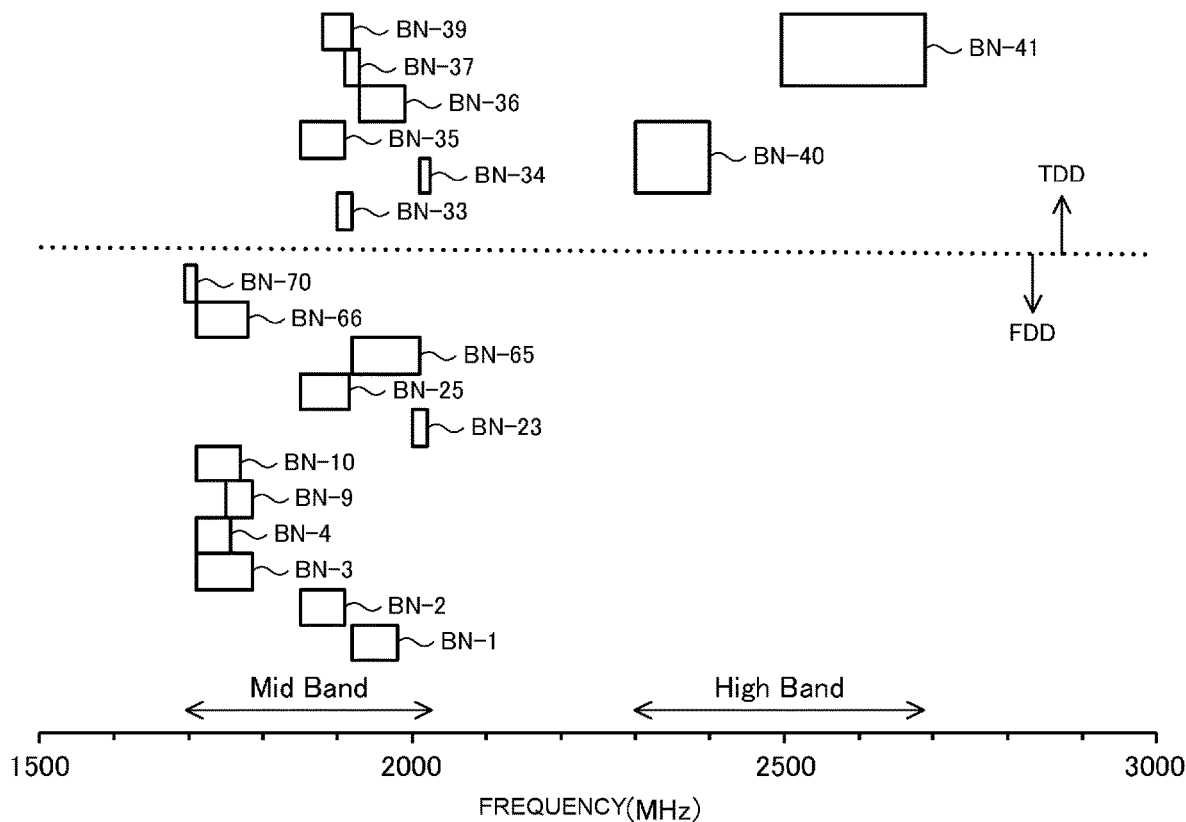
FIG. 3 is a diagram schematically illustrating the band configuration illustrated in FIG. 2.

FIG. 2 illustrates an example band configuration of RF signals to be transmitted from the transmitting apparatus 1 according to the first embodiment of the present disclosure. FIG. 3 schematically illustrates the band configuration illustrated in FIG. 2. In FIG. 3, the horizontal axis represents frequency expressed in "MHz". In FIG. 3, rectangular frames marked "BN-X" represent the frequency ranges of bands assigned band numbers X, where X denotes integers such as 1, 2, 3, and 4.

As illustrated in FIGS. 1 to 3, the RF signal generation circuit 16 in the transmitting apparatus 1 generates a first signal belonging to a first frequency band and a second signal belonging to the first frequency band or a second frequency band. The second frequency band is different from the first frequency band. In other words, the second frequency band does not overlap with the first frequency band. Note that a portion of the first frequency band and a portion of the second frequency band may overlap.

In this embodiment, the RF signal generation circuit 16 generates an input signal RFin1 (first signal) belonging to the mid band (first frequency band) ranging from 1695 MHz to 2025 MHz and used for frequency division duplex (FDD) communication, and an input signal RFin2 (second signal) belonging to the mid band or the high band (second frequency band) ranging from 2300 MHz to 2690 MHz and used for time division duplex (TDD) communication.

The mid band includes, for example, a band with band number 1 ranging from 1920 MHz to 1980 MHz, a band with band number 2 ranging from 1850 MHZ to 1910 MHZ, a band with band number 37 ranging from 1910 MHz to 1930 MHz, a band with band number 39 ranging from 1880 MHz to 1920 MHZ, and so on.

Among the bands included in the mid band, the bands with band numbers 33, 34, 35, 36, 37, and 39 are used for TDD communication (see FIGS. 2 and 3). Among the bands included in the mid band, the bands other than the bands described above, such as the bands with band numbers 1, 2, 66, and 70, are used for FDD communication (see FIGS. 2 and 3).

The transmission power in TDD communication is typically larger than the transmission power in FDD communication. In this embodiment, in TDD communication, for example, an RF signal is transmitted with a transmission power defined in power class (PC) 2. In FDD communication, for example, an RF signal is transmitted with a transmission power defined in PC 3. The transmission power defined in PC 2 and the transmission power defined in PC 3 are, for example, an antenna output of 26 dBm and an antenna output of 23 dBm, respectively.

The high band includes, for example, a band with band number 40 ranging from 2300 MHz to 2400 MHZ, and a band with band number 41 ranging from 2496 MHz to 2690 MHz. The bands with band numbers 40 and 41 included in the high band are used for TDD communication (see FIGS. 2 and 3).

In a control unit (not illustrated) of the mobile communication device, a band number to be used by the mobile communication device is set in accordance with, for example, the country in which the mobile communication device is used, the communication carrier with which the mobile communication device communicates, and the like. The control unit generates a control signal including a designation of a band number in accordance with the setting and outputs the generated control signal to the RF signal generation circuit 16.

The RF signal generation circuit 16 modulates a transmission signal including audio, video, data, and so on in accordance with the control signal received from the control unit of the mobile communication device and generates the input signals RFin1 and RFin2 for performing wireless transmission.

Further, the RF signal generation circuit 16 outputs band information to the power amplifier circuit 11. The band information indicates an item relating to the frequency of the generated input signal RFin2.

In this embodiment, the RF signal generation circuit 16 outputs, for example, a band signal Sb1 to the power amplifier circuit 11 as band information. For example, the band signal Sb1 is set to a high level when the input signal RFin2 belongs to the high band, and is set to a low level when the input signal RFin2 belongs to the mid band.

Accordingly, the power amplifier circuit 11 is capable of switching between the circuit configuration for the high band and the circuit configuration for the mid band depending on to which of the high band and the mid band the input signal RFin2 belongs.

The RF signal generation circuit 16 may not necessarily be configured to output the band signal Sb1 indicating two values, namely, the high level and the low level, to the power amplifier circuit 11. The RF signal generation circuit 16 may be configured to output the band signal Sb1 indicating three or more values to the power amplifier circuit 11. This configuration allows the power amplifier circuit 11 to switch the circuit configuration among three or more stages.

Alternatively, the RF signal generation circuit 16 may output frequency information indicating the frequency of the input signal RFin2 to the power amplifier circuit 11 as band information. This configuration allows the power amplifier circuit 11 to continuously change the circuit configurations in accordance with the frequency of the input signal RFin2.

The RF signal generation circuit 16 supplies the generated input signals RFin1 and RFin2 to the transmission lines 61 and 62, respectively.

The power amplifier circuit 11 receives the input signals RFin1 and RFin2 outputted from the RF signal generation circuit 16 through the transmission lines 61 and 62, respectively, and amplifies the input signals RFin1 and RFin2 to levels required to transmit the respective input signals to the base station.

The power amplifier circuit 11 supplies an output signal RFout1, which is obtained by amplifying the input signal RFin1, to the transmission line 63. The power amplifier circuit 11 supplies an output signal RFout2, which is obtained by amplifying the input signal RFin2, to the transmission line 64. The output signals RFout1 and RFout2 are sent to a front-end section and an antenna (not illustrated) through, for example, the transmission lines 63 and 64, respectively, and are transmitted to the base station through the antenna. The front-end section will be described in detail below.

Figure 4:
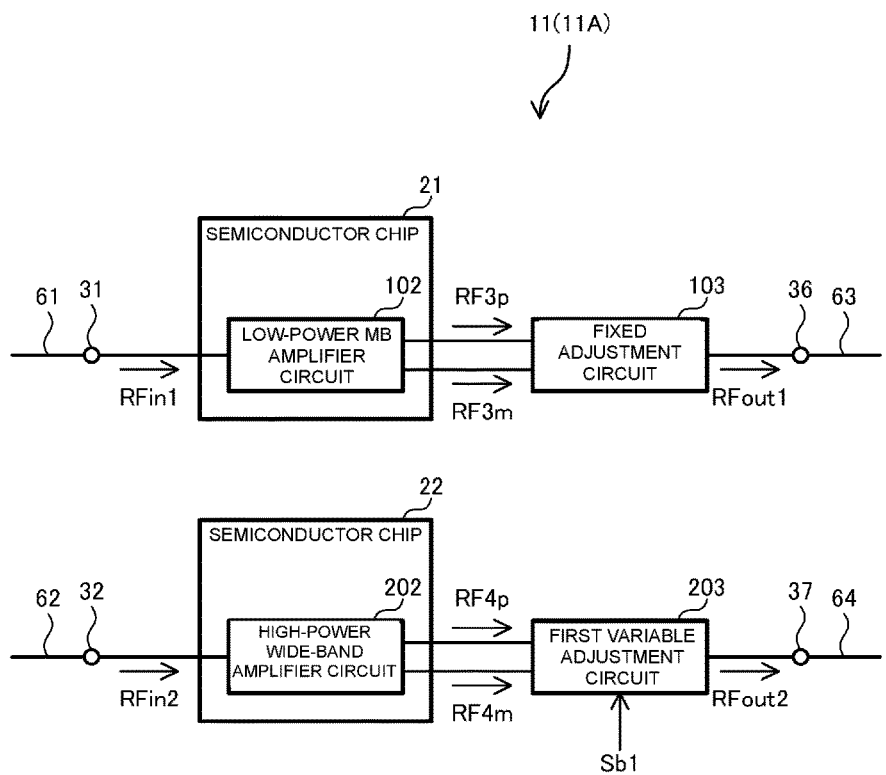
FIG. 4 is a diagram illustrating a configuration of a basic example of the power amplifier circuit according to the first embodiment of the present disclosure.

A basic example of the power amplifier circuit 11 according to the first embodiment will be described. FIG. 4 illustrates a configuration of the basic example of the power amplifier circuit 11 according to the first embodiment of the present disclosure. As illustrated in FIG. 4, the basic example of the power amplifier circuit 11 according to the first embodiment (hereinafter referred to sometimes as the power amplifier circuit 11A) includes a low-power mid-band (MB) amplifier circuit 102 (first amplifier circuit), a fixed adjustment circuit 103, a high-power wide-band amplifier circuit 202 (second amplifier circuit), and a first variable adjustment circuit 203.

An RF signal input terminal 31 is supplied with the input signal RFin1 through the transmission line 61. An RF signal input terminal 32 is supplied with the input signal RFin2 through the transmission line 62. RF signal output terminals 36 and 37 are connected to the transmission lines 63 and 64, respectively. The low-power MB amplifier circuit 102 and the high-power wide-band amplifier circuit 202 are formed in or on semiconductor chips 21 and 22, respectively.

The low-power MB amplifier circuit 102 amplifies the input signal RFin1 supplied through the RF signal input terminal 31 and generates the amplified signals RF3$p$ and RF3$m$ (first amplified signal) having a first power. In this embodiment, the low-power MB amplifier circuit 102 is a circuit configured to amplify the input signal RFin1 to a level that allows the input signal RFin1 to be transmitted with the transmission power defined in PC 3, and is designed to amplify a signal belonging to the mid band. The low-power MB amplifier circuit 102 outputs the generated amplified signals RF3$p$ and RF3$m$ to the fixed adjustment circuit 103.

The fixed adjustment circuit 103 adjusts an impedance of the transmission line 63 seen from the low-power MB amplifier circuit 102. In other words, the fixed adjustment circuit 103 matches impedance between the low-power MB amplifier circuit 102 and the transmission line 63. In some embodiments of the present disclosure, an adjustment circuit has a function of an impedance matching circuit and a function of attenuating harmonic components that are integer multiples (for example, 2 or more) of the frequency of a signal to be amplified by an amplifier circuit.

The high-power wide-band amplifier circuit 202 amplifies the input signal RFin2 supplied through the RF signal input terminal 32 and generates an amplified signals RF4$p$ and RF4$m$ (second amplified signal) having a second power larger than the first power. In this embodiment, the high-power wide-band amplifier circuit 202 is a circuit configured to amplify the input signal RFin2 to a level that allows the input signal RFin2 to be transmitted with the transmission power defined in PC 2, and is designed to amplify a signal belonging to the mid band or the high band. The high-power wide-band amplifier circuit 202 outputs the generated amplified signals RF4$p$ and RF4$m$ to the first variable adjustment circuit 203.

The first variable adjustment circuit 203 is disposed between the high-power wide-band amplifier circuit 202 and the subsequent circuit (first circuit) of the high-power wide-band amplifier circuit 202. In this embodiment, the subsequent circuit of the high-power wide-band amplifier circuit 202 is, for example, the transmission line 64. The first variable adjustment circuit 203 is configured to be capable of adjusting a first impedance of the transmission line 64 seen from the high-power wide-band amplifier circuit 202. In other words, the first variable adjustment circuit 203 matches impedance between the high-power wide-band amplifier circuit 202 and the transmission line 64.

Figure 5:
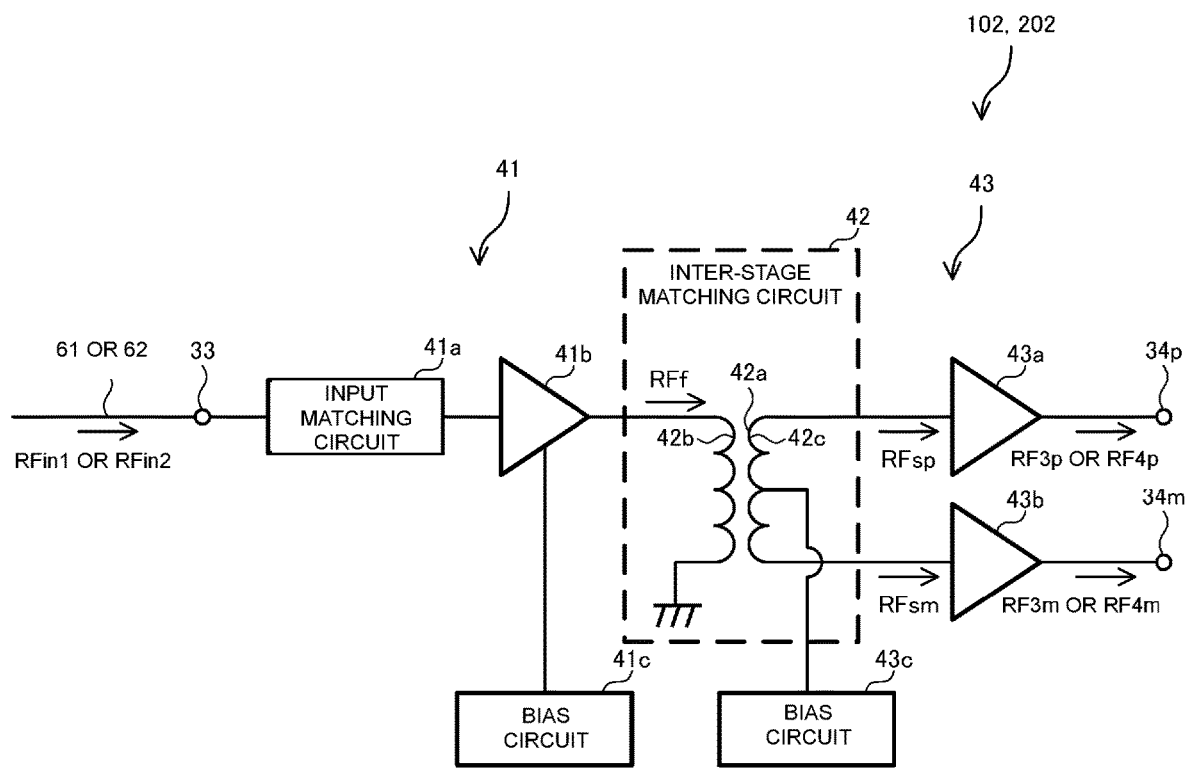
FIG. 5 is a circuit diagram illustrating an example of a high-power wide-band amplifier circuit and a low-power mid-band (MB) amplifier circuit according to the first embodiment of the present disclosure.

The high-power wide-band amplifier circuit 202 and the low-power MB amplifier circuit 102 in the power amplifier circuit 11A illustrated in FIG. 4 will be described in detail. FIG. 5 is a circuit diagram illustrating an example of the high-power wide-band amplifier circuit 202 and the low-power MB amplifier circuit 102 according to the first embodiment of the present disclosure. The high-power wide-band amplifier circuit 202 and the low-power MB amplifier circuit 102 have similar circuit configurations, and the high-power wide-band amplifier circuit 202 will be described as a representative so that the description of the low-power MB amplifier circuit 102 is omitted as much as possible.

As illustrated in FIG. 5, the high-power wide-band amplifier circuit 202 includes a driver-stage single amplifier circuit 41, an inter-stage matching circuit 42, and a power-stage differential amplifier circuit 43. The driver-stage single amplifier circuit 41 includes an input matching circuit 41$a$, an amplifier 41$b$, and a bias circuit 41$c$. The power-stage differential amplifier circuit 43 includes amplifiers 43$a$ and 43$b$ and a bias circuit 43$c$.

The amplifiers 41b, 43a, and 43b are each formed by, for example, a bipolar transistor such as a heterojunction bipolar transistor (HBT). Each of the amplifiers 41b, 43a, and 43b may be formed by a field effect transistor (FET). In this case, the base may be read as gate, the collector may be read as drain, and the emitter may be read as source.

The bias circuit 41c supplies a bias to the amplifier 41b. The bias circuit 43c supplies a bias to the amplifiers 43a and 43b. Although not illustrated in FIG. 5, the amplifier 41b is supplied with a power supply voltage.

A circuit input terminal 33 is connected to the transmission line 62 and is supplied with the input signal RFin2 through the transmission line 62. The input matching circuit 41a has a first end connected to the circuit input terminal 33 and a second end, and matches impedance between the transmission line 62 and the amplifier 41b.

The amplifier 41b has an input terminal connected to the second end of the input matching circuit 41a, and an output terminal. The amplifier 41b amplifies the input signal RFin2 inputted from the input terminal and outputs an amplified signal RFf from the output terminal.

The inter-stage matching circuit 42 matches impedance between the amplifier 41b and the amplifiers 43a and 43b, and functions as a power splitter that receives the amplified signal RFf from the amplifier 41b and splits the amplified signal RFf into amplified signals RFsp and RFsm having different phases.

The inter-stage matching circuit 42 includes a transformer 42a. The transformer 42a has a primary winding 42b and a secondary winding 42c.

The primary winding 42b has a first end connected to the output terminal of the amplifier 41b, and a second end connected to ground. The secondary winding 42c has a first end connected to the amplifier 43a, a neutral point configured to receive a bias supplied from the bias circuit 43c, and a second end connected to the amplifier 43b, and is electromagnetically coupled to the primary winding 42b.

In response to the amplified signal RFf being inputted to the first end of the primary winding 42b from the amplifier 41b, the amplified signals RFsp and RFsm are respectively generated at the first and second ends of the secondary winding 42c, which is electromagnetically coupled to the primary winding 42b. The amplified signals RFsp and RFsm have a phase difference of approximately 180°. The phase difference may deviate from 180° due to unbalanced wiring lengths of circuits or the like.

The amplifier 43a has an input terminal connected to the first end of the secondary winding 42c, and an output terminal connected to a circuit output terminal 34p. The amplifier 43a amplifies the amplified signal RFsp inputted from the input terminal and outputs the amplified signal RF4p to the circuit output terminal 34p from the output terminal.

The amplifier 43b has an input terminal connected to the second end of the secondary winding 42c, and an output terminal connected to a circuit output terminal 34m. The amplifier 43b amplifies the amplified signal RFsm inputted from the input terminal and outputs the amplified signal RF4m to the circuit output terminal 34m from the output terminal.

In the case of the low-power MB amplifier circuit 102, the circuit input terminal 33 is supplied with the input signal RFin1 through the transmission line 61. The input matching circuit 41a matches impedance between the transmission line 61 and the amplifier 41b.

The amplifier 41b amplifies the input signal RFin1 inputted from the input terminal and outputs the amplified signal RFf from the output terminal.

The amplifier 43a amplifies the amplified signal RFsp inputted from the input terminal and outputs the amplified signal RF3p to the circuit output terminal 34p from the output terminal. The amplifier 43b amplifies the amplified signal RFsm inputted from the input terminal and outputs the amplified signal RF3m to the circuit output terminal 34m from the output terminal.

In the foregoing description, the high-power wide-band amplifier circuit 202 and the low-power MB amplifier circuit 102 according to this embodiment are configured to amplify an input signal using two stages of amplifier circuits including a driver-stage amplifier circuit and a power-stage amplifier circuit, although this is not required. The high-power wide-band amplifier circuit 202 and the low-power MB amplifier circuit 102 may be configured to amplify an input signal using a single-stage amplifier circuit, or may be configured to amplify an input signal using three or more stages of amplifier circuits.

In the foregoing description, in the high-power wide-band amplifier circuit 202 and the low-power MB amplifier circuit 102 according to this embodiment, the driver-stage single amplifier circuit 41 is configured to amplify a single-end signal, although this is not required. A differential amplifier circuit may be disposed in place of the driver-stage single amplifier circuit 41 to provide a configuration in which the driver stage also amplifies balanced signals. In this case, for example, the input matching circuit 41a is provided with a transformer. Accordingly, the input matching circuit 41a converts the input signal RFin1 or RFin2 into balanced signals. Two amplifiers 41b are disposed in parallel to amplify two signals constituting the balanced signals. The two amplified signals are converted into a single-end signal using, for example, a combiner, and the single-end signal is supplied to the inter-stage matching circuit 42. The configuration of converting the two amplified signals into a single-end signal using a combiner and then converting the single-end signal into balanced signals again using the transformer 42a in the inter-stage matching circuit 42 is a non-limiting example. The two signals may be supplied to the amplifiers 43a and 43b as balanced signals through a matching circuit.

Figure 6:
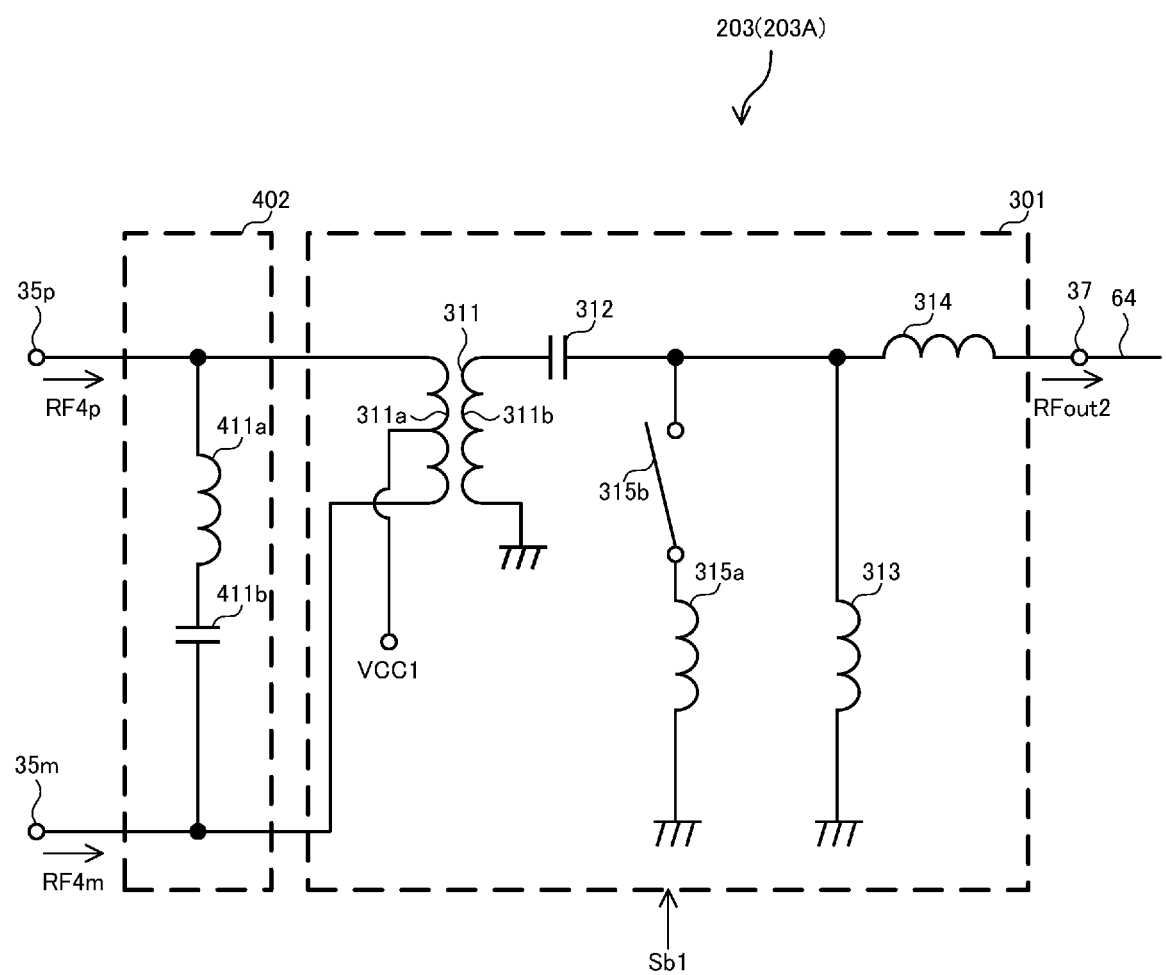
FIG. 6 is a circuit diagram illustrating a basic example of a first variable adjustment circuit according to the first embodiment of the present disclosure.

The first variable adjustment circuit 203 in the power amplifier circuit 11A illustrated in FIG. 4 will be described in detail. FIG. 6 is a circuit diagram illustrating a basic example of the first variable adjustment circuit 203 according to the first embodiment of the present disclosure.

As illustrated in FIG. 6, the basic example of the first variable adjustment circuit 203 (hereinafter referred to sometimes as the first variable adjustment circuit 203A) includes a wide-band matching circuit 301 (variable fundamental adjustment circuit) and a termination circuit 402. A circuit input terminal 35p is connected to the circuit output terminal 34p in the high-power wide-band amplifier circuit 202 and is supplied with the amplified signal RF4p (see FIG. 5). A circuit input terminal 35m is connected to the circuit output terminal 34m in the high-power wide-band amplifier circuit 202 and is supplied with the amplified signal RF4m (see FIG. 5). The RF signal output terminal 37 is connected to the transmission line 64.

The termination circuit 402 attenuates harmonics of the amplified signals RF4p and RF4m. The amplified signals RF4p and RF4m are sent to the wide-band matching circuit 301 through the termination circuit 402. In this embodiment, the termination circuit 402 is, for example, an LC series circuit including an inductor 411a and a capacitor 411b.

The inductor 411a has a first end connected to the circuit input terminal 35p, and a second end. The capacitor 411b has a first end connected to the second end of the inductor 411a, and a second end connected to the circuit input terminal 35m. The inductor 411a and the capacitor 411b may be interchangeably connected.

The wide-band matching circuit 301 is configured to be capable of adjusting the first impedance for the frequencies of the fundamentals of the amplified signals RF4p and RF4m. The amplified signals RF4p and RF4m are combined into the output signal RFout2 by the wide-band matching circuit 301. The output signal RFout2 is sent to the transmission line 64.

In this embodiment, the wide-band matching circuit 301 includes a transformer 311, a capacitor 312, inductors 313, 314, and 315a, and a switch 315b. The transformer 311 includes a primary winding 311a and a secondary winding 311b.

The transformer 311 functions as a power combiner that combines the amplified signals RF4p and RF4m and generates the output signal RFout2, which is an amplified signal of the input signal RFin2. The primary winding 311a of the transformer 311 has a first end connected to the circuit input terminal 35p and the first end of the inductor 411a, a neutral point connected to a voltage supply node VCC1 for supplying voltage to the amplifiers 43a and 43b in the high-power wide-band amplifier circuit 202, and a second end connected to the circuit input terminal 35m and the second end of the capacitor 411b. The secondary winding 311b has a first end connected to the capacitor 312, and a second end connected to ground, and is electromagnetically coupled to the primary winding 311a.

The capacitor 312 has a first end connected to the first end of the secondary winding 311b, and a second end. The inductor 314 has a first end connected to the second end of the capacitor 312, and a second end connected to the RF signal output terminal 37. In this embodiment, the wide-band matching circuit 301 includes the capacitor 312. Alternatively, the wide-band matching circuit 301 may not include the capacitor 312.

The inductor 313 has a first end connected to the second end of the capacitor 312, and a second end connected to ground.

The switch 315b has a first end connected to the second end of the capacitor 312, and a second end. The inductor 315a has a first end connected to the second end of the switch 315b, and a second end connected to ground.

The switch 315b switches between a high-frequency matching state and a low-frequency matching state of the wide-band matching circuit 301. In the high-frequency matching state, the first impedance for the frequency of the fundamental of the input signal RFin2 belonging to the high band is an impedance that allows the amplifiers 43a and 43b in the high-power wide-band amplifier circuit 202 to efficiently operate. In the low-frequency matching state, the first impedance for the frequency of the fundamental of the input signal RFin2 belonging to the mid band is an impedance that allows the amplifiers 43a and 43b in the high-power wide-band amplifier circuit 202 to efficiently operate.

In other words, in the high-frequency matching state, the impedances of the amplifiers 43a and 43b in the high-power wide-band amplifier circuit 202 are matched to the impedance of the transmission line 64 at the frequency of the fundamental of the input signal RFin2 belonging to the high band. In the low-frequency matching state, in contrast, impedances are matched at the frequency of the fundamental of the input signal RFin2 belonging to the mid band.

In this embodiment, upon receipt of the low-level band signal Sb1 from the RF signal generation circuit 16, the switch 315b electrically isolates the first and second ends thereof from each other and is brought into the off state. At this time, the wide-band matching circuit 301 makes a transition to the low-frequency matching state. In contrast, upon receipt of the high-level band signal Sb1 from the RF signal generation circuit 16, the switch 315b electrically connects the first and second ends thereof to each other and is brought into the on state. At this time, the wide-band matching circuit 301 makes a transition to the high-frequency matching state.

The wide-band matching circuit 301 may make a transition to the low-frequency matching state when the switch 315b is in the on state, and the wide-band matching circuit 301 may make a transition to the high-frequency matching state when the switch 315b is in the off state.

The wide-band matching circuit 301 and the termination circuit 402 are illustrative, and the wide-band matching circuit 301 and the termination circuit 402 may have any other circuit configuration.

In the foregoing description, the wide-band matching circuit 301 is configured such that the low-frequency matching state and the high-frequency matching state are switched using the switch 315b, although this is not required. For example, in the configuration in which the band signal Sb1 indicating three or more values is received, the wide-band matching circuit 301 may include two or more switches. In this case, the two or more switches can be switched in accordance with the band signal Sb1 to switch among three or more matching states. The wide-band matching circuit 301 may further include a capacitor connected in series with the inductor 315a. An LC resonant circuit including the inductor 315a and the capacitor attenuates a noise source (for example, harmonics or noise) outputted from the high-power wide-band amplifier circuit 202 or an incoming noise signal. The on and off states of the switch 315b are switched in accordance with the power class of the transmission power. For example, the switch 315b is brought into the on state for power class 1.5 or 2 and is brought into the off state for power class 3.

For example, in the configuration in which frequency information indicating the frequency of the input signal RFin2 is received as band information, the wide-band matching circuit 301 may include at least one of a variable capacitor having a variable capacitance and a variable inductor having a variable inductance. In this case, the capacitance of the variable capacitor and the inductance of the variable inductor are adjusted using the frequency information, thereby providing a continuous change of the matching states in accordance with the frequency of the input signal RFin2.

In the foregoing description, the first variable adjustment circuit 203 is configured to match impedance between the high-power wide-band amplifier circuit 202 and the transmission line 64, although this is not required. The first variable adjustment circuit 203 may be configured to match impedance between the high-power wide-band amplifier circuit 202 and a front-end section or an antenna.

The wide-band matching circuit 301 may include an inductor in place of the capacitor 312, and two capacitors in place of the inductors 315a and 313.

Figure 7:
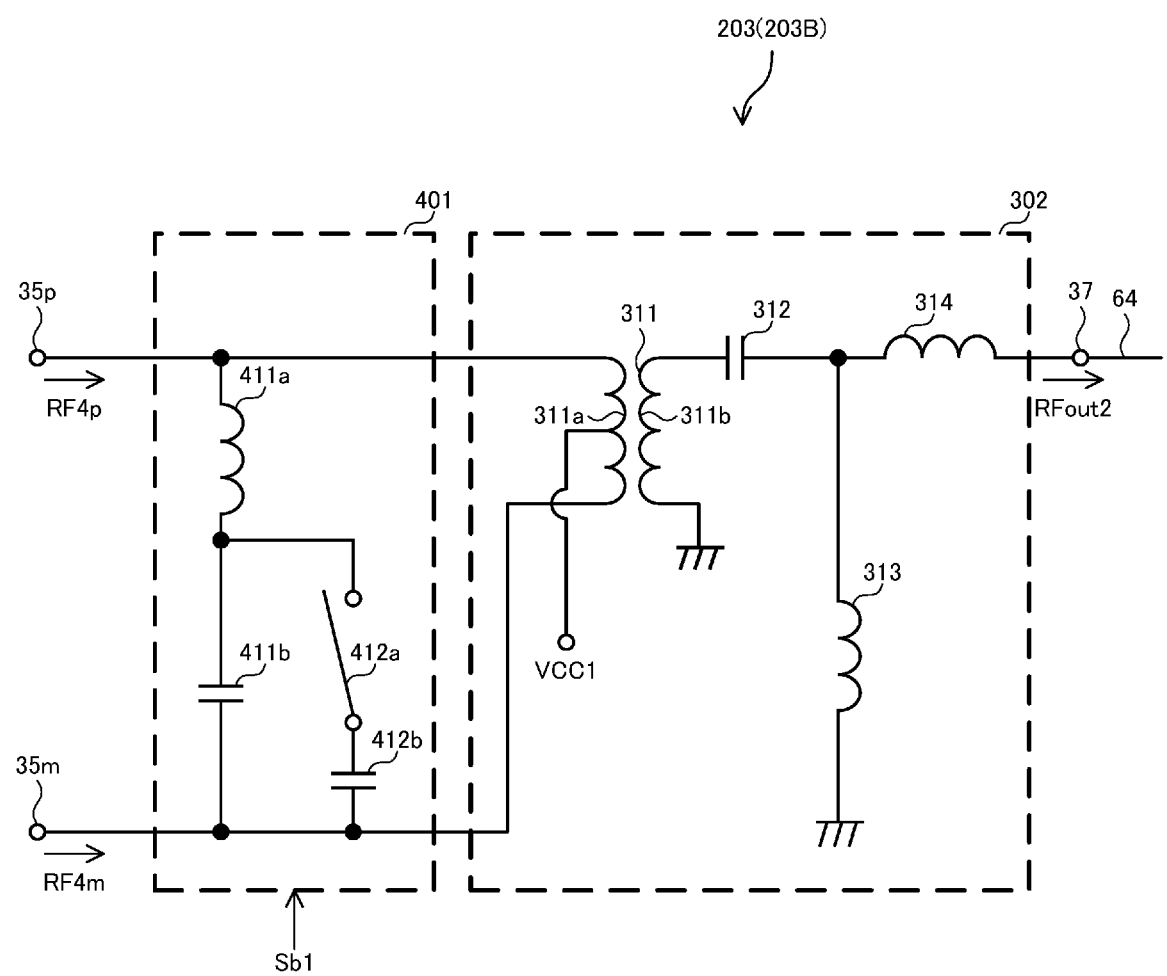
FIG. 7 is a circuit diagram illustrating a modification of the first variable adjustment circuit according to the first embodiment of the present disclosure.

A modification of the first variable adjustment circuit 203 in the power amplifier circuit 11A illustrated in FIG. 4 will be described. In the description of modifications, features common to a basic example will not be described, and only differences will be described. In particular, similar opera- FIG. 7 is a circuit diagram illustrating a modification of the first variable adjustment circuit 203 according to the first embodiment of the present disclosure. As illustrated in FIG. 7, the modification of the first variable adjustment circuit 203 (hereinafter referred to sometimes as the first variable adjustment circuit 203B) is different from the first variable adjustment circuit 203A illustrated in FIG. 6 in that a termination circuit includes a switch and a matching circuit does not include a switch.

In this modification, the first variable adjustment circuit 203B includes a matching circuit 302 and a wide-band termination circuit 401 (variable harmonic adjustment circuit).

The wide-band termination circuit 401 is configured to be capable of adjusting the first impedance for the frequencies of harmonics of the amplified signals RF4p and RF4m. The amplified signals RF4p and RF4m are sent to the matching circuit 302 through the wide-band termination circuit 401.

In this modification, the wide-band termination circuit 401 includes an inductor 411a, capacitors 411b and 412b, and a switch 412a.

The inductor 411a has a first end connected to the circuit input terminal 35p, and a second end. The capacitor 411b has a first end connected to the second end of the inductor 411a, and a second end connected to the circuit input terminal 35m.

The switch 412a has a first end connected to the second end of the inductor 411a, and a second end. The capacitor 412b has a first end connected to the second end of the switch 412a, and a second end connected to the circuit input terminal 35m and the second end of the capacitor 411b.

The switch 412a switches between a high-frequency attenuation state and a low-frequency attenuation state of the wide-band termination circuit 401. In the high-frequency attenuation state, the first impedance for the frequency of a harmonic of the input signal RFin2 belonging to the high band is an impedance that attenuates the harmonic. In the low-frequency attenuation state, the first impedance for the frequency of a harmonic of the input signal RFin2 belonging to the mid band is an impedance that attenuates the harmonic.

In this modification, upon receipt of the low-level band signal Sb1 from the RF signal generation circuit 16, the switch 412a electrically connects the first and second ends thereof to each other and is brought into the on state. At this time, the wide-band termination circuit 401 makes a transition to the low-frequency attenuation state. In contrast, upon receipt of the high-level band signal Sb1 from the RF signal generation circuit 16, the switch 412a electrically isolates the first and second ends thereof from each other and is brought into the off state. At this time, the wide-band termination circuit 401 makes a transition to the high-frequency attenuation state.

The wide-band termination circuit 401 may make a transition to the low-frequency attenuation state when the switch 412a is in the off state, and the wide-band termination circuit 401 may make a transition to the high-frequency attenuation state when the switch 412a is in the on state. The inductor 411a, the capacitor 411b, and the capacitor 412b may form an LC resonant circuit that attenuates a noise source (for example, harmonics and the like) outputted from the high-power wide-band amplifier circuit 202. The on and off states of the switch 412a are switched in accordance with the power class of the transmission power. For example, the switch 412a is brought into the on state for power class 1.5 or 2 and is brought into the off state for power class 3.

The matching circuit 302 matches the impedances of the amplifiers 43a and 43b in the high-power wide-band amplifier circuit 202 to the impedance of the transmission line 64. The amplified signals RF4p and RF4m are combined into the output signal RFout2 by the matching circuit 302. The output signal RFout2 is sent to the transmission line 64.

In this modification, the matching circuit 302 includes a transformer 311, a capacitor 312, and inductors 313 and 314. The transformer 311 includes a primary winding 311a and a secondary winding 311b. In this modification, the matching circuit 302 includes the capacitor 312. Alternatively, the matching circuit 302 may not include the capacitor 312.

The primary winding 311a of the transformer 311 has a first end connected to the circuit input terminal 35p and the first end of the inductor 411a, a neutral point connected to the voltage supply node VCC1, and a second end connected to the circuit input terminal 35m, the second end of the capacitor 411b, and the second end of the capacitor 412b. The secondary winding 311b has a first end connected to the capacitor 312, and a second end connected to ground, and is electromagnetically coupled to the primary winding 311a.

The capacitor 312 has a first end connected to the first end of the secondary winding 311b, and a second end. The inductor 314 has a first end connected to the second end of the capacitor 312, and a second end connected to the RF signal output terminal 37.

The inductor 313 has a first end connected to the second end of the capacitor 312, and a second end connected to ground.

The matching circuit 302 and the wide-band termination circuit 401 are illustrative, and the matching circuit 302 and the wide-band termination circuit 401 may have any other circuit configuration.

In the foregoing description, the wide-band termination circuit 401 is configured such that the low-frequency attenuation state and the high-frequency attenuation state are switched using the switch 412a, although this is not required. For example, in the configuration in which the band signal Sb1 indicating three or more values is received, the wide-band termination circuit 401 may include two or more switches. In this case, the two or more switches can be switched in accordance with the band signal Sb1 to switch among three or more attenuation states.

For example, in the configuration in which frequency information indicating the frequency of the input signal RFin2 is received as band information, the wide-band termination circuit 401 may include at least one of a variable capacitor and a variable inductor. In this case, the capacitance of the variable capacitor and the inductance of the variable inductor are adjusted using the frequency information, thereby providing a continuous change of the attenuation states in accordance with the frequency of the input signal RFin2.

The first variable adjustment circuit 203B may include the wide-band matching circuit 301 illustrated in FIG. 6 in place of the matching circuit 302.

Figure 8:
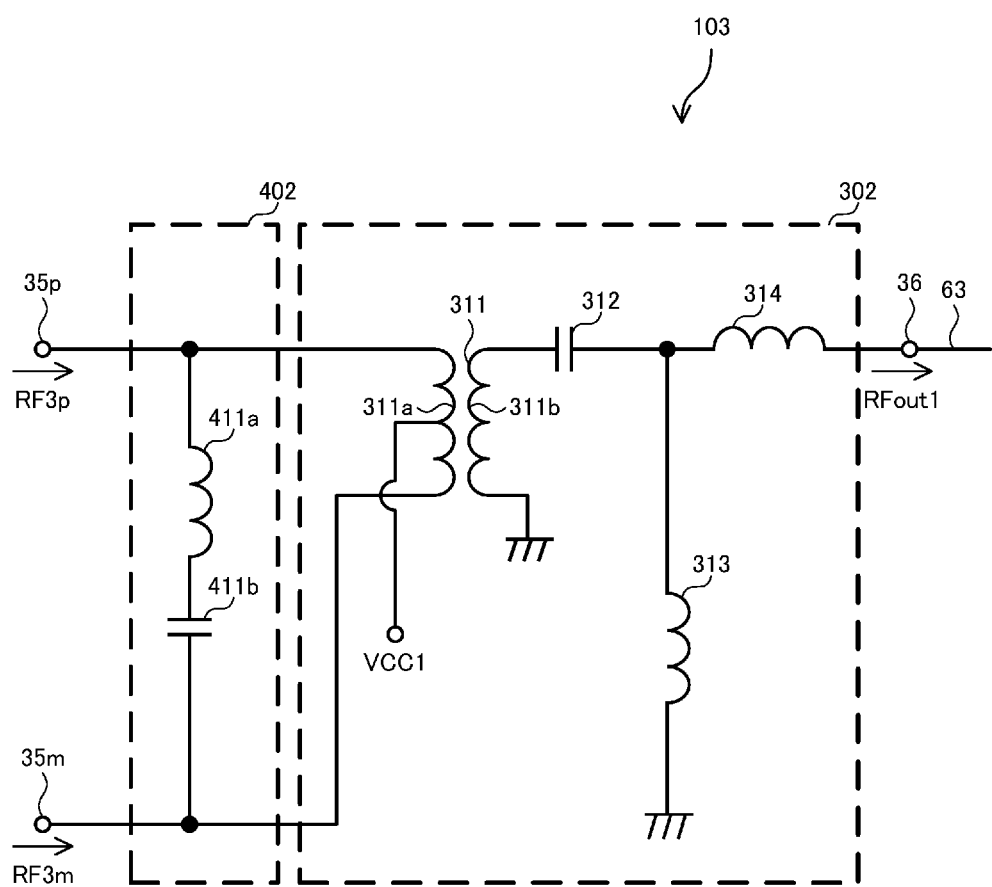
FIG. 8 is a circuit diagram illustrating an example of a fixed adjustment circuit according to the first embodiment of the present disclosure.

The fixed adjustment circuit 103 in the power amplifier circuit 11A illustrated in FIG. 4 will be described in detail. FIG. 8 is a circuit diagram illustrating an example of the fixed adjustment circuit 103 according to the first embodiment of the present disclosure.

As illustrated in FIG. 8, the fixed adjustment circuit 103 includes a matching circuit 302 and a termination circuit 402. A circuit input terminal 35p is connected to the circuit output terminal 34p in the low-power MB amplifier circuit 102 and is supplied with the amplified signal RF3p (see FIG. 5). A circuit input terminal 35m is connected to the circuit output terminal 34m in the low-power MB amplifier circuit 102 and is supplied with the amplified signal RF3m (see FIG. 5).

The termination circuit 402 attenuates harmonics of the amplified signals RF3p and RF3m. The amplified signals RF3p and RF3m are sent to the matching circuit 302 through the termination circuit 402.

The matching circuit 302 matches the impedances of the amplifiers 43a and 43b in the low-power MB amplifier circuit 102 to the impedance of the transmission line 63. The amplified signals RF3p and RF3m are combined into the output signal RFout1 by the matching circuit 302. The output signal RFout1 is sent to the transmission line 63.

In the foregoing description, the power amplifier circuit 11A is configured to amplify the input signals RFin1 and RFin2 to levels that allow the input signals RFin1 and RFin2 to be transmitted with the transmission powers defined in PC 3 and PC 2, respectively. Alternatively, the power amplifier circuit 11A may be configured to amplify input signals to a level that allows the input signals to be transmitted with the transmission power defined in any one of PC 1.5, PC 2, and PC 3. The transmission power defined in PC 1.5 is, for example, an antenna output of 29 dBm.

Figure 9:
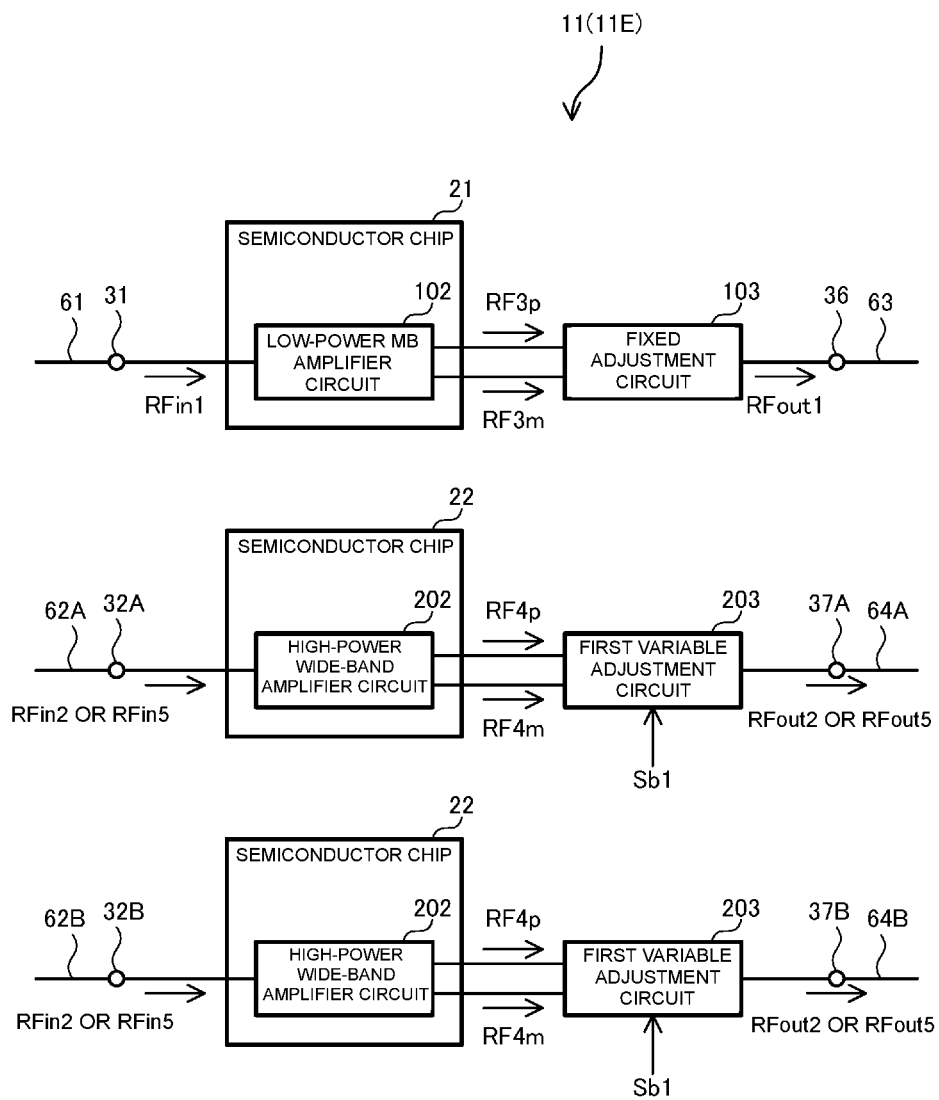
FIG. 9 is a diagram illustrating a configuration of the basic example of the power amplifier circuit according to the first embodiment of the present disclosure when applicable to transmission with the transmission power defined in PC 1.5.

FIG. 9 illustrates a configuration of the basic example of the power amplifier circuit 11 according to the first embodiment of the present disclosure when applicable to transmission with the transmission power defined in PC 1.5. As illustrated in FIG. 9, unlike the power amplifier circuit 11A illustrated in FIG. 4, a power amplifier circuit 11E further includes another set of the high-power wide-band amplifier circuit 202 and the first variable adjustment circuit 203 (hereinafter referred to sometimes as a high-power amplifier system).

In the power amplifier circuit 11E, two high-power amplifier systems are disposed in parallel. An input signal RFin5 to be amplified is split into two signals which are supplied to transmission lines 62A and 62B.

One of the two high-power amplifier systems (this high-power amplifier system is hereinafter referred to sometimes as the first high-power amplifier system) is connected to the transmission line 62A on the input side through an RF signal input terminal 32A and is connected to a transmission line 64A on the output side through an RF signal output terminal 37A.

The other high-power amplifier system among the two high-power amplifier systems (this high-power amplifier system is hereinafter referred to sometimes as the second high-power amplifier system) is connected to a transmission line 62B on the input side through an RF signal input terminal 32B and is connected to a transmission line 64B on the output side through an RF signal output terminal 37B.

The first high-power amplifier system amplifies the input signal RFin5 supplied through the transmission line 62A and supplies an output signal RFout5, which is the amplified signal, to the transmission line 64A. The second high-power amplifier system amplifies the input signal RFin5 supplied through the transmission line 62B and supplies an output signal RFout5, which is the amplified signal, to the transmission line 64B.

The output signals RFout5 supplied to the transmission lines 64A and 64B are combined by the subsequent circuit. Accordingly, the input signal RFin5 is amplified to a level that allows the input signal RFin5 to be transmitted with the transmission power defined in PC 1.5.

When the input signal RFin1 is supplied to the low-power MB amplifier circuit 102 through the transmission line 61 in the power amplifier circuit 11E, the power amplifier circuit 11E can amplify the input signal RFin1 to a level that allows the input signal RFin1 to be transmitted with the transmission power defined in PC 3. When the input signal RFin2 is supplied to the first high-power amplifier system or the second high-power amplifier system through the transmission line 62A or 62B, the power amplifier circuit 11E can amplify the input signal RFin2 to a level that allows the input signal RFin2 to be transmitted with the transmission power defined in PC 2.

First Modification of Power Amplifier Circuit 11

Figure 10:
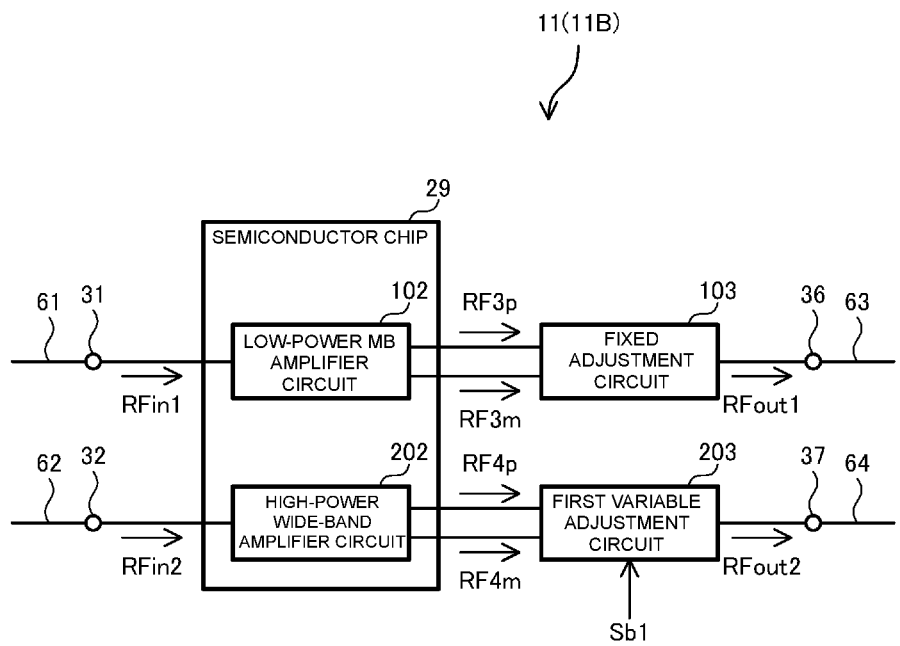
FIG. 10 is a diagram illustrating a configuration of a first modification of the power amplifier circuit according to the first embodiment of the present disclosure.

A first modification of the power amplifier circuit 11 according to the first embodiment will be described. FIG. 10 illustrates a configuration of a first modification of the power amplifier circuit 11 according to the first embodiment of the present disclosure. As illustrated in FIG. 10, the first modification of the power amplifier circuit 11 according to the first embodiment (hereinafter referred to sometimes as the power amplifier circuit 11B) is different from the basic example of the power amplifier circuit 11, or the power amplifier circuit 11A, illustrated in FIG. 4 in that two amplifier circuits are formed in or on a single semiconductor chip.

In this modification, the low-power MB amplifier circuit 102 and the high-power wide-band amplifier circuit 202 are formed in or on a semiconductor chip 29. The configuration in which the elements constituting the low-power MB amplifier circuit 102 and the high-power wide-band amplifier circuit 202 are formed in or on the same substrate reduces variation in the characteristics of the elements. In addition, for example, the low-power MB amplifier circuit 102 and the high-power wide-band amplifier circuit 202 are connected to common ground, thereby implementing chip shrink in which the size of the semiconductor chip 29 is reduced.

Second Modification of Power Amplifier Circuit 11

Figure 11:
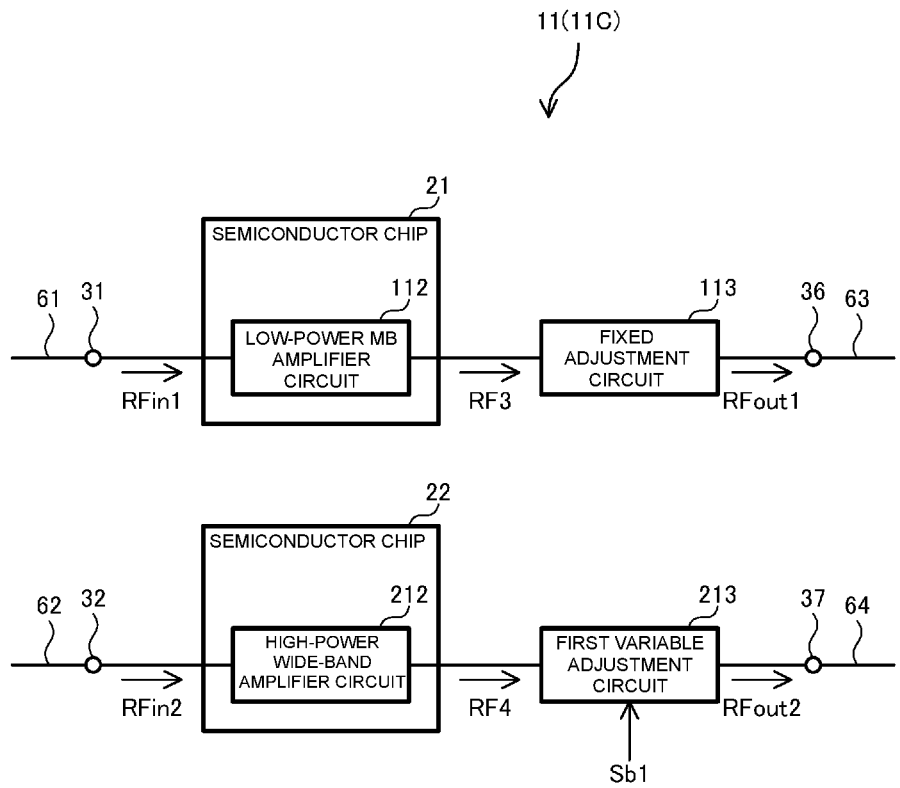
FIG. 11 is a diagram illustrating a configuration of a second modification of the power amplifier circuit according to the first embodiment of the present disclosure.

A second modification of the power amplifier circuit 11 according to the first embodiment will be described. FIG. 11 illustrates a configuration of a second modification of the power amplifier circuit 11 according to the first embodiment of the present disclosure. As illustrated in FIG. 11, the second modification of the power amplifier circuit 11 according to the first embodiment (hereinafter referred to sometimes as the power amplifier circuit 11C) is different from the basic example of the power amplifier circuit 11, or the power amplifier circuit 11A, illustrated in FIG. 4 in that amplifier circuits amplify input signals using a single method.

In this modification, the power amplifier circuit 11C includes a low-power MB amplifier circuit 112 (first amplifier circuit), a fixed adjustment circuit 113, a high-power wide-band amplifier circuit 212 (second amplifier circuit), and a first variable adjustment circuit 213. The low-power MB amplifier circuit 112 and the high-power wide-band amplifier circuit 212 are formed in or on semiconductor chips 21 and 22, respectively.

The low-power MB amplifier circuit 112 amplifies the input signal RFin1 of the mid band, which is supplied through the RF signal input terminal 31, and generates an amplified signal RF3 (first amplified signal) having a first power. In this modification, the low-power MB amplifier circuit 112 is a circuit configured to amplify the input signal RFin1 to a level that allows the input signal RFin1 to be transmitted with the transmission power defined in PC 3, and is designed to amplify a signal belonging to the mid band.

The low-power MB amplifier circuit 112 outputs the generated amplified signal RF3 to the fixed adjustment circuit 113.

The fixed adjustment circuit 113 adjusts the impedance of the transmission line 63 seen from the low-power MB amplifier circuit 112. In other words, the fixed adjustment circuit 113 matches impedance between the low-power MB amplifier circuit 112 and the transmission line 63.

The high-power wide-band amplifier circuit 212 amplifies the input signal RFin2 of the mid band or the high band, which is supplied through the RF signal input terminal 32, and generates an amplified signal RF4 (second amplified signal) having a second power. In this modification, the high-power wide-band amplifier circuit 212 is a circuit configured to amplify the input signal RFin2 to a level that allows the input signal RFin2 to be transmitted with the transmission power defined in PC 2, and is designed to amplify a signal belonging to the mid band or the high band. The high-power wide-band amplifier circuit 212 outputs the generated amplified signal RF4 to the first variable adjustment circuit 213.

The first variable adjustment circuit 213 is configured to be capable of adjusting the first impedance of the transmission line 64 seen from the high-power wide-band amplifier circuit 212.

Figure 12:
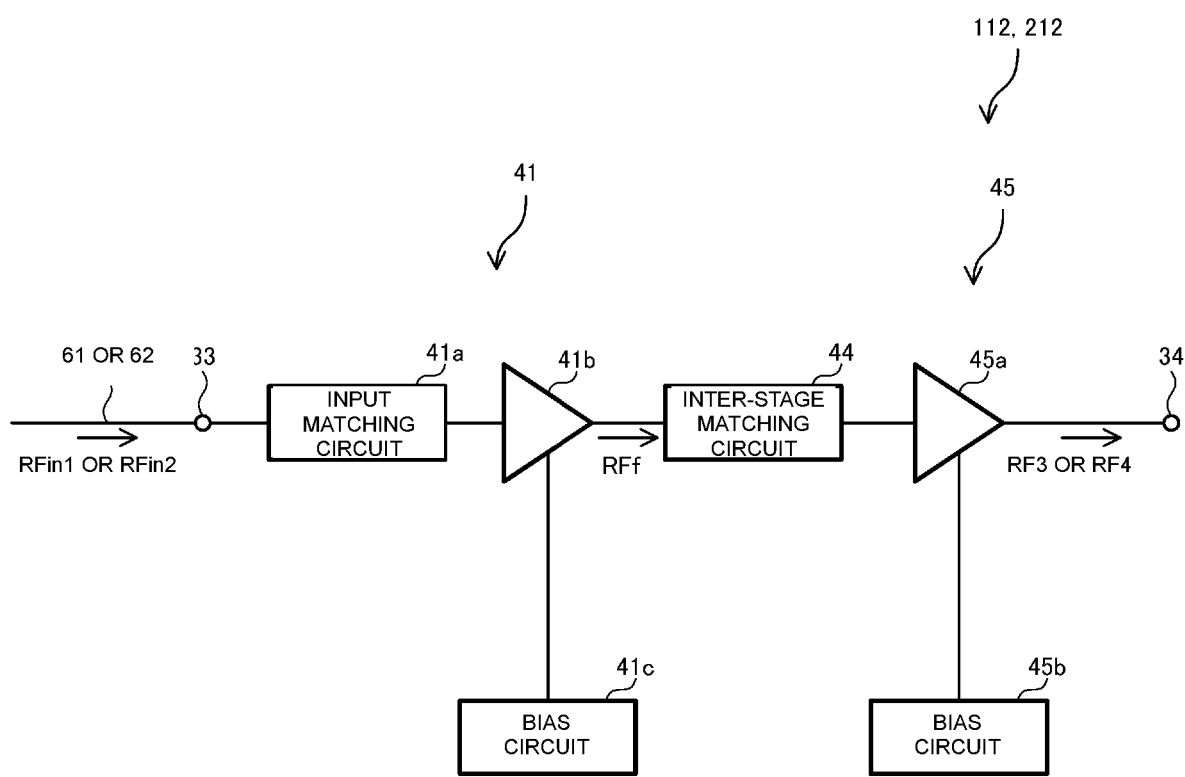
FIG. 12 is a circuit diagram illustrating an example of a high-power wide-band amplifier circuit and a low-power MB amplifier circuit in the second modification of the power amplifier circuit according to the first embodiment of the present disclosure.

The high-power wide-band amplifier circuit 212 and the low-power MB amplifier circuit 112 in the power amplifier circuit 11C illustrated in FIG. 11 will be described in detail. FIG. 12 is a circuit diagram illustrating an example of the high-power wide-band amplifier circuit 212 and the low-power MB amplifier circuit 112 in the second modification of the power amplifier circuit 11 according to the first embodiment of the present disclosure. The high-power wide-band amplifier circuit 212 and the low-power MB amplifier circuit 112 have similar circuit configurations, and the high-power wide-band amplifier circuit 212 will be described as a representative so that the description of the low-power MB amplifier circuit 112 is omitted as much as possible.

As illustrated in FIG. 12, the high-power wide-band amplifier circuit 212 includes a driver-stage single amplifier circuit 41, an inter-stage matching circuit 44, and a power-stage single amplifier circuit 45. The driver-stage single amplifier circuit 41 has a circuit configuration similar to that of the driver-stage single amplifier circuit 41 in the high-power wide-band amplifier circuit 202 illustrated in FIG. 5. The power-stage single amplifier circuit 45 includes an amplifier 45a and a bias circuit 45b.

The amplifier 45a is formed by, for example, a bipolar transistor such as an HBT. The amplifier 45a may be formed by an FET. The bias circuit 45b supplies a bias to the amplifier 45a. Although not illustrated in FIG. 12, the amplifier 45a is supplied with a power supply voltage.

A circuit input terminal 33 is supplied with the input signal RFin2 through the transmission line 62. The inter-stage matching circuit 44 is formed by, for example, a combination of a capacitor and an inductor, and has a first end connected to the output terminal of the amplifier 41b, and a second end. The inter-stage matching circuit 44 matches impedance between the amplifier 41b and the amplifier 45a.

The amplifier 45a has an input terminal connected to the second end of the inter-stage matching circuit 44, and an output terminal connected to a circuit output terminal 34. The amplifier 45a amplifies the amplified signal RFf inputted from the input terminal and outputs the amplified signal RF4 to the circuit output terminal 34 from the output terminal.

In the case of the low-power MB amplifier circuit 112, the circuit input terminal 33 is supplied with the input signal RFin1 through the transmission line 61. The amplifier 41b amplifies the input signal RFin1 inputted from the input terminal and outputs the amplified signal RFf from the output terminal.

The amplifier 45a amplifies the amplified signal RFf inputted from the input terminal and outputs the amplified signal RF3 to the circuit output terminal 34 from the output terminal.

In the foregoing description, the high-power wide-band amplifier circuit 212 and the low-power MB amplifier circuit 112 according to this modification is configured to amplify an input signal using two stages of amplifier circuits including a driver-stage amplifier circuit and a power-stage amplifier circuit, although this is not required. The high-power wide-band amplifier circuit 212 and the low-power MB amplifier circuit 112 may be configured to amplify an input signal using a single-stage amplifier circuit, or may be configured to amplify an input signal using three or more stages of amplifier circuits.

Figure 13:
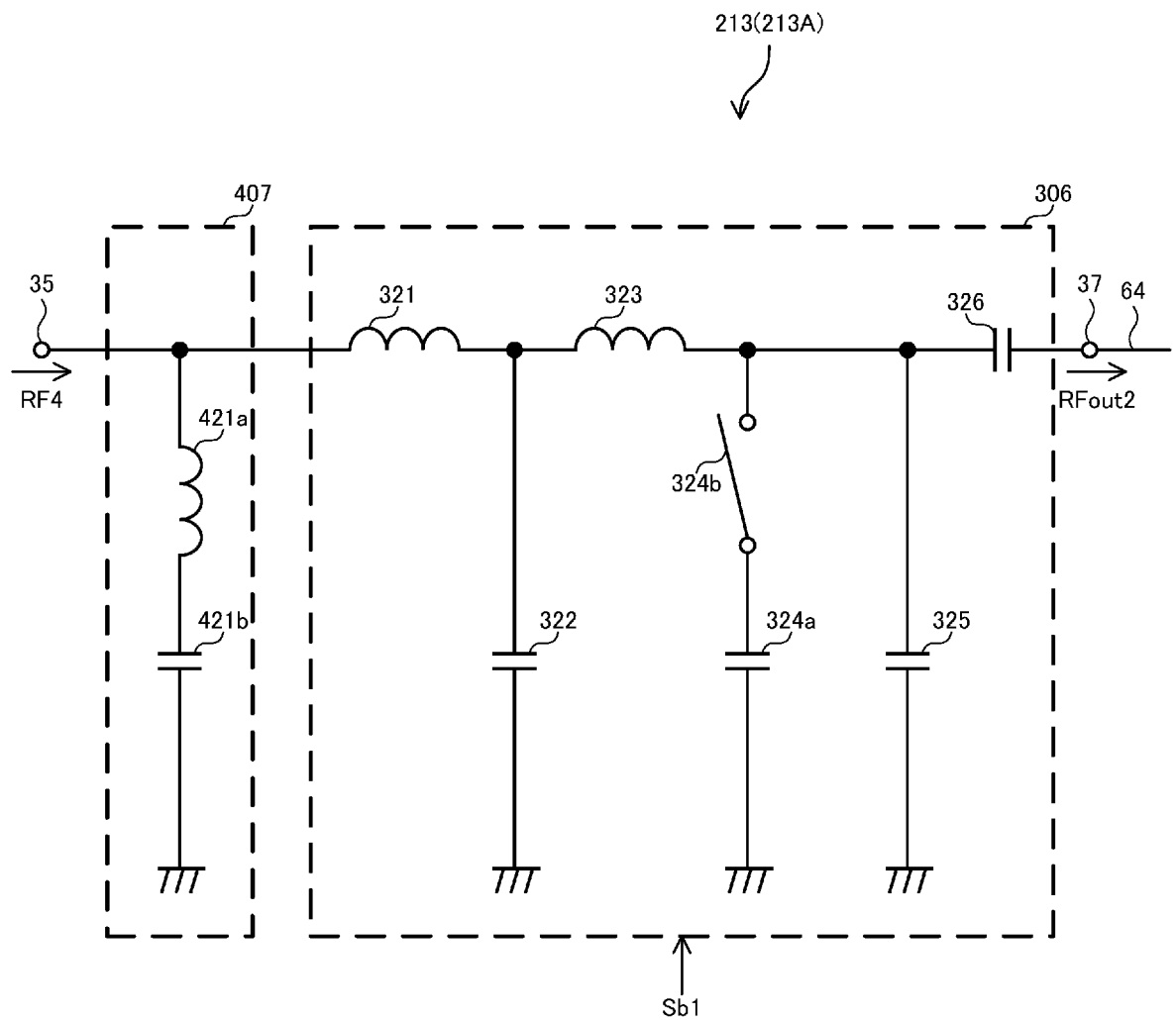
FIG. 13 is a circuit diagram illustrating a basic example of a first variable adjustment circuit in the second modification of the power amplifier circuit according to the first embodiment of the present disclosure.

The first variable adjustment circuit 213 in the power amplifier circuit 11C illustrated in FIG. 11 will be described in detail. FIG. 13 is a circuit diagram illustrating a basic example of the first variable adjustment circuit 213 in the second modification of the power amplifier circuit 11 according to the first embodiment of the present disclosure.

As illustrated in FIG. 13, the basic example of the first variable adjustment circuit 213 (hereinafter referred to sometimes as the first variable adjustment circuit 213A) includes a wide-band matching circuit 306 (variable fundamental adjustment circuit) and a termination circuit 407. A circuit input terminal 35 is connected to the circuit output terminal 34 in the high-power wide-band amplifier circuit 212 and is supplied with the amplified signal RF4 (see FIG. 12).

The termination circuit 407 attenuate a harmonic of the amplified signal RF4. The amplified signal RF4 is sent to the wide-band matching circuit 306 through the termination circuit 407. In this basic example, the termination circuit 407 is, for example, an LC series circuit including an inductor 421a and a capacitor 421b.

The inductor 421a has a first end connected to the circuit input terminal 35, and a second end. The capacitor 421b has a first end connected to the second end of the inductor 421a, and a second end connected to ground.

The wide-band matching circuit 306 is configured to be capable of adjusting the first impedance for the frequency of the fundamental of the amplified signal RF4. The amplified signal RF4 is converted into the output signal RFout2 through the wide-band matching circuit 306, and the output signal RFout2 is sent to the transmission line 64.

In this basic example, the wide-band matching circuit 306 includes, for example, inductors 321 and 323, capacitors 322, 324a, 325, and 326, and a switch 324b.

The inductor 321 has a first end connected to the circuit input terminal 35 and the first end of the inductor 421a, and a second end. The capacitor 322 has a first end connected to the second end of the inductor 321, and a second end connected to ground.

The inductor 323 has a first end connected to the second end of the inductor 321 and the first end of the capacitor 322, and a second end. The capacitor 326 has a first end connected to the second end of the inductor 323, and a second end connected to the RF signal output terminal 37.

The capacitor 325 has a first end connected to the second end of the inductor 323 and the first end of the capacitor 326, and a second end connected to ground.

The switch 324b has a first end connected to the second end of the inductor 323 and the first end of the capacitor 326, and a second end. The capacitor 324a has a first end connected to the second end of the switch 324b, and a second end connected to ground.

The switch 324b switches between the high-frequency matching state and the low-frequency matching state of the wide-band matching circuit 306. Upon receipt of the low-level band signal Sb1 from the RF signal generation circuit 16, the switch 324b electrically connects the first and second ends thereof to each other and is brought into the on state. At this time, the wide-band matching circuit 306 makes a transition to the low-frequency matching state. In contrast, upon receipt of the high-level band signal Sb1 from the RF signal generation circuit 16, the switch 324b electrically isolates the first and second ends thereof from each other and is brought into the off state. At this time, the wide-band matching circuit 306 makes a transition to the high-frequency matching state.

The wide-band matching circuit 306 may make a transition to the low-frequency matching state when the switch 324b is in the off state, and the wide-band matching circuit 306 may make a transition to the high-frequency matching state when the switch 324b is in the on state. The wide-band matching circuit 306 may further include an inductor connected in series with the capacitor 324a. An LC resonant circuit including the capacitor 324a and the inductor attenuates a noise source (for example, harmonics or noise) outputted from the high-power wide-band amplifier circuit 212 or an incoming noise signal. The on and off states of the switch 324b are switched in accordance with the power class of the transmission power. For example, the switch 324b is brought into the on state for power class 1.5 or 2 and is brought into the off state for power class 3.

The wide-band matching circuit 306 and the termination circuit 407 are illustrative, and the wide-band matching circuit 306 and the termination circuit 407 may have any other circuit configuration.

For example, in the configuration in which the band signal Sb1 indicating three or more values is received, the wide-band matching circuit 306 may include two or more switches. In this case, the two or more switches can be switched in accordance with the band signal Sb1 to switch among three or more matching states.

For example, in the configuration in which frequency information indicating the frequency of the input signal RFin2 is received as band information, the wide-band matching circuit 306 may include at least one of a variable capacitor and a variable inductor. In this case, the capacitance of the variable capacitor and the inductance of the variable inductor are adjusted using the frequency information, thereby providing a continuous change of the matching states in accordance with the frequency of the input signal RFin2.

Figure 14:
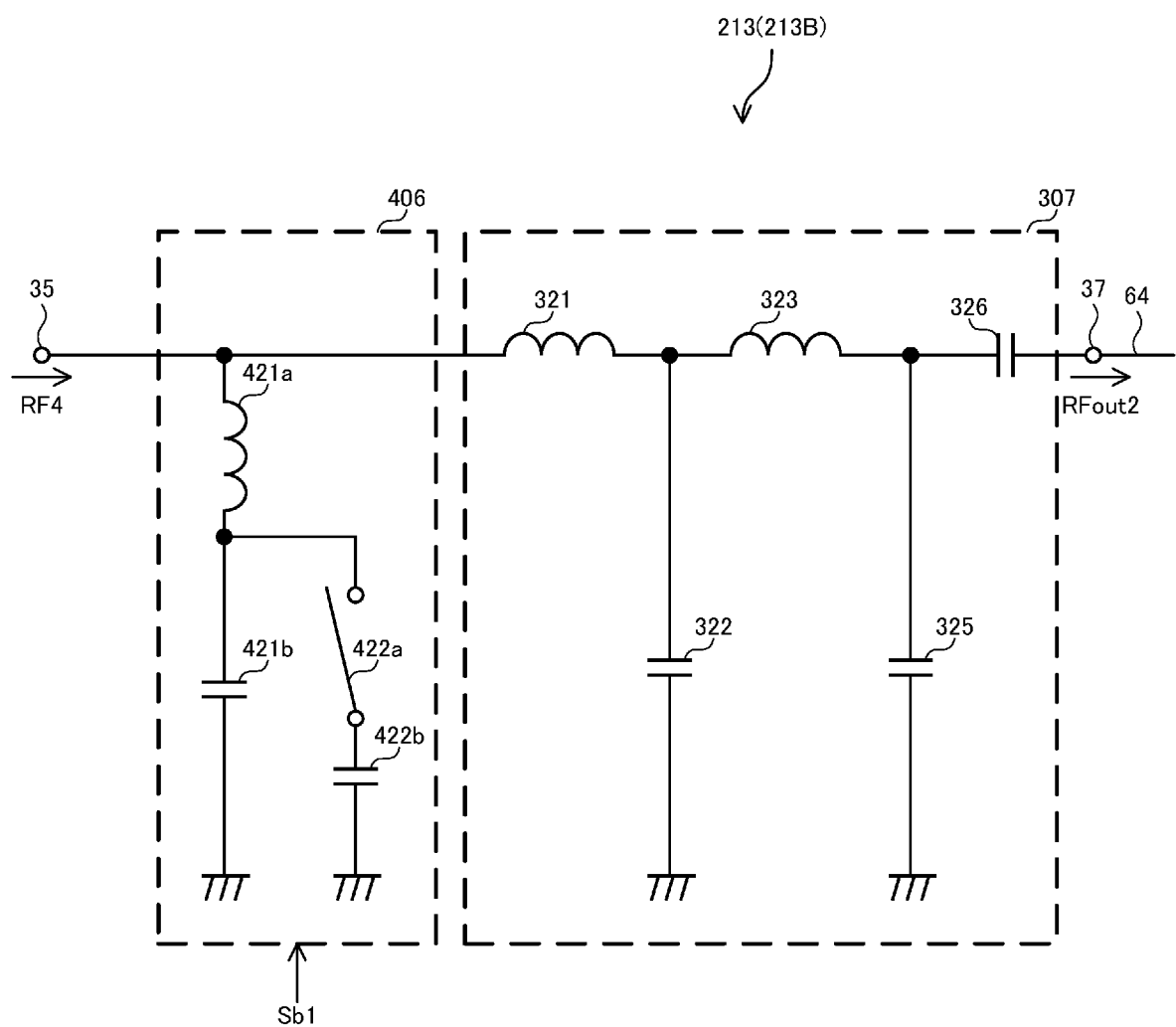
FIG. 14 is a circuit diagram illustrating a modification of the first variable adjustment circuit in the second modification of the power amplifier circuit according to the first embodiment of the present disclosure.

A modification of the first variable adjustment circuit 213 in the power amplifier circuit 11C illustrated in FIG. 11 will be described. FIG. 14 is a circuit diagram illustrating a modification of the first variable adjustment circuit 213 in the second modification of the power amplifier circuit 11 according to the first embodiment of the present disclosure. As illustrated in FIG. 14, the modification of the first variable adjustment circuit 213 (hereinafter referred to sometimes as the first variable adjustment circuit 213B) is different from the first variable adjustment circuit 213A illustrated in FIG. 13 in that a termination circuit includes a switch and a matching circuit does not include a switch.

In this modification, the first variable adjustment circuit 213B includes a matching circuit 307 and a wide-band termination circuit 406 (variable harmonic adjustment circuit).

The wide-band termination circuit 406 is configured to be capable of adjusting the first impedance for the frequency of a harmonic of the amplified signal RF4. The amplified signal RF4 is sent to the matching circuit 307 through the wide-band termination circuit 406.

In this modification, the wide-band termination circuit 406 includes an inductor 421a, capacitors 421b and 422b, and a switch 422a.

The inductor 421a has a first end connected to the circuit input terminal 35, and a second end. The capacitor 421b has a first end connected to the second end of the inductor 421a, and a second end connected to ground.

The switch 422a has a first end connected to the second end of the inductor 421a, and a second end. The capacitor 422b has a first end connected to the second end of the switch 422a, and a second end connected to ground.

The switch 422a switches between the high-frequency attenuation state and the low-frequency attenuation state of the wide-band termination circuit 406. Upon receipt of the low-level band signal Sb1 from the RF signal generation circuit 16, the switch 422a electrically connects the first and second ends thereof to each other and is brought into the on state. At this time, the wide-band termination circuit 406 makes a transition to the low-frequency attenuation state. In contrast, upon receipt of the high-level band signal Sb1 from the RF signal generation circuit 16, the switch 422a electrically isolates the first and second ends thereof from each other and is brought into the off state. At this time, the wide-band termination circuit 406 makes a transition to the high-frequency attenuation state.

The wide-band termination circuit 406 may make a transition to the low-frequency attenuation state when the switch 422a is in the off state, and the wide-band termination circuit 406 may make a transition to the high-frequency attenuation state when the switch 422a is in the on state. The inductor 421a, the capacitor 421b, and the capacitor 422b may form an LC resonant circuit that attenuates a noise source (for example, harmonics and the like) outputted from the high-power wide-band amplifier circuit 212. The on and off states of the switch 422a are switched in accordance with the power class of the transmission power. For example, the switch 422a is brought into the on state for power class 1.5 or 2 and is brought into the off state for power class 3.

The matching circuit 307 matches impedance between the amplifier 45a in the high-power wide-band amplifier circuit 212 and the transmission line 64. The amplified signal RF4 is converted into the output signal RFout2 through the matching circuit 307, and the output signal RFout2 is sent to the transmission line 64.

In this modification, the matching circuit 307 includes inductors 321 and 323 and capacitors 322, 325, and 326.

The inductor 321 has a first end connected to the circuit input terminal 35 and the first end of the inductor 421a, and a second end. The capacitor 322 has a first end connected to the second end of the inductor 321, and a second end connected to ground.

The inductor 323 has a first end connected to the second end of the inductor 321 and the first end of the capacitor 322, and a second end. The capacitor 326 has a first end connected to the second end of the inductor 323, and a second end connected to the RF signal output terminal 37.

The capacitor 325 has a first end connected to the second end of the inductor 323 and the first end of the capacitor 326, and a second end connected to ground.

The matching circuit 307 and the wide-band termination circuit 406 are illustrative, and the matching circuit 307 and the wide-band termination circuit 406 may have any other circuit configuration.

For example, in the configuration in which the band signal Sb1 indicating three or more values is received, the wide-band termination circuit 406 may include two or more switches. In this case, the two or more switches can be switched in accordance with the band signal Sb1 to switch among three or more attenuation states.

For example, in the configuration in which frequency information indicating the frequency of the input signal RFin2 is received as band information, the wide-band termination circuit 406 may include at least one of a variable capacitor and a variable inductor. In this case, the capacitance of the variable capacitor and the inductance of the variable inductor are adjusted using the frequency information, thereby providing a continuous change of the attenuation states in accordance with the frequency of the input signal RFin2.

The first variable adjustment circuit 213B may include the wide-band matching circuit 306 illustrated in FIG. 13 in place of the matching circuit 307.

Figure 15:
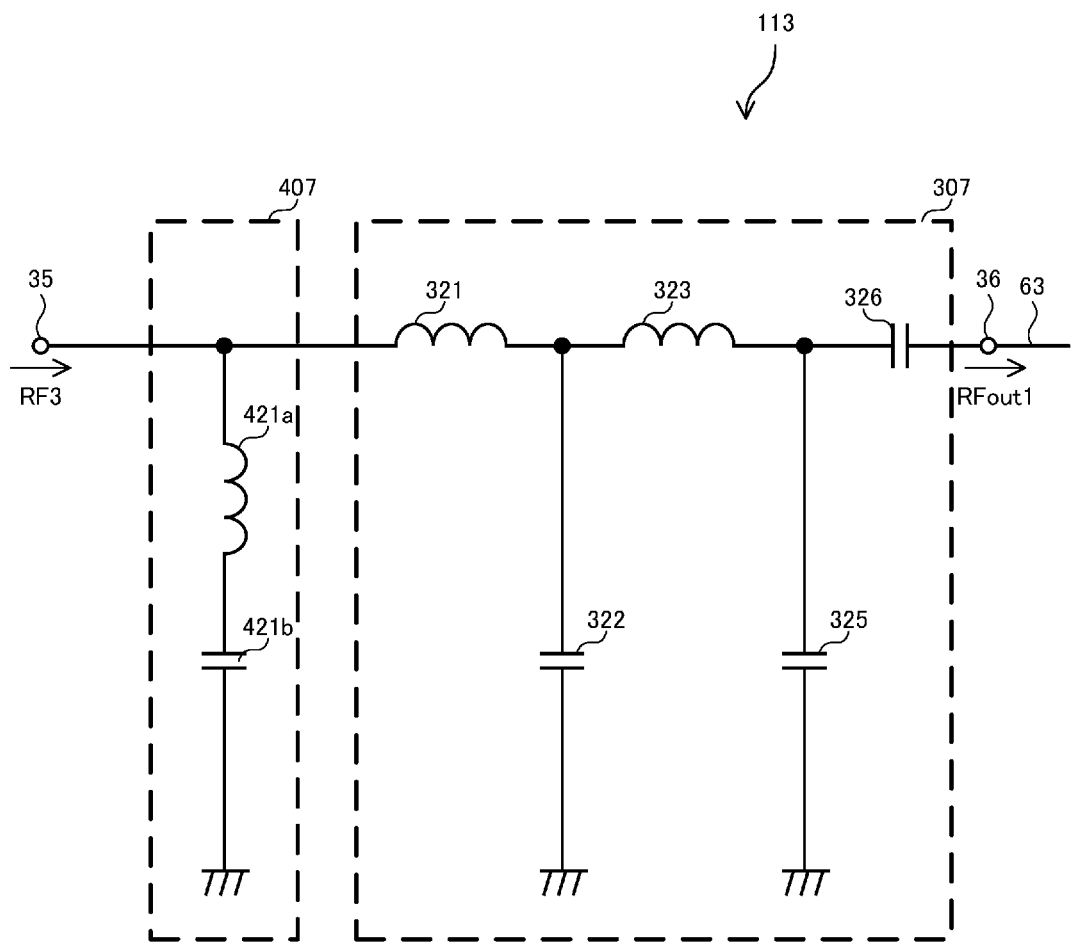
FIG. 15 is a circuit diagram illustrating an example of a fixed adjustment circuit in the second modification of the power amplifier circuit according to the first embodiment of the present disclosure.

The fixed adjustment circuit 113 in the power amplifier circuit 11C illustrated in FIG. 11 will be described in detail. FIG. 15 is a circuit diagram illustrating an example of the fixed adjustment circuit 113 in the second modification of the power amplifier circuit 11 according to the first embodiment of the present disclosure.

As illustrated in FIG. 15, the fixed adjustment circuit 113 includes a matching circuit 307 and a termination circuit 407. A circuit input terminal 35 is connected to the circuit output terminal 34 in the low-power MB amplifier circuit 112 and is supplied with the amplified signal RF3 (see FIG. 12).

The termination circuit 407 attenuate a harmonic of the amplified signal RF3. The amplified signal RF3 is sent to the matching circuit 307 through the termination circuit 407.

The matching circuit 307 matches impedance between the amplifier 45a in the low-power MB amplifier circuit 112 and the transmission line 63. The amplified signal RF3 is converted into the output signal RFout1 through the matching circuit 307, and the output signal RFout1 is sent to the transmission line 63.

The configuration in which the low-power MB amplifier circuit 112 and the high-power wide-band amplifier circuit 212 amplify an input signal using the single method can simplify the configuration of amplifier circuits. As a result, the circuit size of the amplifier circuits can be reduced.

In the foregoing description, the low-power MB amplifier circuit 112 and the high-power wide-band amplifier circuit 212 are formed in or on the semiconductor chips 21 and 22, respectively. Alternatively, the low-power MB amplifier circuit 112 and the high-power wide-band amplifier circuit 212 may be formed in or on a single semiconductor chip.

Third Modification of Power Amplifier Circuit 11

Figure 16:
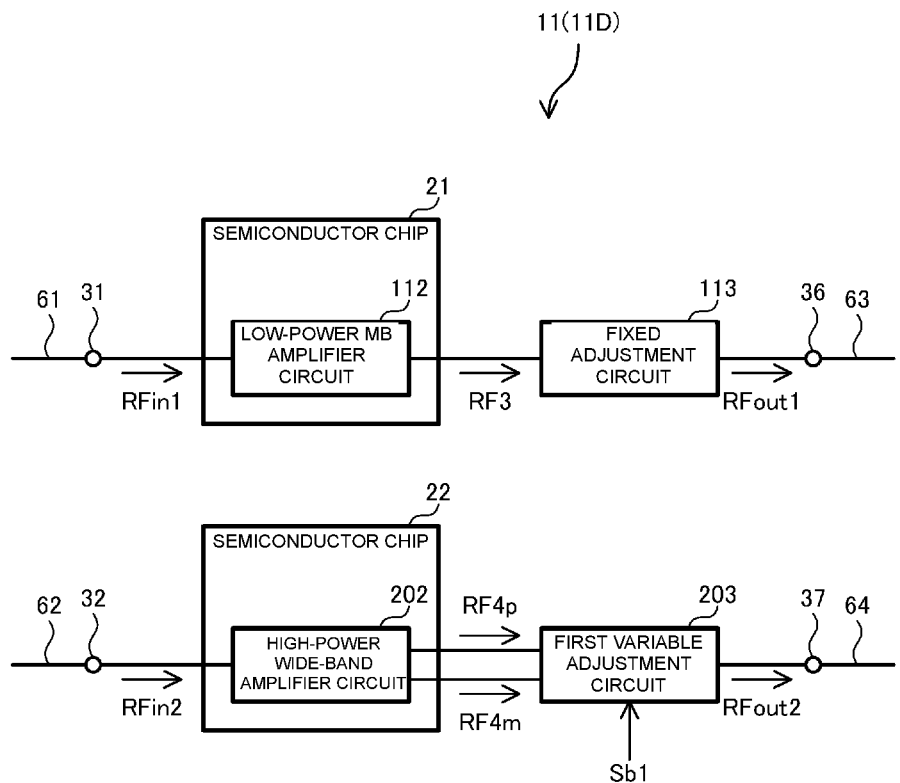
FIG. 16 is a diagram illustrating a configuration of a third modification of the power amplifier circuit according to the first embodiment of the present disclosure.

A third modification of the power amplifier circuit 11 according to the first embodiment will be described. FIG. 16 is a diagram illustrating a configuration of a third modification of the power amplifier circuit 11 according to the first embodiment of the present disclosure. As illustrated in FIG. 16, the third modification of the power amplifier circuit 11 according to the first embodiment (hereinafter referred to sometimes as the power amplifier circuit 11D) is different from the basic example of the power amplifier circuit 11, or the power amplifier circuit 11A, illustrated in FIG. 4 in that an amplifier circuit configured to amplify an input signal belonging to the mid band amplifies the input signal using a single method.

In this modification, the power amplifier circuit 11D includes a low-power MB amplifier circuit 112, a fixed adjustment circuit 113, a high-power wide-band amplifier circuit 202, and a first variable adjustment circuit 203. The low-power MB amplifier circuit 112 and the high-power wide-band amplifier circuit 202 are formed in or on semiconductor chips 21 and 22, respectively.

In this manner, the high-power wide-band amplifier circuit 202 includes the power-stage differential amplifier circuit 43 that facilitates a combination of powers. With this configuration, the input signal RFin2 can be amplified to a level that allows the input signal RFin2 to be transmitted with the transmission power defined in PC 2.

In the foregoing description, the low-power MB amplifier circuit 112 and the high-power wide-band amplifier circuit 202 are formed in or on the semiconductor chips 21 and 22, respectively. Alternatively, the low-power MB amplifier circuit 112 and the high-power wide-band amplifier circuit 202 may be formed in or on a single semiconductor chip.

In the transmitting apparatus 1 according to the first embodiment, the first frequency band is the mid band, although this is not required. The first frequency band may be any other band such as the low band less than or equal to 1000 MHz, the low mid band around 1500 MHZ, or the ultra-high band ranging from 3000 MHz to 5000 MHZ.

In the transmitting apparatus 1 according to the first embodiment, the second frequency band is the high band, although this is not required. The second frequency band may be any other band such as the low band, the low mid band, or the ultra-high band.

Issues and Effects

Figure 17:
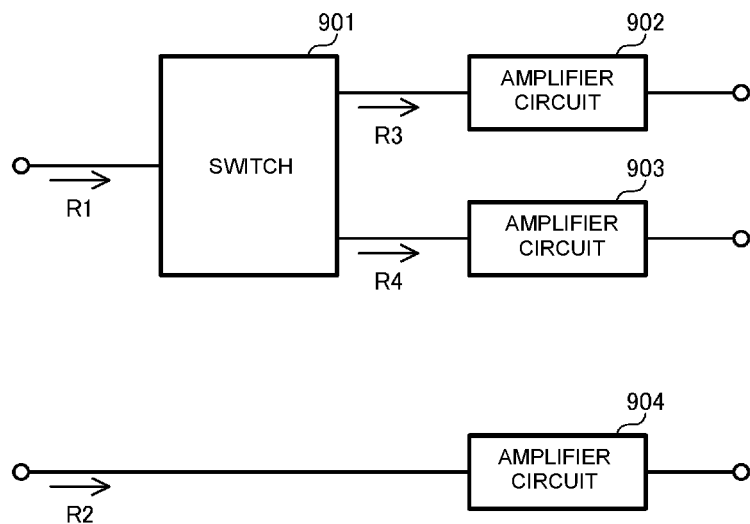
FIG. 17 is a diagram illustrating an example of a power amplifier circuit according to a reference example.

FIG. 17 illustrates an example of a power amplifier circuit according to a reference example. As illustrated in FIG. 17, a power amplifier circuit according to a reference example includes, for example, a switch 901 and amplifier circuits 902, 903, and 904.

For example, in response to receipt of an input signal R1 belonging to the mid band, when the input signal R1 is a signal (hereinafter referred to sometimes as the input signal R3) to be transmitted with the transmission power defined in PC 3, the switch 901 outputs the input signal R3 to the amplifier circuit 902. For example, when the input signal R1 is a signal (hereinafter referred to sometimes as the input signal R4) to be transmitted with the transmission power defined in PC 2, the switch 901 outputs the input signal R4 to the amplifier circuit 903.

In response to receipt of the input signal R3 from the switch 901, the amplifier circuit 902 amplifies the input signal R3 to a level that allows the input signal R3 to be transmitted with the transmission power defined in PC 3. In response to receipt of the input signal R4 from the switch 901, the amplifier circuit 903 amplifies the input signal R4 to a level that allows the input signal R4 to be transmitted with the transmission power defined in PC 2. For example, in response to receipt of an input signal R2 that is a signal to be transmitted with the transmission power defined in PC 2 and belongs to the high band, the amplifier circuit 904 amplifies the input signal R2 to a level that allows the input signal R2 to be transmitted with the transmission power defined in PC 2.

Figure 18:
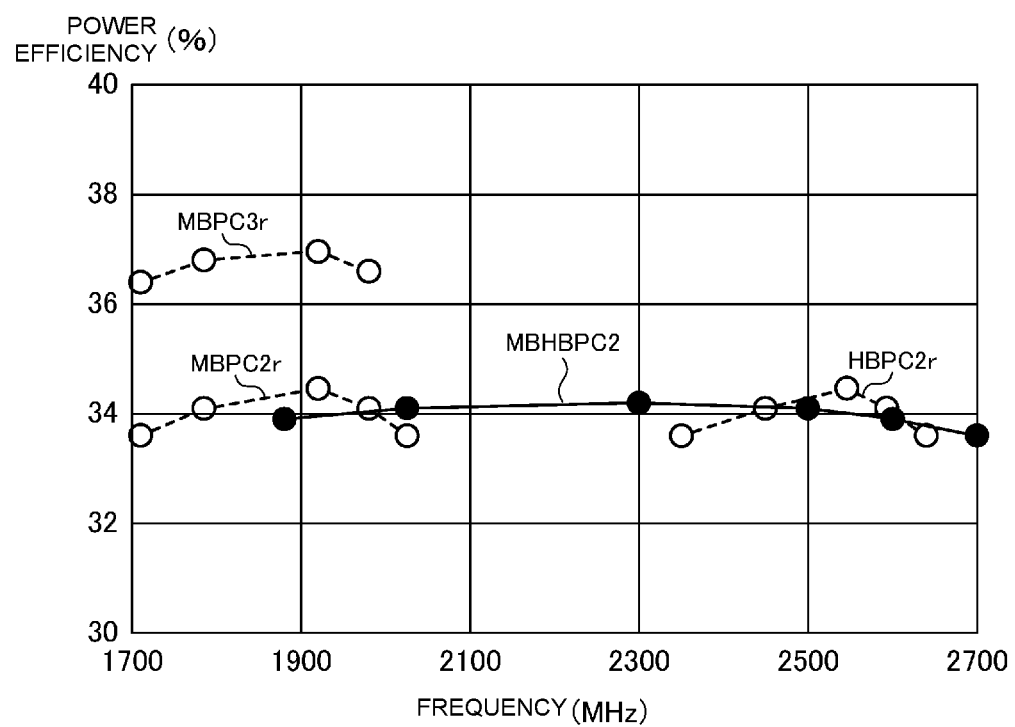
FIG. 18 is a diagram illustrating an example change in power efficiency with respect to the frequency of an input signal in the power amplifier circuit according to the first embodiment of the present disclosure.

FIG. 18 illustrates an example change in power efficiency with respect to the frequency of an input signal in the power amplifier circuit 11 according to the first embodiment of the present disclosure. In FIG. 18, the vertical axis represents power efficiency expressed in "%", and the horizontal axis represents frequency expressed in "MHz". The power efficiency is the ratio of, for example, output power of an amplifier to power supplied to the amplifier from a power supply and is expressed in percent. High power efficiency of the amplifier indicates that the power consumed by the amplifier is low.

As illustrated in FIGS. 17 and 18, efficiency curves MBPC3r, MBPC2r, and HBPC2r indicate changes in the power efficiency of the amplifier circuits 902, 903, and 904 with respect to frequency, respectively. Each of the amplifier circuits 902, 903, and 904 efficiently operates in a narrow frequency band. In the power amplifier circuit according to the reference example, accordingly, the input signals R3, R4, and R2 are amplified by the amplifier circuits 902, 903, and 904, respectively. Such a configuration including three amplifier circuits leads to an increase in circuit size, which is not desirable.

Examples of a configuration for amplifying the input signals R3, R4, and R2 using two amplifier circuits include a configuration for amplifying the input signal R2 using the amplifier circuit 904 and amplifying the input signals R3 and R4 using a single amplifier circuit. In a typical amplifier circuit, however, if the load impedance is set so that high power efficiency is obtained when a signal is transmitted with the transmission power defined in PC 3, low power efficiency is obtained when a signal is transmitted with the transmission power defined in PC 2. In contrast, if the load impedance is set so that high power efficiency is obtained when a signal is transmitted with the transmission power defined in PC 2, low power efficiency is obtained when a signal is transmitted with the transmission power defined in PC 3. For this reason, for example, if the load impedance is set so that the input signal R4 can be amplified to a level that allows the input signal R4 to be transmitted with the transmission power defined in PC 2, low power efficiency may be obtained when the input signal R3 is amplified, which is not desirable.

To address this issue, in the power amplifier circuit 11, the low-power MB amplifier circuit 102 amplifies the input signal RFin1 belonging to the mid band to a level that allows the input signal RFin1 to be transmitted with the transmission power defined in PC 3. The high-power wide-band amplifier circuit 202 amplifies the input signal RFin2 belonging to the mid band or the high band to a level that allows the input signal RFin2 to be transmitted with the transmission power defined in PC 2. The first variable adjustment circuit 203 is disposed between the high-power wide-band amplifier circuit 202 and the transmission line 64 and is configured to be capable of adjusting a first impedance of the transmission line 64 seen from the high-power wide-band amplifier circuit 202.

An efficiency curve MBHBPC2 illustrated in FIG. 18 indicates, for example, a change in the power efficiency of the high-power wide-band amplifier circuit 202 with respect to frequency. In the power amplifier circuit 11, for example, for the high-power wide-band amplifier circuit 202, the load impedance is set so that high power efficiency is obtained when a signal is transmitted with the transmission power defined in PC 2. The high-power wide-band amplifier circuit 202 is used in combination with the first variable adjustment circuit 203 to increase the frequency range over which the high-power wide-band amplifier circuit 202 efficiently operates from the mid band to the high band. This configuration can implement substantially the same power efficiency as that of the efficiency curves MBPC2r and HBPC2r.

Second Embodiment

A transmitting apparatus according to a second embodiment will be described. In the second and subsequent embodiments, features common to the first embodiment will not be described, and only differences will be described. In particular, similar operations and effects achieved with similar configurations will not be described again in the individual embodiments.

The transmitting apparatus 1 according to the first embodiment is configured such that an RF signal belonging to the high band is transmitted with the transmission power defined in PC 2. A transmitting apparatus 1 according to the second embodiment is different from the transmitting apparatus 1 according to the first embodiment in that an RF signal belonging to the high band is transmitted with the transmission power defined in PC 2 or PC 3.

Figure 20:
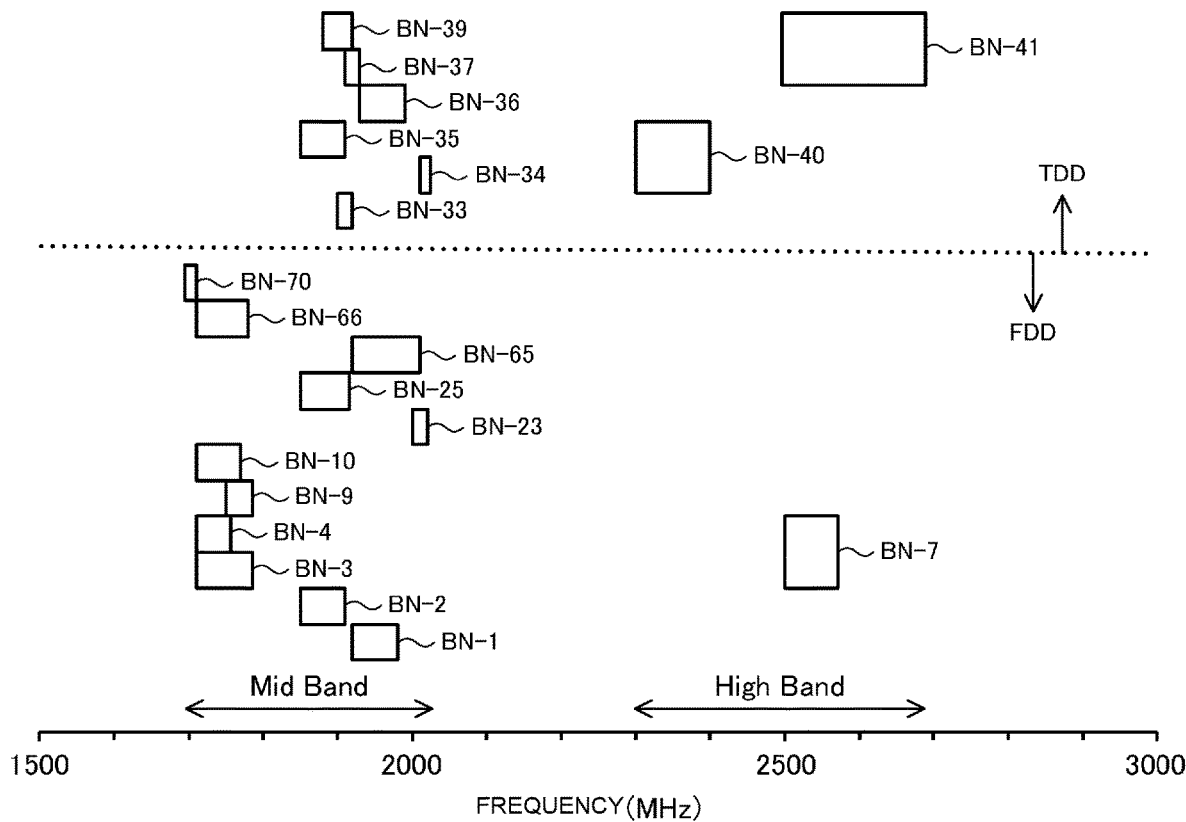
FIG. 20 is a diagram schematically illustrating the band configuration illustrated in FIG. 19.

FIG. 19 illustrates an example band configuration of RF signals to be transmitted from the transmitting apparatus 1 according to the second embodiment of the present disclosure. FIG. 20 schematically illustrates the band configuration illustrated in FIG. 19. FIGS. 19 and 20 are referred to in a way similar to that of FIGS. 2 and 3, respectively.

In the band configuration illustrated in FIG. 19, a band with band number 7 ranging from 2500 MHz to 2570 MHz is added to the high band in the band configuration illustrated in FIG. 2. Accordingly, FIG. 20 additionally illustrates band BN-7, unlike the schematic diagram of the band configuration illustrated in FIG. 3. The band with band number 7 is used for FDD communication.

As illustrated in FIGS. 1, 19, and 20, in the transmitting apparatus 1 according to the second embodiment, the RF signal generation circuit 16 generates a first signal belonging to the first frequency band or the second frequency and a second signal belonging to the first frequency band or the second frequency band.

In this embodiment, the RF signal generation circuit 16 generates an input signal RFin3 (first signal) belonging to the mid band (first frequency band) or the high band (second frequency band) and an input signal RFin2 (second signal) belonging to the mid band or the high band.

Specifically, the RF signal generation circuit 16 modulates a transmission signal in accordance with a control signal received from the control unit of the mobile communication device and generates the input signals RFin3 and RFin2 to be used for wireless transmission. The RF signal generation circuit 16 supplies the generated input signals RFin3 and RFin2 to the transmission lines 61 and 62, respectively.

Further, the RF signal generation circuit 16 outputs band information to a power amplifier circuit 12. The band information indicates an item relating to the frequencies of the generated input signals RFin3 and RFin2.

In this embodiment, the RF signal generation circuit 16 outputs, for example, band signals Sb1 and Sb2 to the power amplifier circuit 12 as band information. For example, the band signal Sb2 is set to a high level when the input signal RFin3 belongs to the high band, and is set to a low level when the input signal RFin3 belongs to the mid band.

The RF signal generation circuit 16 may not necessarily be configured to output the band signal Sb2 indicating two values, namely, the high level and the low level, to the power amplifier circuit 12. Alternatively, the RF signal generation circuit 16 may be configured to output the band signal Sb2 indicating three or more values to the power amplifier circuit 12. The RF signal generation circuit 16 may output frequency information indicating the frequency of the input signal RFin3 to the power amplifier circuit 12 as band information.

Figure 21:
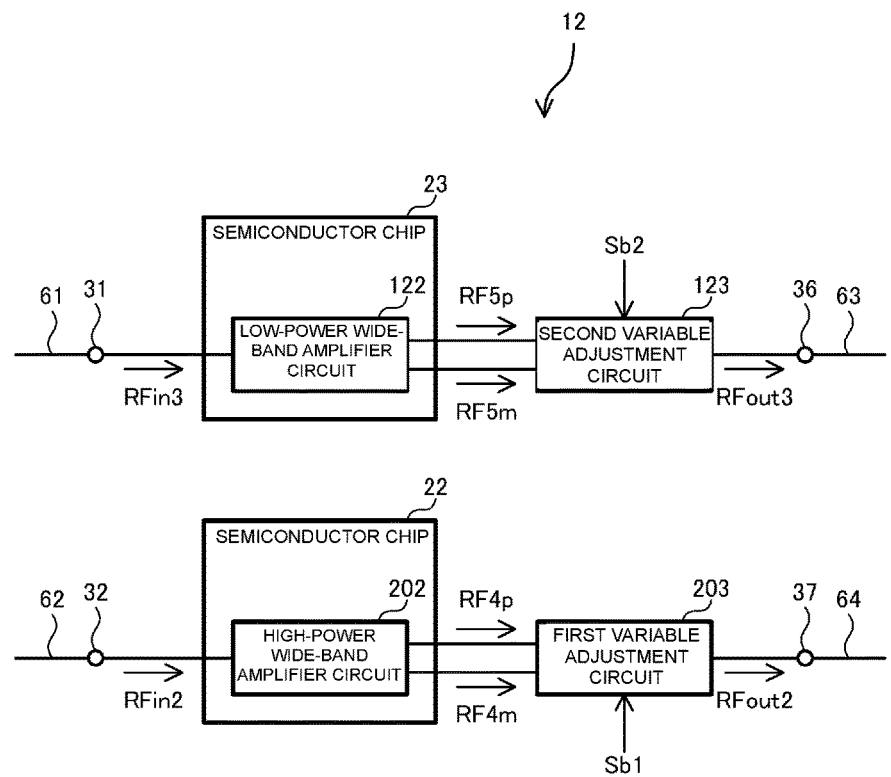
FIG. 21 is a diagram illustrating a configuration of a power amplifier circuit according to the second embodiment of the present disclosure.

The power amplifier circuit 1 according to the second embodiment will be described. FIG. 21 illustrates a configuration of the power amplifier circuit 12 according to the second embodiment of the present disclosure. As illustrated in FIG. 21, unlike the power amplifier circuit 11 according to the first embodiment (see FIG. 4), the power amplifier circuit 12 according to the second embodiment includes a low-power wide-band amplifier circuit 122 and a second variable adjustment circuit 123 in place of the low-power MB amplifier circuit 102 and the fixed adjustment circuit 103, respectively.

An RF signal input terminal 31 is supplied with the input signal RFin3 through the transmission line 61. The low-power wide-band amplifier circuit 122 is formed in or on a semiconductor chip 23.

The low-power wide-band amplifier circuit 122 amplifies the input signal RFin3 supplied through the RF signal input terminal 31 and generates the amplified signals RF5$p$ and RF5$m$ (first amplified signal) having a first power smaller than the second power. In this embodiment, the low-power wide-band amplifier circuit 122 is a circuit configured to amplify the input signal RFin3 to a level that allows the input signal RFin3 to be transmitted with the transmission power defined in PC 3, and is designed to amplify a signal belonging to the mid band or the high band. The low-power wide-band amplifier circuit 122 outputs the generated amplified signals RF5$p$ and RF5$m$ to the second variable adjustment circuit 123.

The low-power wide-band amplifier circuit 122 has a circuit configuration similar to, for example, that of the low-power MB amplifier circuit 102 and the high-power wide-band amplifier circuit 202, and includes the driver-stage single amplifier circuit 41, the inter-stage matching circuit 42, and the power-stage differential amplifier circuit 43 (see FIG. 5).

The second variable adjustment circuit 123 is disposed between the low-power wide-band amplifier circuit 122 and the subsequent circuit (second circuit) of the low-power wide-band amplifier circuit 122. In this embodiment, the subsequent circuit of the low-power wide-band amplifier circuit 122 is, for example, the transmission line 63. The second variable adjustment circuit 123 is configured to be capable of adjusting a second impedance of the transmission line 63 seen from the low-power wide-band amplifier circuit 122.

The second variable adjustment circuit 123 has a circuit configuration similar to, for example, that of the first variable adjustment circuit 203A, and includes the wide-band matching circuit 301 configured to be capable of adjusting the second impedance for the frequencies of the fundamentals of the amplified signals RF5$p$ and RF5$m$, and the termination circuit 402 (see FIG. 6).

The second variable adjustment circuit 123 may include the matching circuit 302 and the wide-band termination circuit 401 configured to be capable of adjusting the second impedance for the frequencies of harmonics of the amplified signals RF5$p$ and RF5$m$ (see FIG. 7). Alternatively, the second variable adjustment circuit 123 may include the wide-band matching circuit 301 (see FIG. 6) and the wide-band termination circuit 401 (see FIG. 7).

In the foregoing description, in the power amplifier circuit 12 according to the second embodiment, the low-power wide-band amplifier circuit 122 includes the driver-stage single amplifier circuit 41, the inter-stage matching circuit 42, and the power-stage differential amplifier circuit 43 (see FIG. 5), although this is not required. The low-power wide-band amplifier circuit 122 may include, for example, the driver-stage single amplifier circuit 41, the inter-stage matching circuit 44, and the power-stage single amplifier circuit 45 (see FIG. 12).

In this case, the second variable adjustment circuit 123 includes, for example, the wide-band matching circuit 306 and the termination circuit 407 (see FIG. 13). The second variable adjustment circuit 123 may include the matching circuit 307 and the wide-band termination circuit 406 (see FIG. 14), or may include the wide-band matching circuit 306 (see FIG. 13) and the wide-band termination circuit 406 (see FIG. 14).

In the foregoing description, the low-power wide-band amplifier circuit 122 and the high-power wide-band amplifier circuit 202 are formed in or on the semiconductor chips 23 and 22, respectively. Alternatively, the low-power wide-band amplifier circuit 122 and the high-power wide-band amplifier circuit 202 may be formed in or on a single semiconductor chip.

Third Embodiment

A transmitting apparatus according to a third embodiment will be described.

The transmitting apparatus 1 according to the first embodiment is configured such that an RF signal belonging to the high band is transmitted with the transmission power defined in PC 2 and an RF signal belonging to the mid band is transmitted with the transmission power defined in PC 2 or PC 3. A transmitting apparatus 1 according to the third embodiment is different from the transmitting apparatus 1 according to the first embodiment in that an RF signal belonging to the high band is transmitted with the transmission power defined in PC 2 or PC 3 and an RF signal belonging to the mid band is transmitted with the transmission power defined in PC 3.

As illustrated in FIG. 1, in the transmitting apparatus 1 according to the third embodiment, the RF signal generation circuit 16 generates a first signal belonging to the first frequency band and a second signal belonging to the first frequency band or the second frequency band.

In this embodiment, the RF signal generation circuit 16 generates an input signal RFin3 (second signal) belonging to the mid band (second frequency band) or the high band (first frequency band) and an input signal RFin4 (first signal) belonging to the high band.

Specifically, the RF signal generation circuit 16 modulates a transmission signal in accordance with a control signal received from the control unit of the mobile communication device and generates the input signals RFin3 and RFin4 to be used for wireless transmission. The RF signal generation circuit 16 supplies the generated input signals RFin3 and RFin4 to the transmission lines 61 and 62, respectively.

Further, the RF signal generation circuit 16 outputs band information to a power amplifier circuit 13. The band information indicates an item relating to the frequency of the generated input signal RFin3. In this embodiment, the RF signal generation circuit 16 outputs, for example, a band signal Sb2 to the power amplifier circuit 13 as band information.

Figure 22:
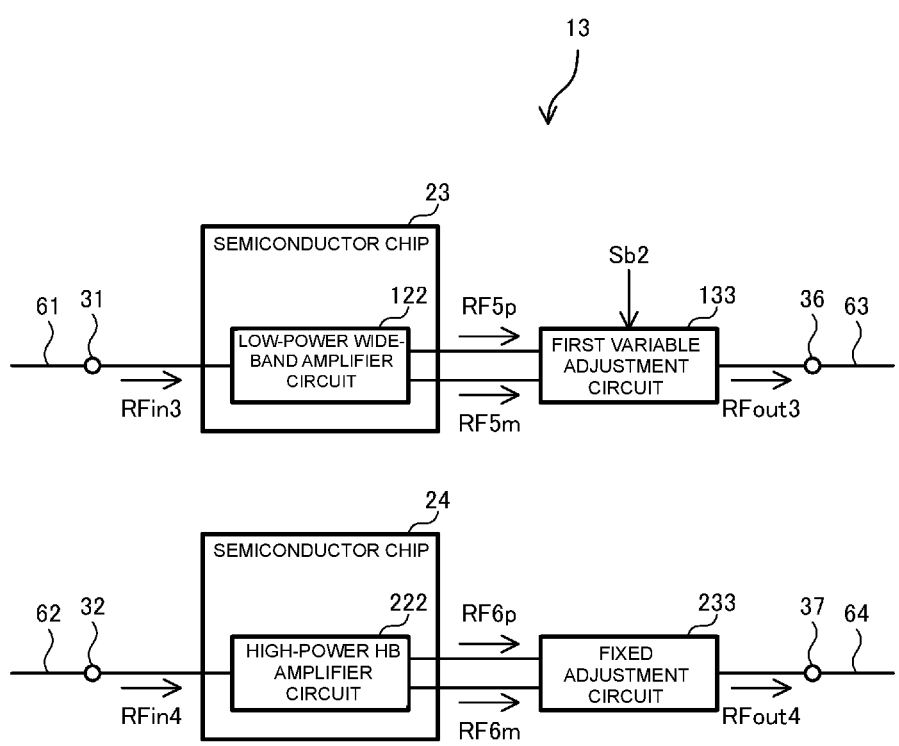
FIG. 22 is a diagram illustrating a configuration of a power amplifier circuit according to a third embodiment of the present disclosure.

The power amplifier circuit 1 according to the third embodiment will be described. FIG. 22 illustrates a configuration of the power amplifier circuit 13 according to the third embodiment of the present disclosure. As illustrated in FIG. 22, unlike the power amplifier circuit 12 according to the second embodiment (see FIG. 21), the power amplifier circuit 13 according to the third embodiment includes a first variable adjustment circuit 133, a high-power high-band (HB) amplifier circuit 222, and a fixed adjustment circuit 233 in place of the second variable adjustment circuit 123, the high-power wide-band amplifier circuit 202, and the first variable adjustment circuit 203, respectively. The first variable adjustment circuit 133 has a circuit configuration similar to, for example, that of the second variable adjustment circuit 123 (see FIG. 21).

An RF signal input terminal 32 is supplied with the input signal RFin4 through the transmission line 62. The high-power HB amplifier circuit 222 is formed in or on a semiconductor chip 24.

The low-power wide-band amplifier circuit 122 amplifies the input signal RFin3 supplied through the RF signal input terminal 31 and generates the amplified signals RF5$p$ and RF5$m$ (second amplified signal) having a second power. In this embodiment, the low-power wide-band amplifier circuit 122 is a circuit configured to amplify the input signal RFin3 to a level that allows the input signal RFin3 to be transmitted with the transmission power defined in PC 3, and is designed to amplify a signal belonging to the mid band or the high band. The low-power wide-band amplifier circuit 122 outputs the generated amplified signals RF5$p$ and RF5$m$ to the first variable adjustment circuit 133.

The high-power HB amplifier circuit 222 amplifies the input signal RFin4 supplied through the RF signal input terminal 32 and generates the amplified signals RF6$p$ and RF6$m$ (first amplified signal) having a first power larger than the second power. In this embodiment, the high-power HB amplifier circuit 222 is a circuit configured to amplify the input signal RFin4 to a level that allows the input signal RFin4 to be transmitted with the transmission power defined in PC 2, and is designed to amplify a signal belonging to the high band. The high-power HB amplifier circuit 222 outputs the generated amplified signals RF6$p$ and RF6$m$ to the fixed adjustment circuit 233.

The high-power HB amplifier circuit 222 has a circuit configuration similar to, for example, that of the low-power MB amplifier circuit 102 and the high-power wide-band amplifier circuit 202, and includes the driver-stage single amplifier circuit 41, the inter-stage matching circuit 42, and the power-stage differential amplifier circuit 43 (see FIG. 5). The fixed adjustment circuit 233 has a circuit configuration similar to, for example, that of the fixed adjustment circuit 103, and includes the matching circuit 302 and the termination circuit 402 (see FIG. 8).

The high-power HB amplifier circuit 222 may include the driver-stage single amplifier circuit 41, the inter-stage matching circuit 44, and the power-stage single amplifier circuit 45 (see FIG. 12). In this case, the fixed adjustment circuit 233 includes the matching circuit 307 and the termination circuit 407 (see FIG. 15).

In the foregoing description, the low-power wide-band amplifier circuit 122 and the high-power HB amplifier circuit 222 are formed in or on the semiconductor chips 23 and 24. Alternatively, the low-power wide-band amplifier circuit 122 and the high-power HB amplifier circuit 222 may be formed in or on a single semiconductor chip.

Fourth Embodiment

A transmitting and receiving unit according to a fourth embodiment will be described. The transmitting and receiving unit according to the fourth embodiment is configured to be capable of switching a path for an RF signal, unlike the transmitting apparatus 1 according to the first embodiment.

Figure 23:
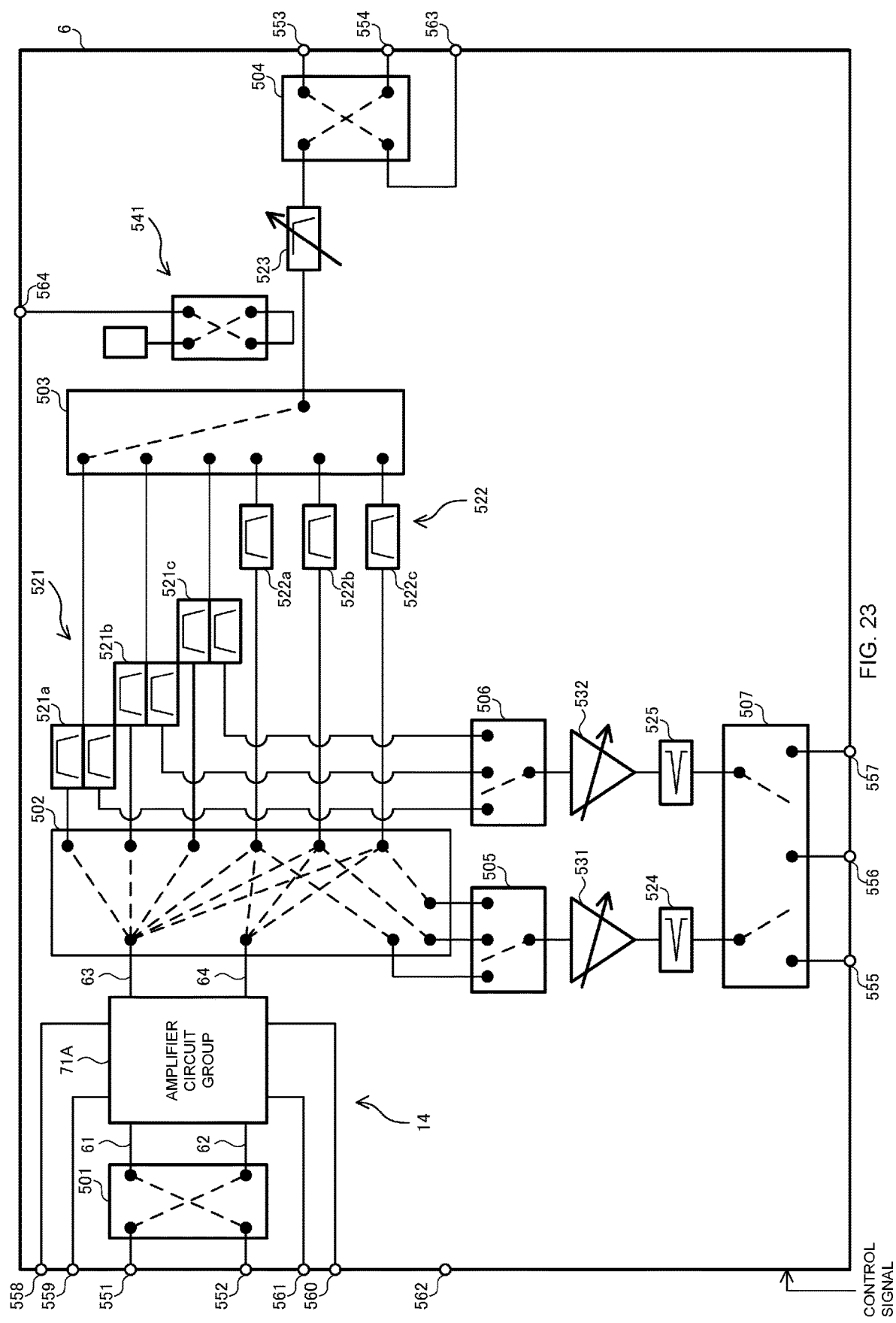
FIG. 23 is a diagram illustrating a configuration of a transmitting and receiving unit according to a fourth embodiment of the present disclosure.

FIG. 23 illustrates a configuration of a transmitting and receiving unit 6 according to the fourth embodiment of the present disclosure. As illustrated in FIG. 23, the transmitting and receiving unit 6 according to the fourth embodiment includes a power amplifier circuit 14, switches 503, 504, 505, 506, and 507, an FDD filter circuit group 521 (third circuit and sixth circuit), a TDD filter circuit group 522 (fourth circuit and fifth circuit), filter circuits 523, 524, and 525, low-noise amplifiers 531 and 532, and a coupler circuit 541.

The power amplifier circuit 14 includes an amplifier circuit group 71A, an input distribution switch 501 (third switching unit and fourth switching unit), and an output distribution switch 502 (first switching unit). The amplifier circuit group 71A has a circuit configuration similar to that of the power amplifier circuit 11A (see FIG. 4). The subsequent circuit of the power amplifier circuit 14 corresponds to, for example, a front-end section.

RF signal input terminals 551 and 552 are supplied with the input signals RFin1 and RFin2 from the RF signal generation circuit 16, respectively.

A power supply terminal 558 is supplied with, for example, a power supply voltage for the amplifiers 43$a$ and 43$b$ in the low-power MB amplifier circuit 102 (first amplifier circuit) of the amplifier circuit group 71A (see FIG. 5). A power supply terminal 559 is supplied with, for example, a power supply voltage for the amplifier 41$b$ in the low-power MB amplifier circuit 102 of the amplifier circuit group 71A (see FIG. 5).

A power supply terminal 560 is supplied with, for example, a power supply voltage for the amplifiers 43$a$ and 43$b$ in the high-power wide-band amplifier circuit 202 (second amplifier circuit) of the amplifier circuit group 71A (see FIG. 5). A power supply terminal 561 is supplied with, for example, a power supply voltage for the amplifier 41$b$ in the high-power wide-band amplifier circuit 202 of the amplifier circuit group 71A (see FIG. 5). A battery connection terminal 562 is supplied with a battery voltage.

The input distribution switch 501 has a first end configured to be supplied with the input signal RFin2, a second end connected to the high-power wide-band amplifier circuit 202, a third end connected to the low-power MB amplifier circuit 102, and a fourth end configured to be supplied with the input signal RFin1.

In this embodiment, the fourth and first ends of the input distribution switch 501 are connected to the RF signal input terminals 551 and 552, respectively. The second end of the input distribution switch 501 is connected to the RF signal input terminal 32 (see FIG. 4) of the amplifier circuit group 71A through the transmission line 62. The third end of the input distribution switch 501 is connected to the RF signal input terminal 31 (see FIG. 4) of the amplifier circuit group 71A through the transmission line 61.

The input distribution switch 501 is configured to be capable of connecting the first end to any one of the second and third ends and connecting the fourth end to any one of the second and third ends.

In this embodiment, for example, the input distribution switch 501 electrically connects the fourth and third ends to each other and electrically connects the first and second ends to each other in accordance with a control signal outputted from the control unit of the mobile communication device. For example, the input distribution switch 501 electrically connects the fourth and second ends to each other and electrically connects the first and third ends to each other in accordance with the control signal.

The FDD filter circuit group 521 includes FDD filter circuits 521a, 521b, and 521c and is disposed subsequent to the low-power MB amplifier circuit 102 and the fixed adjustment circuit 103 (see FIG. 4) in the amplifier circuit group 71A. Each of the FDD filter circuits 521a, 521b, and 521c is hereinafter sometimes referred to simply as an FDD filter circuit.

Each FDD filter circuit is, for example, a band pass filter disposed so as to correspond to the band number of a band to be used for FDD communication and having an attenuation characteristic corresponding to the band number.

Each FDD filter circuit has a first end configured to be supplied with an RF signal during transmission, a second end configured to output an RF signal during reception, and a third end configured to output an RF signal during transmission and configured to be supplied with an RF signal during reception.

Specifically, for example, the FDD filter circuit 521a is disposed so as to correspond to band number 25. In this case, the FDD filter circuit 521a transmits an RF signal included in the frequency band ranging from 1850 MHz to 1915 MHz and attenuates an RF signal of frequency components out of the frequency band (see FIG. 2).

The TDD filter circuit group 522 includes TDD filter circuits 522a, 522b, and 522c and is disposed subsequent to the high-power wide-band amplifier circuit 202 and the first variable adjustment circuit 203 (see FIG. 4) in the amplifier circuit group 71A. Each of the TDD filter circuits 522a, 522b, and 522c is hereinafter sometimes referred to simply as a TDD filter circuit.

Each TDD filter circuit is, for example, a band pass filter disposed so as to correspond to the band number of a band to be used for TDD communication and having an attenuation characteristic corresponding to the band number.

Each TDD filter circuit has a first end configured to be supplied with an RF signal during transmission and configured to output an RF signal during reception, and a second end configured to output an RF signal during transmission and configured to be supplied with an RF signal during reception.

Specifically, for example, the TDD filter circuit 522a is disposed so as to correspond to band number 40. In this case, the TDD filter circuit 522a transmits an RF signal included in the frequency band ranging from 2300 MHz to 2400 MHz and attenuates an RF signal of frequency components out of the frequency band (see FIG. 2).

The output distribution switch 502 is disposed between the amplifier circuit group 71A and filter circuit groups including the FDD filter circuit group 521 and the TDD filter circuit group 522. The output distribution switch 502 is configured to be capable of connecting the low-power MB amplifier circuit 102 and the fixed adjustment circuit 103 (see FIG. 4) in the amplifier circuit group 71A to any one of filter circuits including the FDD filter circuits 521a, 521b, and 521c and the TDD filter circuits 522a, 522b, and 522c.

In this embodiment, the output distribution switch 502 has a first end connected to the fixed adjustment circuit 103 through the transmission line 63, a second end connected to the first variable adjustment circuit 203 through the transmission line 64, a third end, a fourth end, a fifth end, a sixth end connected to the first end of the TDD filter circuit 522c, a seventh end connected to the first end of the TDD filter circuit 522b, an eighth end connected to the first end of the TDD filter circuit 522a, a ninth end connected to the first end of the FDD filter circuit 521c, a tenth end connected to the first end of the FDD filter circuit 521b, and an eleventh end connected to the first end of the FDD filter circuit 521a.

In this embodiment, for example, the output distribution switch 502 electrically connects the first end and any one of the terminals including the sixth to eleventh ends to each other in accordance with a control signal outputted from the control unit of the mobile communication device.

Further, the output distribution switch 502 electrically connects the eighth end and any one of the second and third ends to each other in accordance with the control signal. Further, the output distribution switch 502 electrically connects the seventh end and any one of the second and fourth ends to each other in accordance with the control signal. Further, the output distribution switch 502 electrically connects the sixth end and any one of the second and fifth ends to each other in accordance with the control signal.

The switch 503 is configured to be capable of connecting any one of the filter circuits including the FDD filter circuits 521a, 521b, and 521c and the TDD filter circuits 522a, 522b, and 522c to the filter circuit 523. The filter circuit 523 is a low pass filter having a variable cutoff frequency, and has a first end and a second end.

In this embodiment, the switch 503 has a first end connected to the third end of the FDD filter circuit 521a, a second end connected to the third end of the FDD filter circuit 521b, a third end connected to the third end of the FDD filter circuit 521c, a fourth end connected to the second end of the TDD filter circuit 522a, a fifth end connected to the second end of the TDD filter circuit 522b, a sixth end connected to the second end of the TDD filter circuit 522c, and a seventh end connected to the first end of the filter circuit 523.

For example, the switch 503 electrically connects any one of the terminals including the first to sixth ends and the seventh end to each other in accordance with a control signal outputted from the control unit of the mobile communication device.

The switch 504 is configured to be capable of connecting the filter circuit 523 to any one of an RF signal output terminal 553 connected to a first antenna and an RF signal output terminal 554 connected to a second antenna.

In this embodiment, the switch 504 has a first end connected to the second end of the filter circuit 523, a second end connected to a sub-output terminal 563 for discontinuous reception (DRX) control, a third end connected to the RF signal output terminal 554, and a fourth end connected to the RF signal output terminal 553.

For example, the switch 504 electrically connects the first end and any one of the third and fourth ends to each other in accordance with a control signal outputted from the control unit of the mobile communication device. For example, the switch 504 electrically connects the second end and any one of the third and fourth ends to each other in accordance with the control signal.

The coupler circuit 541 includes a switch and so on and is electromagnetically coupled to a signal line connecting the switch 503 and the filter circuit 523 to each other to supply a portion of the RF signal sent through the signal line to a coupler output terminal 564.

The switch 505 is configured to be capable of connecting any one of the TDD filter circuits 522a, 522b, and 522c to the low-noise amplifier 531.

In this embodiment, the switch 505 has a first end connected to the low-noise amplifier 531, a second end connected to the fifth end of the output distribution switch 502, a third end connected to the fourth end of the output distribution switch 502, and a fourth end connected to the third end of the output distribution switch 502.

For example, the switch 505 electrically connects the first end and any one of the second, third, and fourth ends to each other in accordance with a control signal outputted from the control unit of the mobile communication device.

The low-noise amplifier 531 is an amplifier whose gain is variable in accordance with a control signal outputted from the control unit of the mobile communication device, and amplifies an RF signal received via TDD communication. In this embodiment, the low-noise amplifier 531 has an input terminal connected to the first end of the switch 505 and configured to be supplied with an RF signal, and an output terminal configured to output an amplified RF signal.

The switch 506 is configured to be capable of connecting any one of the FDD filter circuits 521a, 521b, and 521c to the low-noise amplifier 532.

In this embodiment, the switch 506 has a first end connected to the low-noise amplifier 532, a second end connected to the second end of the FDD filter circuit 521c, a third end connected to the second end of the FDD filter circuit 521b, and a fourth end connected to the second end of the FDD filter circuit 521a.

For example, the switch 506 electrically connects the first end and any one of the second, third, and fourth ends to each other in accordance with a control signal outputted from the control unit of the mobile communication device.

The low-noise amplifier 532 is an amplifier whose gain is variable in accordance with a control signal outputted from the control unit of the mobile communication device, and amplifies an RF signal received via FDD communication. In this embodiment, the low-noise amplifier 532 has an input terminal connected to the first end of the switch 506 and configured to be supplied with an RF signal, and an output terminal configured to output an amplified RF signal.

The switch 507 is configured to be capable of connecting any one of the low-noise amplifiers 531 and 532 to any one of RF signal output terminals 555, 556, and 557.

In this embodiment, the switch 507 has a first end connected to the output terminal of the low-noise amplifier 532 through the filter circuit 525, a second end connected to the output terminal of the low-noise amplifier 531 through the filter circuit 524, a third end connected to the RF signal output terminal 555, a fourth end connected to the RF signal output terminal 556, and a fifth end connected to the RF signal output terminal 557.

For example, the switch 507 electrically connects the first end and any one of the third, fourth, and fifth ends to each other and electrically connects the second end and any one of the third, fourth, and fifth ends to each other in accordance with a control signal outputted from the control unit of the mobile communication device.

Connection Mode of Switches During FDD Communication

The input distribution switch 501, the output distribution switch 502, and the switches 503, 505, and 506 operate in association with each other.

In this embodiment, FDD communication and TDD communication are not performed simultaneously. When FDD communication is performed, only the input signal RFin1 is outputted from the RF signal generation circuit 16 and is supplied to the RF signal input terminal 551.

In FDD communication, for example, the transmission power defined in PC 3 is the upper limit of transmission power for RF signals. Thus, the input distribution switch 501 electrically connects the fourth and third ends thereof to each other. The output distribution switch 502 electrically connects the first end thereof to a terminal corresponding to the band number of a band to be used for FDD communication among the ninth, tenth, and eleventh ends thereof.

Specifically, for example, when the band with band number 25 is used for FDD communication, the output distribution switch 502 electrically connects the first and eleventh ends thereof to each other. The switch 503 electrically connects the first and seventh ends thereof to each other. For example, the switch 504 electrically connects the first and fourth ends thereof to each other. The switch 506 electrically connects the first and fourth ends thereof to each other.

Accordingly, the input signal RFin1 belonging to the band with band number 25 is supplied to the low-power MB amplifier circuit 102 (see FIG. 4) in the amplifier circuit group 71A through the RF signal input terminal 551 and the input distribution switch 501 and is amplified by the low-power MB amplifier circuit 102. The RF signal amplified by the low-power MB amplifier circuit 102 is supplied to the RF signal output terminal 553 through the fixed adjustment circuit 103 (see FIG. 4), the output distribution switch 502, the FDD filter circuit 521a, the switch 503, the filter circuit 523, and the switch 504.

For example, an RF signal belonging to the band with band number 25, which is received by the first antenna, is supplied to the RF signal output terminal 555, 556, or 557 through the switch 504, the filter circuit 523, the switch 503, the FDD filter circuit 521a, the switch 506, the low-noise amplifier 532, the filter circuit 525, and the switch 507.

First Connection Mode of Switches During TDD Communication

When TDD communication is performed, only the input signal RFin2 is outputted from the RF signal generation circuit 16 and is supplied to the RF signal input terminal 552. In TDD communication, for example, the transmission power defined in PC 2 is the upper limit of transmission power for RF signals. Thus, the input distribution switch 501 electrically connects the first and second ends thereof to each other. In TDD communication, the RF signal transmission period and the RF signal reception period are separated from each other. Thus, in the RF signal transmission period, the output distribution switch 502 electrically connects the second end thereof to a terminal corresponding to the band number of a band to be used for TDD communication among the sixth, seventh, and eighth ends.

Specifically, for example, when the band with band number 40 is used for TDD communication, the output distribution switch 502 electrically connects the second and eighth ends thereof to each other. The switch 503 electrically connects the fourth and seventh ends thereof to each other. For example, the switch 504 electrically connects the first and fourth ends thereof to each other.

Accordingly, the input signal RFin2 belonging to the band with band number 40 is supplied to the high-power wide-band amplifier circuit 202 (see FIG. 4) in the amplifier circuit group 71A through the RF signal input terminal 552 and the input distribution switch 501 and is amplified by the high-power wide-band amplifier circuit 202. The RF signal amplified by the high-power wide-band amplifier circuit 202 is supplied to the RF signal output terminal 553 through the first variable adjustment circuit 203 (see FIG. 4), the output distribution switch 502, the TDD filter circuit 522a, the switch 503, the filter circuit 523, and the switch 504.

In the RF signal reception period, the output distribution switch 502 electrically isolates the second and eighth ends thereof from each other and electrically connects the third and eighth ends thereof to each other. The switch 505 electrically connects the first and fourth ends thereof to each other.

Accordingly, for example, an RF signal belonging to the band with band number 40, which is received by the first antenna, is supplied to the RF signal output terminal 555, 556, or 557 through the switch 504, the filter circuit 523, the switch 503, the TDD filter circuit 522*a*, the output distribution switch 502, the switch 505, the low-noise amplifier 531, the filter circuit 524, and the switch 507.

Second Connection Mode of Switches During TDD Communication

In TDD communication, the transmission power defined in PC 2 is the upper limit of transmission power for RF signals. Thus, an RF signal is amplified by the high-power wide-band amplifier circuit 202 (see FIG. 4) in the amplifier circuit group 71A. For example, in some cases, the distance between the mobile communication device and the base station is short, and the RF signal can be transmitted with the transmission power defined in PC 3. In TDD communication, the transmission power defined in PC 3 may be used as the upper limit of transmission power for RF signals.

In this case, the input distribution switch 501 electrically connects the first and third ends thereof to each other. In the RF signal transmission period, the output distribution switch 502 electrically connects the first end thereof to a terminal corresponding to the band number of a band to be used for TDD communication among the sixth, seventh, and eighth ends to each other.

Specifically, for example, when the band with band number 40 is used for TDD communication, the output distribution switch 502 electrically connects the first and eighth ends thereof to each other. The switch 503 electrically connects the fourth and seventh ends thereof to each other. For example, the switch 504 electrically connects the first and fourth ends thereof to each other.

Accordingly, the input signal RFin2 belonging to the band with band number 40 is supplied to the low-power MB amplifier circuit 102 (see FIG. 4) in the amplifier circuit group 71A through the RF signal input terminal 552 and the input distribution switch 501 and is amplified by the low-power MB amplifier circuit 102. The RF signal amplified by the low-power MB amplifier circuit 102 is supplied to the RF signal output terminal 553 through the fixed adjustment circuit 103 (see FIG. 4), the output distribution switch 502, the TDD filter circuit 522*a*, the switch 503, the filter circuit 523, and the switch 504.

In the RF signal reception period, the output distribution switch 502 electrically isolates the first and eighth ends thereof from each other and electrically connects the third and eighth ends thereof to each other. The switch 505 electrically connects the first and fourth ends thereof to each other.

Accordingly, for example, an RF signal belonging to the band with band number 40, which is received by the first antenna, is supplied to the RF signal output terminal 555, 556, or 557 through the switch 504, the filter circuit 523, the switch 503, the TDD filter circuit 522*a*, the output distribution switch 502, the switch 505, the low-noise amplifier 531, the filter circuit 524, and the switch 507.

The low-power MB amplifier circuit 102 (see FIG. 4) is configured to have high efficiency, for example, when an RF signal is amplified to a level that allows the RF signal to be transmitted with the transmission power defined in PC 3. The high-power wide-band amplifier circuit 202 (see FIG. 4) is configured to have high efficiency, for example, when an RF signal is amplified to a level that allows the RF signal to be transmitted with the transmission power defined in PC 2. Accordingly, the high-power wide-band amplifier circuit 202 has low power efficiency when an RF signal is amplified to a level that allows the RF signal to be transmitted with the transmission power defined in PC 3.

To address this issue, in the transmitting and receiving unit 6, the input distribution switch 501 switches the supply destination of the input signal RFin2 to any one of the low-power MB amplifier circuit 102 and the high-power wide-band amplifier circuit 202. Specifically, for example, the input signal RFin2 is supplied to the high-power wide-band amplifier circuit 202 when the input signal RFin2 is amplified to a level that allows the input signal RFin2 to be transmitted with the transmission power defined in PC 2, and the input signal RFin2 is supplied to the low-power MB amplifier circuit 102 when the input signal RFin2 is amplified to a level that allows the input signal RFin2 to be transmitted with the transmission power defined in PC 3. The input signal RFin2 can be supplied to the low-power MB amplifier circuit 102 or the high-power wide-band amplifier circuit 202, which can efficiently operate in accordance with the amplification level, for the amplification of the input signal RFin2. This makes it possible to suppress a reduction in the power efficiency of the power amplifier circuit 14.

In the foregoing description, the transmitting and receiving unit 6 according to this embodiment is configured such that the amplifier circuit group 71A has a circuit configuration similar to that of the power amplifier circuit 11A. Alternatively, the amplifier circuit group 71A may have a circuit configuration similar to that of the power amplifier circuit 11B, 11C, 11D, 12, or 13.

In the foregoing description, the transmitting and receiving unit 6 according to this embodiment is configured such that the output distribution switch 502 is configured to be capable of connecting the high-power wide-band amplifier circuit 202 to any one of the TDD filter circuits 522*a*, 522*b*, and 522*c*, although this is not required. The output distribution switch 502 may be configured to be capable of connecting the high-power wide-band amplifier circuit 202 to any one of the filter circuits including the FDD filter circuits 521*a*, 521*b*, and 521*c* and the TDD filter circuits 522*a*, 522*b*, and 522*c*. Accordingly, an RF signal amplified by the high-power wide-band amplifier circuit 202 can be supplied to the FDD filter circuit 521*a*, 521*b*, or 521*c*.

In the foregoing description, the transmitting and receiving unit 6 according to this embodiment is configured such that the input distribution switch 501 is configured to be capable of connecting the first end to any one of the second and third ends and connecting the fourth end to any one of the second and third ends, although this is not required. The input distribution switch 501 may be configured to be capable of connecting only the first end to any one of the second and third ends. Alternatively, the input distribution switch 501 may be configured to be capable of connecting only the fourth end to any one of the second and third ends.

When the amplifier circuit group 71A has a circuit configuration similar to that of the power amplifier circuit 13 (see FIG. 22), the output distribution switch 502 corresponds to a "second switching unit". The low-power wide-band amplifier circuit 122 and the high-power HB amplifier circuit 222 correspond to a "second amplifier circuit" and a "first amplifier circuit", respectively. The FDD filter circuit group 521 and the TDD filter circuit group 522 correspond to a "fifth circuit" and a "sixth circuit", respectively.

In the case described above, the output distribution switch 502 may be configured to be capable of connecting the high-power HB amplifier circuit 222 to any one of the filter circuits including the FDD filter circuits 521*a*, 521*b*, and 521*c* and the TDD filter circuits 522*a*, 522*b*, and 522*c*.

Fifth Embodiment

A basic example of a power amplifier circuit according to a fifth embodiment will be described. Unlike the power amplifier circuit 11 according to the first embodiment, a power amplifier circuit 15 according to the fifth embodiment amplifies, instead of an RF signal belonging to the mid band or the high band, an RF signal belonging to a frequency band (unlicensed band (UB)) ranging from 5.925 GHz to 7.125 GHz (this frequency band is hereinafter referred to sometimes as the unlicensed band).

Figure 24:
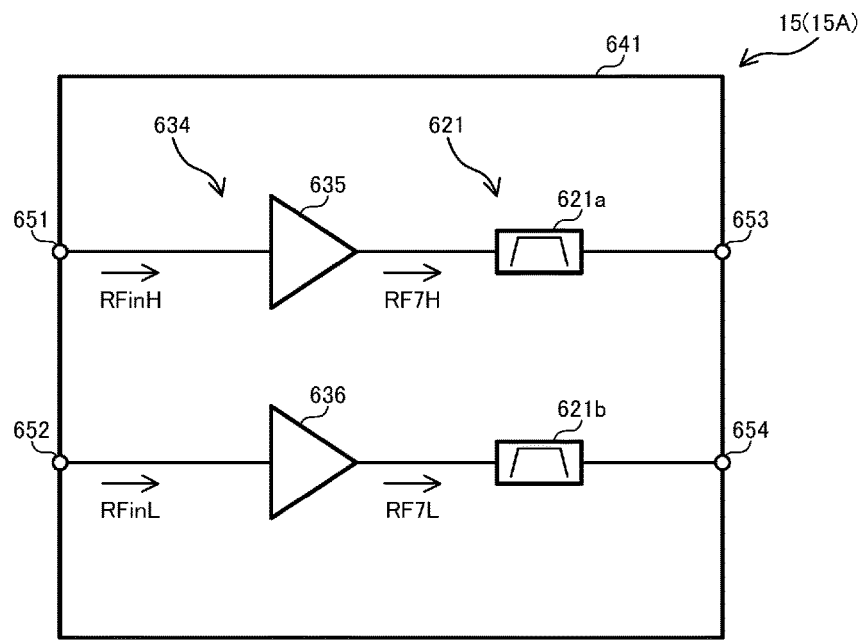
FIG. 24 is a diagram illustrating a configuration of a basic example of a power amplifier circuit according to a fifth embodiment of the present disclosure.

FIG. 24 illustrates a configuration of a basic example of the power amplifier circuit 15 according to the fifth embodiment of the present disclosure. As illustrated in FIG. 24, the basic example of the power amplifier circuit 15 according to the fifth embodiment (hereinafter referred to sometimes as the power amplifier circuit 15A) includes an amplifier circuit group 634 and a TDD filter circuit group 621. The amplifier circuit group 634 includes a high-power UB amplifier circuit 635 (third amplifier circuit) and a low-power UB amplifier circuit 636 (fourth amplifier circuit). The TDD filter circuit group 621 includes TDD filter circuits 621*a* (first filter) and 621*b* (second filter). The amplifier circuit group 634 and the TDD filter circuit group 621 are formed in or on a semiconductor chip 641, for example.

Figure 25:
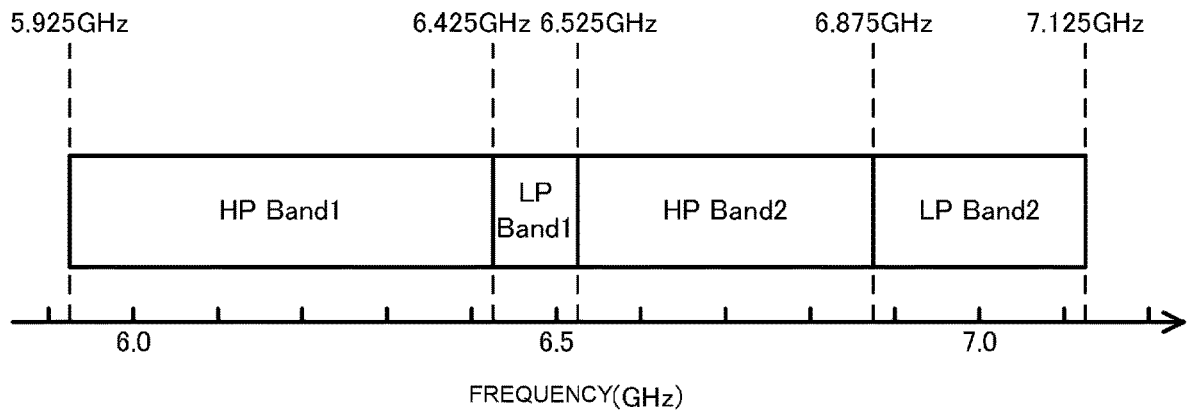
FIG. 25 is a diagram illustrating an example band configuration of RF signals to be amplified by the power amplifier circuit according to the fifth embodiment of the present disclosure.

FIG. 25 is a diagram illustrating an example band configuration of RF signals to be amplified by the power amplifier circuit 15 according to the fifth embodiment of the present disclosure. In FIG. 25, the horizontal axis represents frequency expressed in "GHz".

As illustrated in FIGS. 24 and 25, the RF signals to be amplified by the power amplifier circuit 15A belong to the unlicensed band. The unlicensed band does not require the radio station license. An RF signal belonging to the unlicensed band is transmitted and received in accordance with, for example, the TDD method conforming to the communication standard based on the fifth-generation mobile communication system (5G).

The unlicensed band includes high power (HP) Band 1 (third frequency band) ranging from 5.925 GHz to 6.425 GHz, low power (LP) Band 1 (fourth frequency band) ranging from 6.425 GHz to 6.525 GHZ, HP Band 2 (third frequency band) ranging from 6.525 GHz to 6.875 GHZ, and LP Band 2 (fourth frequency band) ranging from 6.875 GHz to 7.125 GHZ. In the following, HP Band 1 and HP Band 2 are each referred to sometimes as the high-power band. LP Band 1 and LP Band 2 are each referred to sometimes as the low-power band.

An RF signal belonging to the high-power band is transmitted with an antenna output (hereinafter referred to sometimes as high power output) of at most 23 dBm. An RF signal belonging to the low-power band is transmitted with an antenna output (hereinafter referred to sometimes as low power output) of at most 17 dBm. In this embodiment, the low-power band is, for example, a wireless communication band dedicated to indoor environments such as a large factory and an office.

An RF signal input terminal 651 in the power amplifier circuit 15A is supplied with an RF signal belonging to the high-power band (hereinafter referred to sometimes as the input signal RFinH) (first transmission signal). An RF signal input terminal 652 is supplied with an RF signal belonging to the low-power band (hereinafter referred to sometimes as the input signal RFinL) (second transmission signal). RF signal output terminals 653 and 654 are connected to, for example, a third antenna (not illustrated).

The high-power UB amplifier circuit 635 in the amplifier circuit group 634 has a circuit configuration similar to that of the low-power MB amplifier circuit 102 and the fixed adjustment circuit 103 (see FIG. 4). The high-power UB amplifier circuit 635 may have a circuit configuration similar to that of the low-power MB amplifier circuit 112 and the fixed adjustment circuit 113 (see FIG. 11).

The high-power UB amplifier circuit 635 has an input terminal configured to be supplied with the input signal RFinH through the RF signal input terminal 651, and an output terminal configured to output an amplified signal RF7H (third amplified signal) obtained by amplifying the input signal RFinH. The high-power UB amplifier circuit 635 is configured to have high power efficiency when an RF signal belonging to the unlicensed band is amplified to a level that allows the RF signal to be transmitted with high power output (hereinafter referred to sometimes as the high-power level) (third power).

The low-power UB amplifier circuit 636 has a circuit configuration similar to that of the low-power MB amplifier circuit 102 and the fixed adjustment circuit 103 (see FIG. 4). The low-power UB amplifier circuit 636 may have a circuit configuration similar to that of the low-power MB amplifier circuit 112 and the fixed adjustment circuit 113 (see FIG. 11).

The low-power UB amplifier circuit 636 has an input terminal configured to be supplied with the input signal RFinL through the RF signal input terminal 652, and an output terminal configured to output an amplified signal RF7L (fourth amplified signal) obtained by amplifying the input signal RFinL. The low-power UB amplifier circuit 636 is configured to have high power efficiency when an RF signal belonging to the unlicensed band is amplified to a level that allows the RF signal to be transmitted with low power output (hereinafter referred to sometimes as low-power level) (fourth power).

The TDD filter circuit 621*a* is disposed subsequent to the high-power UB amplifier circuit 635 and has an electric power handling capability in the high-power level. Specifically, the TDD filter circuit 621*a* has a first end connected to the output terminal of the high-power UB amplifier circuit 635, and a second end connected to the RF signal output terminal 653.

For example, the TDD filter circuit 621*a* transmits an RF signal included in HP Band 1 and attenuates an RF signal of frequency components out of HP Band 1. The TDD filter circuit 621*a* may transmit an RF signal included in HP Band 2 and attenuate an RF signal of frequency components out of HP Band 2. The TDD filter circuit 621*a* may transmit an RF signal included in the high-power band and attenuate an RF signal of frequency components out of the high-power band.

The TDD filter circuit 621*b* is disposed subsequent to the low-power UB amplifier circuit 636 and has an electric power handling capability in the low-power level. Specifically, the TDD filter circuit 621*b* has a first end connected to the output terminal of the low-power UB amplifier circuit 636, and a second end connected to the RF signal output terminal 654.

For example, the TDD filter circuit 621*b* transmits an RF signal included in LP Band 1 and attenuates an RF signal of frequency components out of LP Band 1. The TDD filter circuit 621*b* may transmit an RF signal included in LP Band 2 and attenuate an RF signal of frequency components out of LP Band 2. The TDD filter circuit 621*b* may transmit an RF signal included in the low-power band and attenuate an RF signal of frequency components out of the low-power band.

First Modification of Power Amplifier Circuit 15

Figure 26:
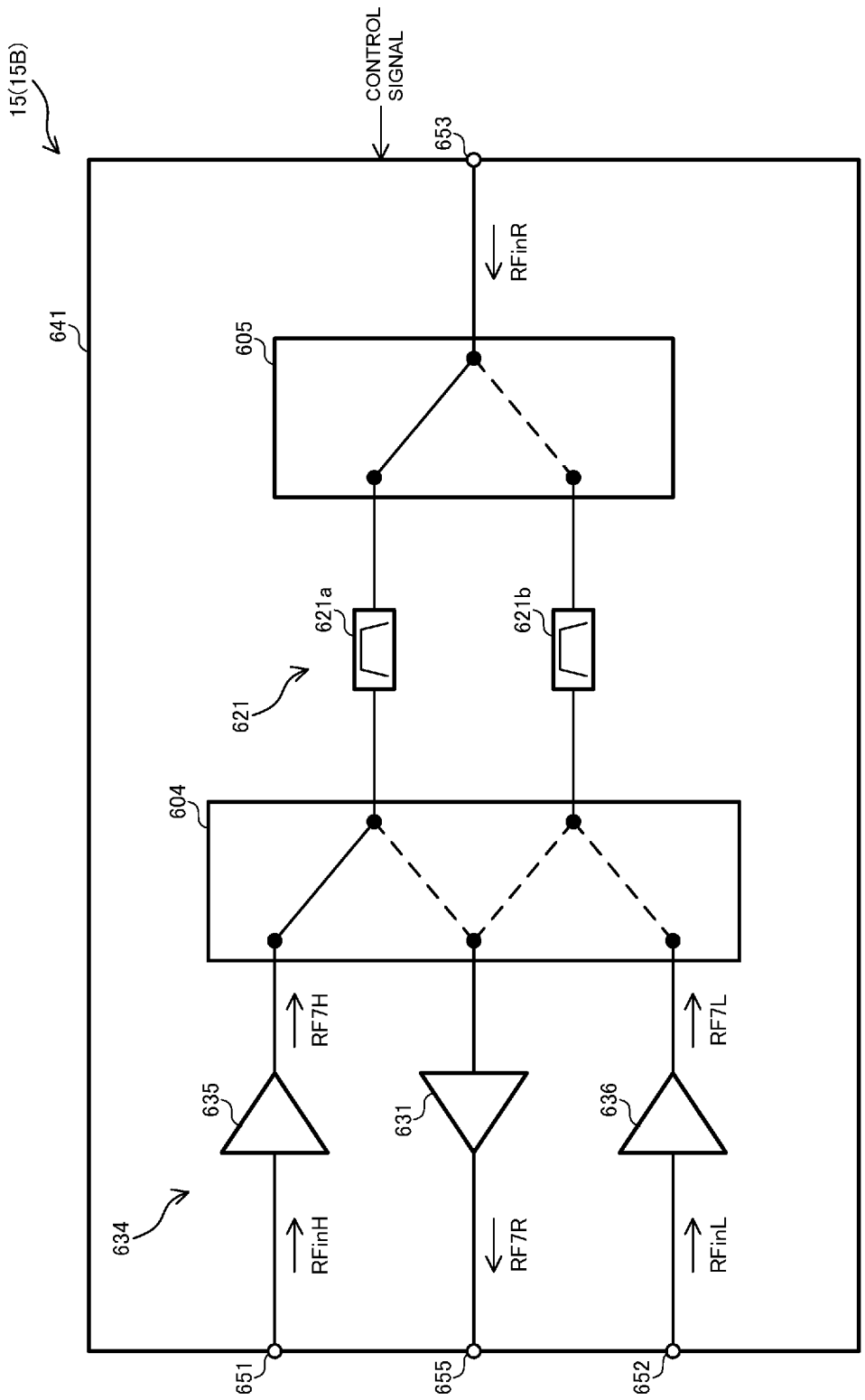
FIG. 26 is a diagram illustrating a configuration of a first modification of the power amplifier circuit according to the fifth embodiment of the present disclosure.

A first modification of the power amplifier circuit 15 according to the fifth embodiment will be described. FIG. 26 illustrates a configuration of the first modification of the power amplifier circuit 15 according to the fifth embodiment of the present disclosure. As illustrated in FIG. 26, the first modification of the power amplifier circuit 15 according to the fifth embodiment (hereinafter referred to sometimes as the power amplifier circuit 15B) is different from the basic example of the power amplifier circuit 15, or the power amplifier circuit 15A, illustrated in FIG. 24 in that the power amplifier circuit 15B includes a low-noise amplifier 631 for reception signals, and switches each for switching the target to which one of the TDD filter circuits 621*a* and 621*b* is connected.

Unlike the power amplifier circuit 15A illustrated in FIG. 24, the power amplifier circuit 15B further includes an output distribution switch 604 (fifth switching unit), a switch 605 (sixth switching unit), and a low-noise amplifier 631 (fifth amplifier circuit).

An RF signal output terminal 655 in the power amplifier circuit 15B is connected to, for example, a circuit for demodulating a reception signal and performing other processing. An RF signal output terminal 653 is connected to, for example, a third antenna (seventh circuit).

The low-noise amplifier 631 amplifies an input signal RFinR (reception signal) belonging to the high-power band or the low-power band, which is received by the third antenna. In this embodiment, the low-noise amplifier 631 has an input terminal configured to be supplied with the input signal RFinR, and an output terminal connected to the RF signal output terminal 655 and configured to output an amplified signal RF7R (fifth amplified signal) obtained by amplifying the input signal RFinR. The low-noise amplifier 631 is configured to have high power efficiency when an RF signal belonging to the unlicensed band is amplified.

The output distribution switch 604 is disposed between the TDD filter circuit group 621 and a combination of the amplifier circuit group 634 and the low-noise amplifier 631. The output distribution switch 604 is configured to be capable of connecting the TDD filter circuit 621*a* to any one of the high-power UB amplifier circuit 635 and the low-noise amplifier 631 and connecting the TDD filter circuit 621*b* to any one of the low-power UB amplifier circuit 636 and the low-noise amplifier 631.

In this embodiment, the output distribution switch 604 has a first end connected to the output terminal of the high-power UB amplifier circuit 635, a second end connected to the input terminal of the low-noise amplifier 631, a third end connected to the output terminal of the low-power UB amplifier circuit 636, a fourth end connected to the first end of the TDD filter circuit 621*b*, and a fifth end connected to the first end of the TDD filter circuit 621*a*.

For example, the output distribution switch 604 electrically connects the fifth end and any one of the first and second ends to each other in accordance with a control signal outputted from the control unit of the mobile communication device. Further, the output distribution switch 604 electrically connects the fourth end and any one of the second and third ends to each other in accordance with the control signal.

The switch 605 is disposed between the TDD filter circuit group 621 and the RF signal output terminal 653 connected to the third antenna. The switch 605 is configured to be capable of connecting any one of the TDD filter circuits 621*a* and 621*b* to the RF signal output terminal 653.

In this embodiment, the switch 605 has a first end connected to the second end of the TDD filter circuit 621*a*, a second end connected to the second end of the TDD filter circuit 621*b*, and a third end connected to the RF signal output terminal 653.

For example, the switch 605 electrically connects the third end and any one of the first and second ends to each other in accordance with a control signal outputted from the control unit of the mobile communication device.

Connection Mode of Switches During Transmission and Reception of RF Signal Belonging to High-Power Band The output distribution switch 604 and the switch 605 operate in association with each other. In this embodiment, communication for the high-power band and communication for the low-power band are not performed simultaneously. When communication for the high-power band is performed, only the input signal RFinH is supplied to the RF signal input terminal 651.

In TDD communication, the RF signal transmission period and the RF signal reception period are separated from each other. Thus, the output distribution switch 604 electrically connects the first and fifth ends thereof to each other in the transmission period of an RF signal belonging to the high-power band, for example, HP Band 1. In the reception period of an RF signal belonging to HP Band 1, in contrast, the output distribution switch 604 electrically isolates the first and fifth ends thereof from each other and electrically connects the second and fifth ends thereof to each other. In the transmission and reception periods of an RF signal belonging to HP Band 1, the switch 605 electrically connects the first and third ends to each other.

As a result, in the transmission period of an RF signal belonging to HP Band 1, the amplified signal RF7H outputted from the high-power UB amplifier circuit 635 is supplied to the RF signal output terminal 653 through the output distribution switch 604, the TDD filter circuit 621*a*, and the switch 605.

In the reception period of an RF signal belonging to HP Band 1, in contrast, the input signal RFinR supplied to the RF signal output terminal 653 is supplied to the low-noise amplifier 631 through the switch 605, the TDD filter circuit 621*a*, and the output distribution switch 604.

Connection Modes of Switches During Transmission and Reception of RF Signal Belonging to LP Band 1

When communication for the low-power band is performed, only the input signal RFinL is supplied to the RF signal input terminal 652. In the transmission period of an RF signal belonging to the low-power band, for example, LP Band 1, the output distribution switch 604 electrically connects the third and fourth ends thereof to each other. In the reception period of an RF signal belonging to LP Band 1, in contrast, the output distribution switch 604 electrically isolates the third and fourth ends thereof from each other and electrically connects the second and fourth ends thereof to each other. In the transmission and reception periods of an RF signal belonging to LP Band 1, the switch 605 electrically connects the second and third ends thereof to each other.

As a result, in the transmission period of an RF signal belonging to LP Band 1, the amplified signal RF7L outputted from the low-power UB amplifier circuit 636 is supplied to the RF signal output terminal 653 through the output distribution switch 604, the TDD filter circuit 621b, and the switch 605.

In the reception period of an RF signal belonging to LP Band 1, in contrast, the input signal RFinR supplied to the RF signal output terminal 653 is supplied to the low-noise amplifier 631 through the switch 605, the TDD filter circuit 621b, and the output distribution switch 604.

Second Modification of Power Amplifier Circuit 15

Figure 27:
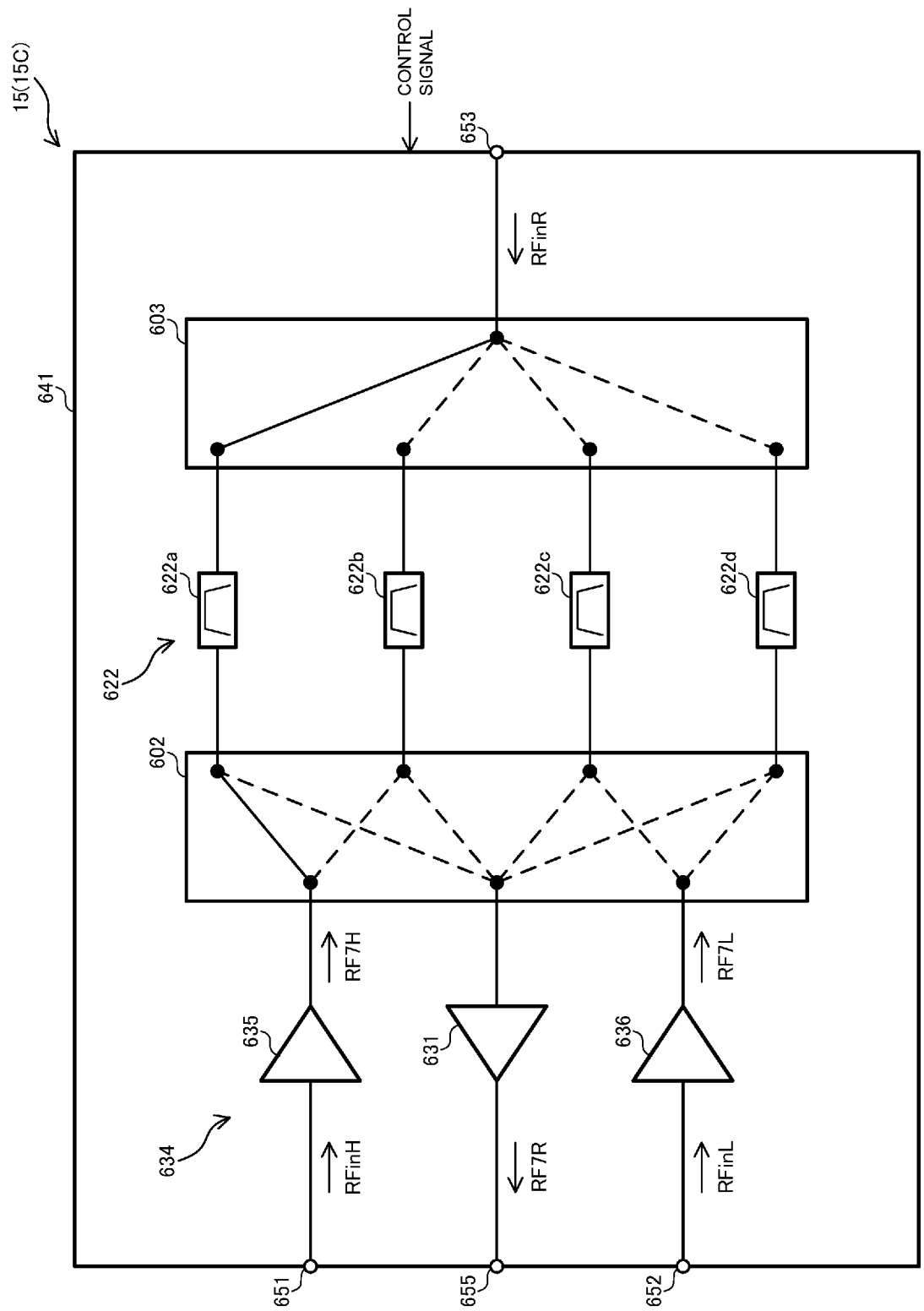
FIG. 27 is a diagram illustrating a configuration of a second modification of the power amplifier circuit according to the fifth embodiment of the present disclosure.

A second modification of the power amplifier circuit 15 according to the fifth embodiment will be described. FIG. 27 illustrates a configuration of the second modification of the power amplifier circuit 15 according to the fifth embodiment of the present disclosure. As illustrated in FIG. 27, the second modification of the power amplifier circuit 15 according to the fifth embodiment (hereinafter referred to sometimes as the power amplifier circuit 15C) is different from the first modification of the power amplifier circuit 15, or the power amplifier circuit 15B, illustrated in FIG. 26 in that the power amplifier circuit 15C further includes two filters.

Unlike the power amplifier circuit 15B illustrated in FIG. 26, the power amplifier circuit 15C includes an output distribution switch 602 (fifth switching unit), a switch 603 (sixth switching unit), and a TDD filter circuit group 622 in place of the output distribution switch 604, the switch 605, and the TDD filter circuit group 621, respectively.

The TDD filter circuit group 622 includes TDD filter circuits 622a (first filter), 622b (third filter), 622c (second filter), and 622d (fourth filter). The TDD filter circuits 622a and 622b are disposed subsequent to the high-power UB amplifier circuit 635 and have an electric power handling capability in the high-power level. The TDD filter circuits 622c and 622d are disposed subsequent to the low-power UB amplifier circuit 636 and have an electric power handling capability in the low-power level. In the following, each of the TDD filter circuits 622a, 622b, 622c, and 622d is sometimes referred to simply as the TDD filter circuit.

The TDD filter circuit has a first end configured to be supplied with an RF signal during transmission and configured to output an RF signal during reception, and a second end configured to output an RF signal during transmission and configured to be supplied with an RF signal during reception.

The TDD filter circuit 622a transmits an RF signal included in HP Band 1 and attenuates an RF signal of frequency components out of HP Band 1. The TDD filter circuit 622b transmits an RF signal included in HP Band 2 and attenuates an RF signal of frequency components out of HP Band 2. The TDD filter circuit 622c transmits an RF signal included in LP Band 1 and attenuates an RF signal of frequency components out of LP Band 1. The TDD filter circuit 622d transmits an RF signal included in LP Band 2 and attenuates an RF signal of frequency components out of LP Band 2.

The output distribution switch 602 is configured to be capable of connecting the TDD filter circuit 622a to any one of the high-power UB amplifier circuit 635 and the low-noise amplifier 631, connecting the TDD filter circuit 622b to any one of the high-power UB amplifier circuit 635 and the low-noise amplifier 631, connecting the TDD filter circuit 622c to any one of the low-power UB amplifier circuit 636 and the low-noise amplifier 631, and connecting the TDD filter circuit 622d to any one of the low-power UB amplifier circuit 636 and the low-noise amplifier 631.

In other words, the output distribution switch 602 is configured to be capable of connecting the high-power UB amplifier circuit 635 to any one of the TDD filter circuits 622a and 622b, connecting the low-power UB amplifier circuit 636 to any one of the TDD filter circuits 622c and 622d, and connecting the low-noise amplifier 631 to any one of the TDD filter circuits 622a, 622b, 622c, and 622d.

In this embodiment, the output distribution switch 602 has a first end connected to the output terminal of the high-power UB amplifier circuit 635, a second end connected to the input terminal of the low-noise amplifier 631, a third end connected to the output terminal of the low-power UB amplifier circuit 636, a fourth end connected to the first end of the TDD filter circuit 622d, a fifth end connected to the first end of the TDD filter circuit 622c, a sixth end connected to the first end of the TDD filter circuit 622b, and a seventh end connected to the first end of the TDD filter circuit 622a.

For example, the output distribution switch 602 electrically connects the first end and any one of the sixth and seventh ends to each other in accordance with a control signal outputted from the control unit of the mobile communication device. Further, the output distribution switch 602 electrically connects the second end and any one of the terminals including the fourth to seventh ends to each other in accordance with the control signal. Further, the output distribution switch 602 electrically connects the third end and any one of the fourth and fifth ends to each other in accordance with the control signal.

The switch 603 is configured to be capable of connecting any one of the TDD filter circuits 622a, 622b, 622c, and 622d to the RF signal output terminal 653.

In this embodiment, the switch 603 has a first end connected to the second end of the TDD filter circuit 622a, a second end connected to the second end of the TDD filter circuit 622b, a third end connected to the second end of the TDD filter circuit 622c, a fourth end connected to the second end of the TDD filter circuit 622d, and a fifth end connected to the RF signal output terminal 653.

For example, the switch 603 electrically connects any one of the terminals including the first to fourth ends and the fifth end to each other in accordance with a control signal outputted from the control unit of the mobile communication device.

Connection Modes of Switches During Transmission and Reception of RF Signal Belonging to HP Band 1

The output distribution switch 602 and the switch 603 operate in association with each other. In this embodiment, communication for the high-power band and communication for the low-power band are not performed simultaneously. When communication for the high-power band is performed, only the input signal RFinH is supplied to the RF signal input terminal 651.

In TDD communication, the RF signal transmission period and the RF signal reception period are separated from each other. Thus, the output distribution switch 602 electrically connects the first and seventh ends thereof to each other in the transmission period of an RF signal belonging to HP Band 1. In the reception period of an RF signal belonging to HP Band 1, in contrast, the output distribution switch 602 electrically isolates the first and seventh ends thereof from each other and electrically connects the second and seventh ends thereof to each other. In the transmission and reception periods of an RF signal belonging to HP Band 1, the switch 603 electrically connects the first and fifth ends thereof to each other.

As a result, in the transmission period of an RF signal belonging to HP Band 1, the amplified signal RF7H outputted from the high-power UB amplifier circuit 635 is supplied to the RF signal output terminal 653 through the output distribution switch 602, the TDD filter circuit 622*a*, and the switch 603.

In the reception period of an RF signal belonging to HP Band 1, in contrast, the input signal RFinR supplied to the RF signal output terminal 653 is supplied to the low-noise amplifier 631 through the switch 603, the TDD filter circuit 622*a*, and the output distribution switch 602.

Connection Modes of Switches During Transmission and Reception of RF Signal Belonging to HP Band 2

In the transmission period of an RF signal belonging to HP Band 2, the output distribution switch 602 electrically connects the first and sixth ends thereof to each other. In the reception period of an RF signal belonging to HP Band 2, in contrast, the output distribution switch 602 electrically isolates the first and sixth ends thereof from each other and electrically connects the second and sixth ends thereof to each other. In the transmission and reception periods of an RF signal belonging to HP Band 2, the switch 603 electrically connects the second and fifth ends thereof to each other.

As a result, in the transmission period of an RF signal belonging to HP Band 2, the amplified signal RF7H outputted from the high-power UB amplifier circuit 635 is supplied to the RF signal output terminal 653 through the output distribution switch 602, the TDD filter circuit 622*b*, and the switch 603.

In the reception period of an RF signal belonging to HP Band 2, in contrast, the input signal RFinR supplied to the RF signal output terminal 653 is supplied to the low-noise amplifier 631 through the switch 603, the TDD filter circuit 622*b*, and the output distribution switch 602.

Connection Modes of Switches During Transmission and Reception of RF Signal Belonging to LP Band 1

When communication for the low-power band is performed, only the input signal RFinL is supplied to the RF signal input terminal 652. In the transmission period of an RF signal belonging to LP Band 1, the output distribution switch 602 electrically connects the third and fifth ends thereof to each other. In the reception period of an RF signal belonging to LP Band 1, in contrast, the output distribution switch 602 electrically isolates the third and fifth ends thereof from each other and electrically connects the second and fifth ends thereof to each other. In the transmission and reception periods of an RF signal belonging to LP Band 1, the switch 603 electrically connects the third and fifth ends thereof to each other.

As a result, in the transmission period of an RF signal belonging to LP Band 1, the amplified signal RF7L outputted from the low-power UB amplifier circuit 636 is supplied to the RF signal output terminal 653 through the output distribution switch 602, the TDD filter circuit 622*c*, and the switch 603.

In the reception period of an RF signal belonging to LP Band 1, in contrast, the input signal RFinR supplied to the RF signal output terminal 653 is supplied to the low-noise amplifier 631 through the switch 603, the TDD filter circuit 622*c*, and the output distribution switch 602.

Connection Modes of Switches During Transmission and Reception of RF Signal Belonging to LP Band 2

In the transmission period of an RF signal belonging to LP Band 2, the output distribution switch 602 electrically connects the third and fourth ends thereof to each other. In the reception period of an RF signal belonging to LP Band 2, in contrast, the output distribution switch 602 electrically isolates the third and fourth ends thereof from each other and electrically connects the second and fourth ends thereof to each other. In the transmission and reception periods of an RF signal belonging to LP Band 2, the switch 603 electrically connects the fourth and fifth ends thereof to each other.

As a result, in the transmission period of an RF signal belonging to LP Band 2, the amplified signal RF7L outputted from the low-power UB amplifier circuit 636 is supplied to the RF signal output terminal 653 through the output distribution switch 602, the TDD filter circuit 622*d*, and the switch 603.

In the reception period of an RF signal belonging to LP Band 2, in contrast, the input signal RFinR supplied to the RF signal output terminal 653 is supplied to the low-noise amplifier 631 through the switch 603, the TDD filter circuit 622*d*, and the output distribution switch 602.

Third Modification of Power Amplifier Circuit 15

Figure 28:
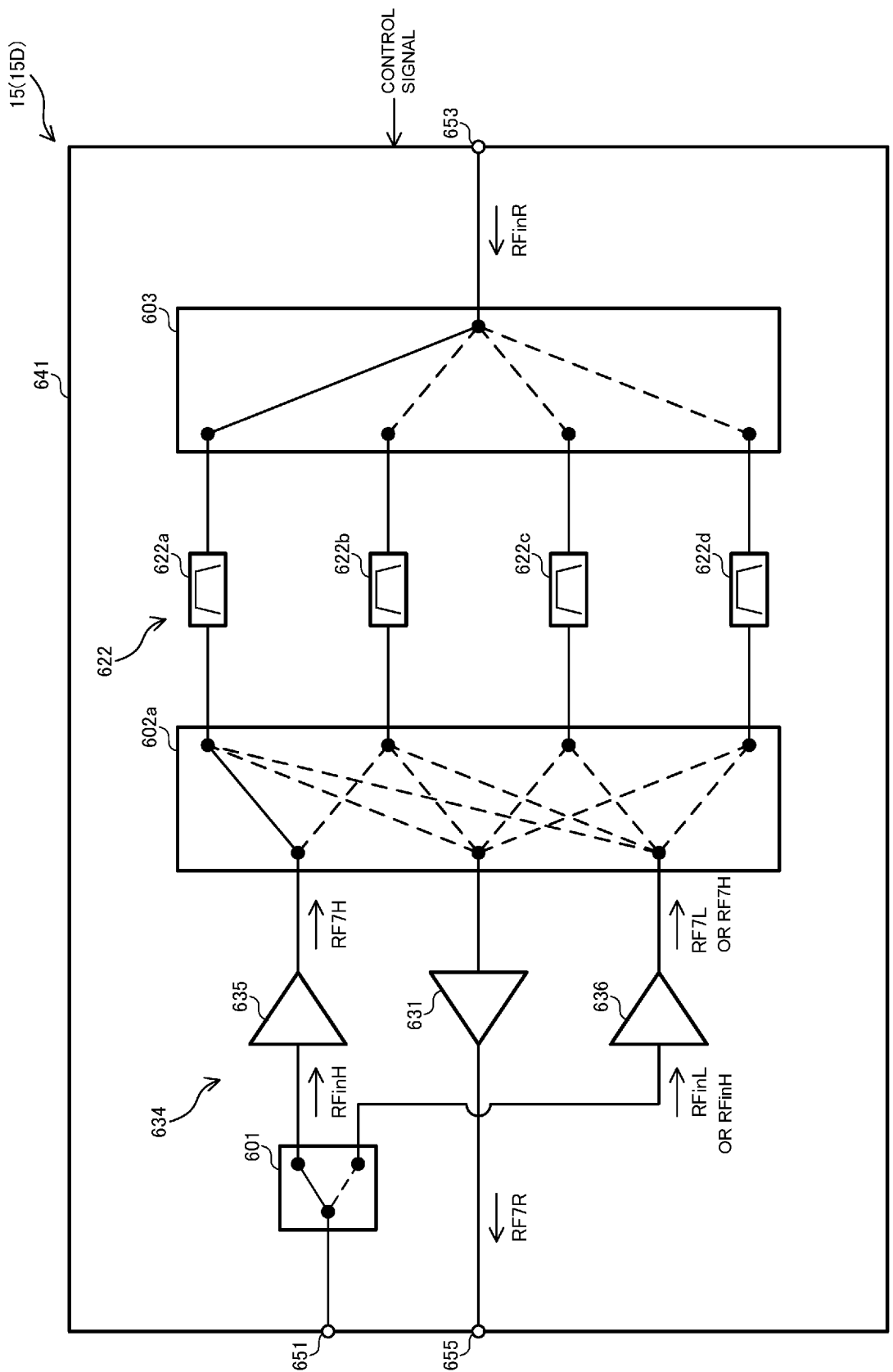
FIG. 28 is a diagram illustrating a configuration of a third modification of the power amplifier circuit according to the fifth embodiment of the present disclosure.

A third modification of the power amplifier circuit 15 according to the fifth embodiment will be described. FIG. 28 illustrates a configuration of the third modification of the power amplifier circuit 15 according to the fifth embodiment of the present disclosure. As illustrated in FIG. 28, the third modification of the power amplifier circuit 15 according to the fifth embodiment (hereinafter referred to sometimes as the power amplifier circuit 15D) is different from the second modification of the power amplifier circuit 15, or the power amplifier circuit 15C, illustrated in FIG. 27 in that the power amplifier circuit 15D includes a switch that switches the target to which an input signal supplied to the RF signal input terminal 651 is output.

Unlike the power amplifier circuit 15C illustrated in FIG. 27, the power amplifier circuit 15D includes an output distribution switch 602*a* (fifth switching unit) in place of the output distribution switch 602, and further includes an input distribution switch 601 (seventh switching unit).

The input distribution switch 601 is disposed prior to the amplifier circuit group 634. The input distribution switch 601 has a first end connected to the RF signal input terminal 651, a second end connected to the input terminal of the high-power UB amplifier circuit 635, and a third end connected to the input terminal of the low-power UB amplifier circuit 636.

As described above, communication for the high-power band and communication for the low-power band are not performed simultaneously. Thus, any one of the input signals RFinH and RFinL is supplied to the RF signal input terminal 651.

The input distribution switch 601 is configured to be capable of connecting the first end to any one of the second and third ends.

In this embodiment, for example, the input distribution switch 601 electrically connects the first and second ends to each other in accordance with a control signal outputted from the control unit of the mobile communication device. For example, the input distribution switch 601 electrically connects the first and third ends to each other in accordance with the control signal.

The output distribution switch 602*a* is configured to be capable of connecting the TDD filter circuit 622*a* to any one of the high-power UB amplifier circuit 635, the low-power UB amplifier circuit 636, and the low-noise amplifier 631, connecting the TDD filter circuit 622*b* to any one of the high-power UB amplifier circuit 635, the low-power UB amplifier circuit 636, and the low-noise amplifier 631, connecting the TDD filter circuit 622*c* to any one of the low-power UB amplifier circuit 636 and the low-noise amplifier 631, and connecting the TDD filter circuit 622*d* to any one of the low-power UB amplifier circuit 636 and the low-noise amplifier 631.

In other words, the output distribution switch 602a is configured to be capable of connecting the high-power UB amplifier circuit 635 to any one of the TDD filter circuits 622a and 622b, connecting the low-power UB amplifier circuit 636 to any one of the TDD filter circuits 622a, 622b, 622c, and 622d, and connecting the low-noise amplifier 631 to any one of the TDD filter circuits 622a, 622b, 622c, and 622d.

In this embodiment, the output distribution switch 602a has first to seventh ends connected in a manner similar to the first to seventh ends of the output distribution switch 602 illustrated in FIG. 27, respectively.

For example, the output distribution switch 602a electrically connects the first end and any one of the sixth and seventh ends to each other in accordance with a control signal outputted from the control unit of the mobile communication device. Further, the output distribution switch 602a electrically connects the second end and any one of the terminals including the fourth to seventh ends to each other in accordance with the control signal. Further, the output distribution switch 602a electrically connects the third end and any one of the terminals including the fourth to seventh ends in accordance with the control signal.

Connection Mode of Switches During Transmission of Amplified Signal RF7H with High Power Output The input distribution switch 601, the output distribution switch 602a, and the switch 603 operate in association with each other. When communication for the high-power band is performed, only the input signal RFinH is supplied to the RF signal input terminal 651. In the transmission period during which an RF signal belonging to the high-power band is transmitted with the high power output and in the reception period of an RF signal belonging to the high-power band, the input distribution switch 601 electrically connects the first and second ends thereof to each other.

As a result, in the transmission period during which an RF signal belonging to the high-power band is transmitted with the high power output, the input signal RFinH supplied to the RF signal input terminal 651 is supplied to the input terminal of the high-power UB amplifier circuit 635 through the input distribution switch 601 and is amplified by the high-power UB amplifier circuit 635.

The output distribution switch 602a and the switch 603 operate in a way similar to that of the output distribution switch 602 and the switch 603 illustrated in FIG. 27, respectively, during the transmission and reception of an RF signal belonging to HP Band 1 and during the transmission and reception of an RF signal belonging to HP Band 2.

Connection Mode of Switches During Transmission of Amplified Signal RF7H with Low Power Output or Lower Even an RF signal belonging to the high-power band may be able to be transmitted with the low power output or lower, for example, because the distance between the mobile communication device and the base station short. In this case, in the transmission period during which an RF signal belonging to the high-power band is transmitted with the low power output or lower and in the reception period of an RF signal belonging to the high-power band, the input distribution switch 601 electrically connects the first and third ends thereof to each other.

1. Transmission of RF Signal Belonging to HP Band 1 with Low Power Output or Lower In a transmission period during which an RF signal belonging to HP Band 1 is transmitted with the low power output or lower (hereinafter referred to sometimes as the HPB-1 low-power transmission period), the output distribution switch 602a electrically connects the third and seventh ends thereof to each other. In the reception period of an RF signal belonging to HP Band 1, in contrast, the output distribution switch 602a electrically isolates the third and seventh ends thereof from each other and electrically connects the second and seventh ends thereof to each other. In the HPB-1 low-power transmission period and the reception period, the switch 603 electrically connects the first and fifth ends thereof to each other.

As a result, in the HPB-1 low-power transmission period, the input signal RFinH supplied to the RF signal input terminal 651 is transmitted the low-power UB amplifier circuit 636 through the input distribution switch 601. The low-power UB amplifier circuit 636 amplifies the input signal RFinH and generates the amplified signal RF7H having a level that allows the amplified signal RF7H to be transmitted with the low power output or lower. The amplified signal RF7H generated by the low-power UB amplifier circuit 636 is supplied to the RF signal output terminal 653 through the output distribution switch 602a, the TDD filter circuit 622a, and the switch 603.

In the reception period of an RF signal belonging to HP Band 1, the input signal RFinR supplied to the RF signal output terminal 653 is supplied to the low-noise amplifier 631 through the switch 603, the TDD filter circuit 622a, and the output distribution switch 602a.

2. Transmission of RF Signal Belonging to HP Band 2 with Low Power Output or Lower In the transmission period during which an RF signal belonging to HP Band 2 is transmitted with the low power output or lower (hereinafter referred to sometimes as the HPB-2 low-power transmission period), the output distribution switch 602a electrically connects the third and sixth ends thereof to each other. In the reception period of an RF signal belonging to HP Band 2, in contrast, the output distribution switch 602a electrically isolates the third and sixth ends thereof from each other and electrically connects the second and sixth ends thereof to each other. In the HPB-2 low-power transmission period and the reception period, the switch 603 electrically connects the second and fifth ends thereof to each other.

As a result, in the HPB-2 low-power transmission period, the input signal RFinH supplied to the RF signal input terminal 651 is supplied to the low-power UB amplifier circuit 636 through the input distribution switch 601. The low-power UB amplifier circuit 636 amplifies the input signal RFinH and generates the amplified signal RF7H having a level that allows the amplified signal RF7H to be transmitted with the low power output or lower. The amplified signal RF7H generated by the low-power UB amplifier circuit 636 is supplied to the RF signal output terminal 653 through the output distribution switch 602a, the TDD filter circuit 622b, and the switch 603.

In the reception period of an RF signal belonging to HP Band 2, in contrast, the input signal RFinR supplied to the RF signal output terminal 653 is supplied to the low-noise amplifier 631 through the switch 603, the TDD filter circuit 622b, and the output distribution switch 602a.

Connection Modes of Switches During Transmission and Reception of RF Signal Belonging to Low-Power Band When communication for the low-power band is performed, only the input signal RFinL is supplied to the RF signal input terminal 651. In the transmission and reception periods of an RF signal belonging to the low-power band, the input distribution switch 601 electrically connects the first and third ends thereof to each other.

As a result, in the transmission period of an RF signal belonging to the low-power band, the input signal RFinL supplied to the RF signal input terminal 651 is supplied to the input terminal of the low-power UB amplifier circuit 636 through the input distribution switch 601 and is amplified by the low-power UB amplifier circuit 636.

The output distribution switch 602a and the switch 603 operate in a way similar to that of the output distribution switch 602 and the switch 603 illustrated in FIG. 27, respectively, during the transmission and reception of an RF signal belonging to LP Band 1 and during the transmission and reception of an RF signal belonging to LP Band 2.

In the foregoing description, the power amplifier circuit 15D includes the output distribution switch 602a, the TDD filter circuit group 622, and the switch 603, although this is not required. The power amplifier circuit 15D may include the output distribution switch 604, the TDD filter circuit group 621, and the switch 605 illustrated in FIG. 26 in place of the output distribution switch 602a, the TDD filter circuit group 622, and the switch 603, respectively.

In this case, the output distribution switch 604 is configured to be capable of connecting the TDD filter circuit 621a to any one of the high-power UB amplifier circuit 635, the low-power UB amplifier circuit 636, and the low-noise amplifier 631 and connecting the TDD filter circuit 621b to any one of the low-power UB amplifier circuit 636 and the low-noise amplifier 631.

In the power amplifier circuit 15 according to the fifth embodiment, the third frequency band is the high-power band, although this is not required. The third frequency band may be any other band such as the low band, the low mid band, the mid band, the high band, or the ultra-high band.

In the power amplifier circuit 15 according to the fifth embodiment, the fourth frequency band is the low-power band, although this is not required. The fourth frequency band may be any other band such as the low band, the low mid band, the mid band, the high band, or the ultra-high band.

In the foregoing description, the power amplifier circuit 15 according to the fifth embodiment is configured such that the high-power UB amplifier circuit 635 has a circuit configuration similar to that of the low-power MB amplifier circuit 102 and the fixed adjustment circuit 103 (see FIG. 4), although this is not required. The high-power UB amplifier circuit 635 may have a circuit configuration similar to that of the high-power wide-band amplifier circuit 202 and the first variable adjustment circuit 203 (see FIG. 4). Alternatively, the high-power UB amplifier circuit 635 may have a circuit configuration similar to that of the high-power wide-band amplifier circuit 212 and the first variable adjustment circuit 213 (see FIG. 11).

In the foregoing description, the power amplifier circuit 15 according to the fifth embodiment is configured such that the low-power UB amplifier circuit 636 has a circuit configuration similar to that of the low-power MB amplifier circuit 102 and the fixed adjustment circuit 103 (see FIG. 4), although this is not required. The low-power UB amplifier circuit 636 may have a circuit configuration similar to that of the high-power wide-band amplifier circuit 202 and the first variable adjustment circuit 203 (see FIG. 4). Alternatively, the low-power UB amplifier circuit 636 may have a circuit configuration similar to that of the high-power wide-band amplifier circuit 212 and the first variable adjustment circuit 213 (see FIG. 11).

Some exemplary embodiments of the present disclosure have been described. In the power amplifier circuit 11A, the low-power MB amplifier circuit 102 amplifies the input signal RFin1 of the mid band and outputs the amplified signals RF3p and RF3m having a first power. The high-power wide-band amplifier circuit 202 amplifies the input signal RFin2 of the mid band or the high band different from the mid band and outputs the amplified signals RF4p and RF4m having a second power different from the first power. The first variable adjustment circuit 203 is disposed between the high-power wide-band amplifier circuit 202 and the transmission line 64 and is configured to be capable of adjusting a first impedance of the transmission line 64 seen from the high-power wide-band amplifier circuit 202.

As described above, with a configuration in which the first impedance is adjustable using the first variable adjustment circuit 203, the RF signal distortion and reduction in power efficiency caused by a mismatch in impedance between the high-power wide-band amplifier circuit 202 and the transmission line 64 can be suppressed across a wide frequency band from the mid band to the high band. That is, the amplified signals RF4p and RF4m can be efficiently supplied across a wide frequency band by using a single amplifier circuit, namely, the high-power wide-band amplifier circuit 202, without using two amplifier circuits, namely, an amplifier circuit for the mid band and an amplifier circuit for the high band, as amplifier circuits for the second power. It is therefore possible to efficiently supply RF signals over a wide frequency band and suppress an increase in circuit size.

In the power amplifier circuit 13, the high-power HB amplifier circuit 222 amplifies the input signal RFin4 of the high band and outputs the amplified signals RF6p and RF6m having a first power. The low-power wide-band amplifier circuit 122 amplifies the input signal RFin3 of the mid band or the high band and outputs the amplified signals RF5p and RF5m having a second power different from the first power. The first variable adjustment circuit 133 is disposed between the low-power wide-band amplifier circuit 122 and the transmission line 63 and is configured to be capable of adjusting the first impedance of the transmission line 63 seen from the low-power wide-band amplifier circuit 122.

As described above, with a configuration in which the first impedance is adjustable using the first variable adjustment circuit 133, the RF signal distortion and reduction in power efficiency caused by a mismatch in impedance between the low-power wide-band amplifier circuit 122 and the transmission line 63 can be suppressed across a wide frequency band from the mid band to the high band. That is, the amplified signals RF5p and RF5m can be efficiently supplied across a wide frequency band by using a single amplifier circuit, namely, the low-power wide-band amplifier circuit 122, without using two amplifier circuits, namely, an amplifier circuit for the mid band and an amplifier circuit for the high band, as amplifier circuits for the second power. It is therefore possible to efficiently supply RF signals over a wide frequency band and suppress an increase in circuit size.

The high-power wide-band amplifier circuit 202 includes the power-stage differential amplifier circuit 43.

With this configuration, the output of each of the amplifiers 43a and 43b constituting the power-stage differential amplifier circuit 43 can be reduced to substantially one half the output of an amplifier (for example, the amplifier 45a constituting the power-stage single amplifier circuit 45) for a case where a signal is amplified using the single method. That is, the load impedance seen from each of the amplifiers 43a and 43b is substantially twice the load impedance seen from the amplifier 45a. This can reduce the transformation of the impedance, which is made by the first variable adjustment circuit 203, and increase the frequency band over which the first variable adjustment circuit 203 can efficiently adjust the first impedance. Accordingly, amplifying the input signal RFin2 using the power-stage differential amplifier circuit 43 allows a wider band of frequencies to be covered than amplifying the input signal RFin2 using the single method.

In the power amplifier circuit 11A, the power-stage differential amplifier circuit 43 included in the high-power wide-band amplifier circuit 202 amplifies the input signal RFin2 of the mid band or the high band and outputs the amplified signals RF4*p* and RF4*m* having a second power larger than the first power.

For example, in a case where the same output voltage is supplied using a single method, such as the power-stage single amplifier circuit 45 included in the high-power wide-band amplifier circuit 212, and using the power-stage differential amplifier circuit 43 included in the high-power wide-band amplifier circuit 202, the amplifier 45*a* constituting the power-stage single amplifier circuit 45 is required to have an output voltage that is substantially twice the output voltage of each of the amplifiers 43*a* and 43*b* constituting the power-stage differential amplifier circuit 43. Thus, the single method requires a current that is substantially twice the current for a differential amplifier circuit to supply the same power. To implement this, it is required to reduce the output impedance. However, it is usually difficult to reduce the output impedance. In contrast, a configuration in which the input signal RFin2 is amplified using the amplifiers 43*a* and 43*b* constituting the power-stage differential amplifier circuit 43 can reduce the output voltage of each of the amplifiers 43*a* and 43*b* to substantially one half the output voltage of the amplifier 45*a*. Thus, the amplified signals RF4*p* and RF4*m* having a second power larger than the first power can be outputted without reducing the output impedance to increase a current. That is, a configuration for amplifying the input signal RFin2 to a level that allows the input signal RFin2 to be transmitted with the transmission power defined in PC 2 can be easily achieved.

In the power amplifier circuit 13, the second power is smaller than the first power. The high-power HB amplifier circuit 222 includes the power-stage differential amplifier circuit 43.

As described above, with a configuration in which the input signal RFin4 is amplified using the amplifiers 43*a* and 43*b* constituting the power-stage differential amplifier circuit 43, the output voltage of each of the amplifiers 43*a* and 43*b* can be reduced to substantially one half the output voltage of the amplifier 45*a* for amplifying a signal using the single method. Thus, the amplified signals RF6*p* and RF6*m* having a first power larger than the second power can be outputted without reducing the output impedance to increase a current. That is, a configuration for amplifying the input signal RFin4 to a level that allows the input signal RFin4 to be transmitted with the transmission power defined in PC 2 can be easily implemented.

In the power amplifier circuit 12, the low-power wide-band amplifier circuit 122 amplifies the input signal RFin3 of the mid band or the high band and outputs the amplified signals RF5*p* and RF5*m* having a first power. The second variable adjustment circuit 123 is disposed between the low-power wide-band amplifier circuit 122 and the transmission line 63 and is configured to be capable of adjusting a second impedance of the transmission line 63 seen from the low-power wide-band amplifier circuit 122. The high-power wide-band amplifier circuit 202 amplifies the input signal RFin2 of the mid band or the high band and outputs the amplified signals RF4*p* and RF4*m* having a second power different from the first power. The first variable adjustment circuit 203 is disposed between the high-power wide-band amplifier circuit 202 and the transmission line 64 and is configured to be capable of adjusting a first impedance of the transmission line 64 seen from the high-power wide-band amplifier circuit 202.

As described above, with a configuration in which the second impedance is adjustable using the second variable adjustment circuit 123, the low-power wide-band amplifier circuit 122 can operate so as to have high power efficiency in a wide frequency band from the mid band to the high band. Accordingly, a wide frequency band can be covered with a single amplifier circuit, namely, the low-power wide-band amplifier circuit 122, without using two amplifier circuits, namely, an amplifier circuit for the mid band and an amplifier circuit for the high band, as amplifier circuits for the first power.

In the power amplifier circuit 11A, the first variable adjustment circuit 203A includes the wide-band matching circuit 301 configured to be capable of adjusting the first impedance for the frequencies of the fundamentals of the amplified signals RF4*p* and RF4*m*.

With this configuration, the high-power wide-band amplifier circuit 202 can operate so as to have high power efficiency in a wide frequency band from the mid band to the high band. It is therefore possible to supply the desired amplified signals RF4*p* and RF4*m* having sufficient power.

In the power amplifier circuit 11A, the first variable adjustment circuit 203B includes the wide-band termination circuit 401 configured to be capable of adjusting the first impedance for the frequencies of harmonics of the amplified signals RF4*p* and RF4*m*.

With this configuration, harmonics of the amplified signals RF4*p* and RF4*m* can be attenuated. It is therefore possible to supply the desired amplified signals RF4*p* and RF4*m* with reduced distortion caused by harmonics.

In the power amplifier circuit 12, the second variable adjustment circuit 123 includes the wide-band matching circuit 301 configured to be capable of adjusting the second impedance for the frequencies of the fundamentals of the amplified signals RF5*p* and RF5*m*.

With this configuration, the low-power wide-band amplifier circuit 122 can operate so as to have high power efficiency in a wide frequency band from the mid band to the high band. It is therefore possible to supply the desired amplified signals RF5*p* and RF5*m* having sufficient power.

In the power amplifier circuit 12, the second variable adjustment circuit 123 includes the wide-band termination circuit 401 configured to be capable of adjusting the second impedance for the frequencies of harmonics of the amplified signals RF5*p* and RF5*m*.

With this configuration, harmonics of the amplified signals RF5*p* and RF5*m* can be attenuated. It is therefore possible to supply the desired amplified signals RF5*p* and RF5*m* with reduced distortion caused by harmonics.

In the power amplifier circuit 14, the output distribution switch 502 is disposed between the low-power MB amplifier circuit 102 and filter circuit groups including the FDD filter circuit group 521 subsequent to the low-power MB amplifier circuit 102 and the TDD filter circuit group 522 subsequent to the high-power wide-band amplifier circuit 202. The output distribution switch 502 is configured to be capable of connecting the low-power MB amplifier circuit 102 to any one of the filter circuits including the FDD filter circuits 521*a*, 521*b*, and 521*c* and the TDD filter circuits 522*a*, 522*b*, and 522*c*.

With this configuration, for example, when communication is performed using the FDD method, the output signal RFout1 from the low-power MB amplifier circuit 102 can be supplied to any one of the FDD filter circuits 521*a*, 521*b*, and 521c. For example, when communication is performed using the TDD method, if the distance between the mobile communication device and the base station is short and an RF signal can be transmitted with the transmission power defined in PC 3 or if the transmission power defined in PC 3 can be used as the upper limit of transmission power for RF signals, the input signal RFin2 is amplified by the low-power MB amplifier circuit 102. The output signal RFout1 from the low-power MB amplifier circuit 102 can be supplied to any one of the TDD filter circuits 522a, 522b, and 522c.

In the power amplifier circuit 14, the output distribution switch 502 is disposed between the low-power wide-band amplifier circuit 122 and the filter circuit groups including the FDD filter circuit group 521 subsequent to the low-power wide-band amplifier circuit 122 and the TDD filter circuit group 522 subsequent to the high-power HB amplifier circuit 222. The output distribution switch 502 is configured to be capable of connecting the low-power wide-band amplifier circuit 122 to any one of the filter circuits including the FDD filter circuits 521a, 521b, and 521c and the TDD filter circuits 522a, 522b, and 522c.

With this configuration, for example, when communication is performed using the FDD method, an output signal RFout3 from the low-power wide-band amplifier circuit 122 can be supplied to any one of the FDD filter circuits 521a, 521b, and 521c. For example, when communication is performed using the TDD method, if the distance between the mobile communication device and the base station is short and an RF signal can be transmitted with the transmission power defined in PC 3 or if the transmission power defined in PC 3 can be used as the upper limit of transmission power for RF signals, the input signal RFin4 is amplified by the low-power wide-band amplifier circuit 122. The output signal RFout3 from the low-power wide-band amplifier circuit 122 can be supplied to any one of the TDD filter circuits 522a, 522b, and 522c.

In the power amplifier circuit 14, the input distribution switch 501 has a first end configured to be supplied with the input signal RFin2, a second end connected to the high-power wide-band amplifier circuit 202, and a third end connected to the low-power MB amplifier circuit 102, and is configured to be capable of connecting the first end to any one of the second and third ends.

With this configuration, for example, the input signal RFin2 to be used for TDD communication can be supplied to the high-power wide-band amplifier circuit 202 or the low-power MB amplifier circuit 102 in accordance with the required transmission power. Accordingly, the power efficiency of the high-power wide-band amplifier circuit 202 and the low-power MB amplifier circuit 102 can be improved.

In the power amplifier circuit 14, the input distribution switch 501 has a first end configured to be supplied with the input signal RFin4, a second end connected to the high-power HB amplifier circuit 222, and a third end connected to the low-power wide-band amplifier circuit 122, and is configured to be capable of connecting the first end to any one of the second and third ends.

With this configuration, for example, the input signal RFin4 to be used for TDD communication can be supplied to the high-power HB amplifier circuit 222 or the low-power wide-band amplifier circuit 122 in accordance with the required transmission power. Accordingly, the power efficiency of the high-power HB amplifier circuit 222 and the low-power wide-band amplifier circuit 122 can be improved.

In the power amplifier circuit 15B, the high-power UB amplifier circuit 635 amplifies the input signal RFinH of the high-power band and outputs the amplified signal RF7H having a third power. The low-power UB amplifier circuit 636 amplifies the input signal RFinL of the low-power band different from the high-power band and outputs the amplified signal RF7L having a fourth power smaller than the third power. The low-noise amplifier 631 amplifies the input signal RFinR of the high-power band or the low-power band and outputs the amplified signal RF7R. The TDD filter circuits 621a and 621b are disposed subsequent to the high-power UB amplifier circuit 635 and the low-power UB amplifier circuit 636, respectively. The output distribution switch 604 is disposed between the TDD filter circuit group 621 and a combination of the amplifier circuit group 634 and the low-noise amplifier 631. The output distribution switch 604 is configured to be capable of connecting the TDD filter circuit 621a to any one of the high-power UB amplifier circuit 635 and the low-noise amplifier 631 and connecting the TDD filter circuit 621b to any one of the low-power UB amplifier circuit 636 and the low-noise amplifier 631. The switch 605 is disposed between the TDD filter circuit group 621 and the third antenna disposed subsequent to the TDD filter circuit group 621. The switch 605 is configured to be capable of connecting any one of the TDD filter circuits 621a and 621b to the third antenna.

The output distribution switch 604 and the switch 605 are disposed in the manner described above to switch the connection mode of the output distribution switch 604 and the switch 605, as appropriate. With this configuration, the TDD filter circuit 621a can be used in common to remove noise from both the amplified signal RF7H and the input signal RFinR belonging to the high-power band. In addition, the TDD filter circuit 621b can be used in common to remove noise from both the amplified signal RF7L and the input signal RFinR belonging to the low-power band. Additionally, the low-noise amplifier 631 can be used in common to amplify both the input signal RFinR belonging to the high-power band and the input signal RFinR belonging to the low-power band. With this configuration, the circuit size of the power amplifier circuit 15B can be reduced compared with a configuration in which separate filters are provided for a transmission signal and a reception signal or separate low-noise amplifiers are provided for a reception signal belonging to the high-power band and a reception signal belonging to the low-power band.

In the power amplifier circuit 15C, the TDD filter circuits 622a and 622b are disposed subsequent to the high-power UB amplifier circuit 635. The TDD filter circuits 622c and 622d are disposed subsequent to the low-power UB amplifier circuit 636. The output distribution switch 602 is configured to be capable of connecting the TDD filter circuit 622a to any one of the high-power UB amplifier circuit 635 and the low-noise amplifier 631, connecting the TDD filter circuit 622b to any one of the high-power UB amplifier circuit 635 and the low-noise amplifier 631, connecting the TDD filter circuit 622c to any one of the low-power UB amplifier circuit 636 and the low-noise amplifier 631, and connecting the TDD filter circuit 622d to any one of the low-power UB amplifier circuit 636 and the low-noise amplifier 631. The switch 603 is configured to be capable of connecting any one of the TDD filter circuits 622a, 622b, 622c, and 622d to the third antenna.

With this configuration, noise is removed from the amplified signal RF7H and the input signal RFinR for each of HP Band 1 and HP Band 2 included in the high-power band, by using the TDD filter circuit 622a or 622b. In addition, noise is removed from the amplified signal RF7L and the input signal RFinR for each of LP Band 1 and LP Band 2 included in the low-power band, by using the TDD filter circuit 622*c* or 622*d*. Additionally, the low-noise amplifier 631 can be used to amplify the input signal RFinR, regardless of which of HP Band 1, HP Band 2, LP Band 1, and LP Band 2 the input signal RFinR belongs to. With this configuration, the circuit size of the power amplifier circuit 15C can be reduced compared with a configuration in which separate filters are provided for a transmission signal and a reception signal or a low-noise amplifier is provided for each band to which a reception signal belongs.

In the power amplifier circuit 15D, the input distribution switch 601 is disposed prior to the amplifier circuit group 634 and has a first end configured to be supplied with any one of the input signals RFinH and RFinL, a second end connected to the high-power UB amplifier circuit 635, and a third end connected to the low-power UB amplifier circuit 636. The input distribution switch 601 is configured to be capable of connecting the first end to any one of the second and third ends. The output distribution switch 602*a* is configured to be capable of connecting each of the TDD filter circuits 622*a* and 622*b* to any one of the high-power UB amplifier circuit 635, the low-power UB amplifier circuit 636, and the low-noise amplifier 631, and connecting each of the TDD filter circuits 622*c* and 622*d* to any one of the low-power UB amplifier circuit 636 and the low-noise amplifier 631.

With this configuration, for example, when the input signal RFinH belonging to the high-power band is transmitted with the high power output, the input signal RFinH is supplied to the high-power UB amplifier circuit 635, and the amplified signal RF7H from the high-power UB amplifier circuit 635 can be supplied to the TDD filter circuit 622*a* or 622*b*. Accordingly, the high power efficiency state of the high-power UB amplifier circuit 635 can be maintained. For example, when the input signal RFinH belonging to the high-power band is transmitted with the low power output or lower, the input signal RFinH is supplied to the low-power UB amplifier circuit 636, and the amplified signal RF7H from the low-power UB amplifier circuit 636 can be supplied to the TDD filter circuit 622*a* or 622*b*. Accordingly, when the input signal RFinH is transmitted with the low power output or lower, the reduction in power efficiency caused when the high-power UB amplifier circuit 635 amplifies the input signal RFinH can be avoided, and the low-power UB amplifier circuit 636 can amplify the input signal RFinH with satisfactory power efficiency.

The embodiments described above are intended to facilitate understanding of the present disclosure and are not to be construed as limiting the present disclosure. The present disclosure may be modified or improved without departing from the spirit thereof, and the present disclosure also includes equivalents thereof. That is, the embodiments may be appropriately modified in design by those skilled in the art, and such modifications also fall within the scope of the present disclosure so long as the modifications include the features of the present disclosure. For example, the elements included in the embodiments described above and the arrangement, materials, conditions, shapes, sizes, and so on thereof are not limited to those exemplified herein but may be modified as appropriate. It is to be understood that the embodiments are illustrative and components presented in different embodiments may be partially replaced or combined, and such replacements or combinations of components also fall within the scope of the present disclosure so long as the replacements or combinations include the features of the present disclosure. While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
   a first amplifier circuit configured to amplify a first signal of a first frequency band, and to output a first amplified signal having a first power;
   a second amplifier circuit configured to amplify a second signal of the first frequency band or of a second frequency band different from the first frequency band, and to output a second amplified signal having a second power different from the first power; and
   a first variable adjustment circuit between the second amplifier circuit and a first circuit that is subsequent to the second amplifier circuit, the first variable adjustment circuit being configured to adjust a first impedance of the first circuit seen from the second amplifier circuit,
   wherein the first variable adjustment circuit adjusts the first impedance in accordance with the second amplified signal.

2. The power amplifier circuit according to claim 1, wherein the second amplifier circuit comprises a differential amplifier circuit.

3. The power amplifier circuit according to claim 2, wherein the second power is greater than the first power.

4. The power amplifier circuit according to claim 1, wherein the second power is less than the first power, and wherein the first amplifier circuit comprises a differential amplifier circuit.

5. The power amplifier circuit according to claim 1, wherein the power amplifier circuit further comprises:
   a second variable adjustment circuit between the first amplifier circuit and a second circuit that is subsequent to the first amplifier circuit, the second variable adjustment circuit being configured to adjust a second impedance of the second circuit seen from the first amplifier circuit.

6. The power amplifier circuit according to claim 1, wherein the first variable adjustment circuit comprises a variable fundamental adjustment circuit configured to adjust the first impedance for a fundamental frequency of the second amplified signal.

7. The power amplifier circuit according to claim 1, wherein the first variable adjustment circuit comprises a variable harmonic adjustment circuit configured to adjust the first impedance for a harmonic frequency of the second amplified signal.

8. The power amplifier circuit according to claim 5, wherein the second variable adjustment circuit comprises a variable fundamental adjustment circuit configured to adjust the second impedance for a fundamental frequency of the first amplified signal.

9. The power amplifier circuit according to claim 5, wherein the second variable adjustment circuit comprises a variable harmonic adjustment circuit configured to adjust the second impedance for a harmonic frequency of the first amplified signal.

10. The power amplifier circuit according to claim 1, further comprising:
    a first switch between the first amplifier circuit and a circuit group, the circuit group comprising a third circuit that is subsequent to the first amplifier circuit, and a fourth circuit that is subsequent to the second amplifier circuit, wherein the first switch is configured to selectively connect the first amplifier circuit to any one of the third circuit or the fourth circuit.

11. The power amplifier circuit according to claim 1, further comprising:

a second switch between the second amplifier circuit and a circuit group, the circuit group comprising a fifth circuit that is subsequent to the second amplifier circuit, and a sixth circuit that is subsequent to the first amplifier circuit, wherein the second switch is configured to selectively connect the second amplifier circuit to any one of the fifth circuit or the sixth circuit.

12. The power amplifier circuit according to claim 1, further comprising:

a third switch having a first terminal configured to be supplied with the second signal, a second terminal connected to the first amplifier circuit, and a third terminal connected to the second amplifier circuit, wherein the third switch is configured to selectively connect the first terminal to any one of the second terminal or the third terminal.

13. The power amplifier circuit according to claim 1, further comprising:

a fourth switch having a first terminal configured to be supplied with the first signal, a second terminal connected to the first amplifier circuit, and a third terminal connected to the second amplifier circuit, wherein the fourth switch is configured to selectively connect the first terminal to any one of the second terminal or the third terminal.

14. A power amplifier circuit comprising:

a third amplifier circuit configured to amplify a first transmission signal of a third frequency band, and to output a third amplified signal having a third power;

a fourth amplifier circuit configured to amplify a second transmission signal of a fourth frequency band different from the third frequency band, and to output a fourth amplified signal having a fourth power smaller than the third power;

a fifth amplifier circuit configured to amplify a reception signal of the third frequency band or of the fourth frequency band, and to output a fifth amplified signal;

a first filter that is subsequent to the third amplifier circuit;

a second filter that is subsequent to the fourth amplifier circuit;

a fifth switch between a circuit group and a filter group, the circuit group comprising the third amplifier circuit, the fourth amplifier circuit, and the fifth amplifier circuit, the filter group comprising the first filter and the second filter, the fifth switch being configured to selectively connect the first filter to any one of the third amplifier circuit or the fifth amplifier circuit, and to selectively connect the second filter to any one of the fourth amplifier circuit or the fifth amplifier circuit; and a sixth switch between the filter group and a seventh circuit that is subsequent to the filter group, the sixth switch being configured to selectively connect any one of the first filter or the second filter to the seventh circuit.

15. The power amplifier circuit according to claim 14, further comprising:

a third filter that is subsequent to the third amplifier circuit; and a fourth filter that is subsequent to the fourth amplifier circuit, wherein the fifth switch is further configured to selectively connect the third filter to any one of the third amplifier circuit or the fifth amplifier circuit, and to selectively connect the fourth filter to any one of the fourth amplifier circuit or the fifth amplifier circuit, and wherein the sixth switch is configured to selectively connect any one of the first filter, the second filter, the third filter, or the fourth filter to the seventh circuit.

16. The power amplifier circuit according to claim 14, further comprising:

a seventh switch prior to the third amplifier circuit and the fourth amplifier circuit, the seventh switch having a first terminal configured to be supplied with the first transmission signal or the second transmission signal, a second terminal connected to the third amplifier circuit, and a third terminal connected to the fourth amplifier circuit, the seventh switch being configured to selectively connect the first terminal to any one of the second terminal or the third terminal, wherein the fifth switch is configured to selectively connect the first filter to any one of the third amplifier circuit, the fourth amplifier circuit, or the fifth amplifier circuit, and to selectively connect the second filter to any one of the fourth amplifier circuit or the fifth amplifier circuit.

17. The power amplifier circuit according to claim 2, wherein the second power is less than the first power, and wherein the first amplifier circuit comprises a differential amplifier circuit.

18. The power amplifier circuit according to claim 2, wherein the power amplifier circuit further comprises:

a second variable adjustment circuit between the first amplifier circuit and a second circuit that is subsequent to the first amplifier circuit, the second variable adjustment circuit being configured to adjust a second impedance of the second circuit seen from the first amplifier circuit.

19. The power amplifier circuit according to claim 2, wherein the first variable adjustment circuit comprises a variable fundamental adjustment circuit configured to adjust the first impedance for a fundamental frequency of the second amplified signal.

20. The power amplifier circuit according to claim 2, wherein the first variable adjustment circuit comprises a variable harmonic adjustment circuit configured to adjust the first impedance for a harmonic frequency of the second amplified signal.

* * * * *